United States Patent
Sakuma et al.

(10) Patent No.: US 8,952,441 B2
(45) Date of Patent: Feb. 10, 2015

(54) NONVOLATILE SEMICONDUCTOR MEMORY DEVICE AND METHOD OF MANUFACTURING THE SAME

(71) Applicant: Kabushiki Kaisha Toshiba, Tokyo (JP)

(72) Inventors: Kiwamu Sakuma, Yokohama (JP);
Haruka Kusai, Yokohama (JP);
Yasuhito Yoshimizu, Yokkaichi (JP);
Masahiro Kiyotoshi, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 13/895,660

(22) Filed: May 16, 2013

(65) Prior Publication Data

US 2013/0307047 A1 Nov. 21, 2013

(30) Foreign Application Priority Data

May 16, 2012 (JP) ................. 2012-112306

(51) Int. Cl.
*H01L 29/788* (2006.01)
*H01L 27/115* (2006.01)
*H01L 29/66* (2006.01)
*H01L 29/792* (2006.01)
*H01L 29/423* (2006.01)

(52) U.S. Cl.
CPC .... *H01L 27/11551* (2013.01); *H01L 29/66825* (2013.01); *H01L 29/66833* (2013.01); *H01L 29/7881* (2013.01); *H01L 29/792* (2013.01); *H01L 27/11519* (2013.01); *H01L 27/11524* (2013.01); *H01L 27/11565* (2013.01); *H01L 27/1157* (2013.01); *H01L 27/11578* (2013.01); *H01L 29/42332* (2013.01); *H01L 29/42348* (2013.01)
USPC ........... 257/316; 257/315; 257/302; 257/278; 257/328; 257/329; 257/E27.057; 257/E27.096; 257/E29.183; 257/E29.189

(58) Field of Classification Search
USPC ......... 257/316, 302, 315, 242, 278, 328, 329, 257/E27.057, E27.096, E29.183, E29.189
See application file for complete search history.

(56) References Cited

U.S. PATENT DOCUMENTS

2010/0226195 A1 9/2010 Lue
2012/0280303 A1 11/2012 Kiyotoshi et al.
2013/0015519 A1 1/2013 Fujii et al.

OTHER PUBLICATIONS

U.S. Appl. No. 13/752,526, filed Jan. 29, 2013, Kusai, et al.

(Continued)

*Primary Examiner* — Timor Karimy
(74) *Attorney, Agent, or Firm* — Oblon, Spivak, McClelland, Maier & Neustadt, L.L.P.

(57) ABSTRACT

According to one embodiment, a device includes a first fin structure having first to n-th semiconductor layers (n is a natural number equal to or more than 2) stacked in a first direction perpendicular to a surface of a semiconductor substrate, and extending in a second direction parallel to the surface of the semiconductor substrate, first to n-th memory cells provided on surfaces of the first to n-th semiconductor layers in a third direction perpendicular to the first and second directions respectively, and first to n-th select transistors connected in series to the first to n-th memory cells respectively.

7 Claims, 48 Drawing Sheets

(56) References Cited

OTHER PUBLICATIONS

A. Hubert, et al. "A stacked SONOS technology, up to 4 levels and 6nm crystalline nanowires, with gate-all-around or independent gates (φ-Flash), suitable for full 3D integration", IEDM, 2009, pp. 637-640.

SungJin Whang, et al, "Novel 3-Dimensional Dual Control-Gate with Surrounding Floating-Gate (DC-SF) NAND Flash Cell for 1Tb File Storage Application", IEDM, 2010, pp. 668-671.

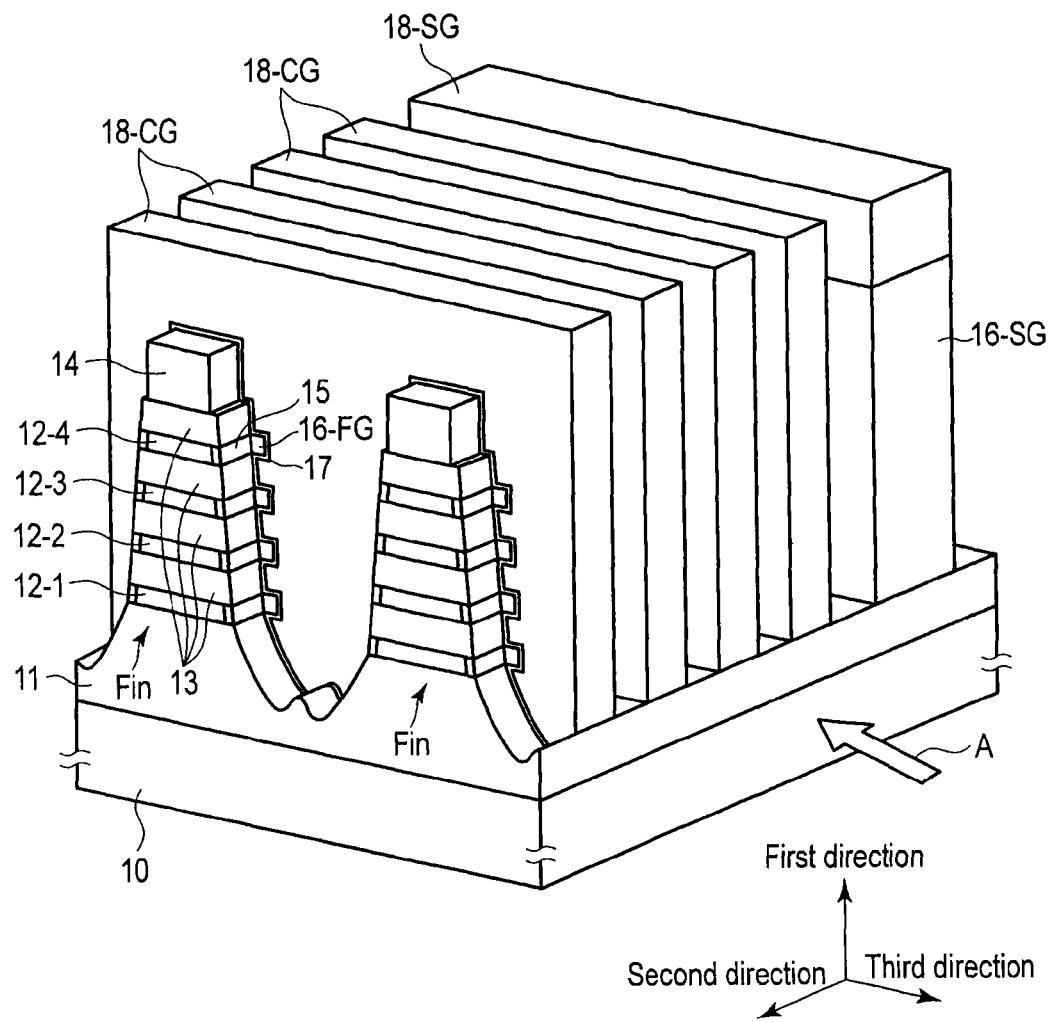
F I G. 1

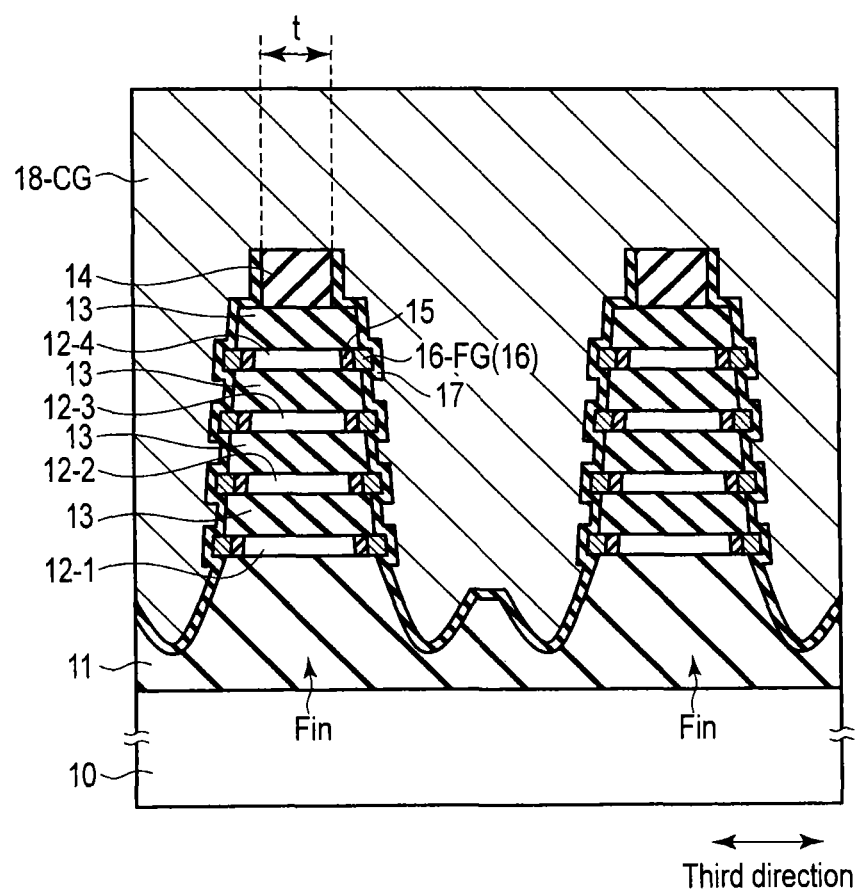
F I G. 3

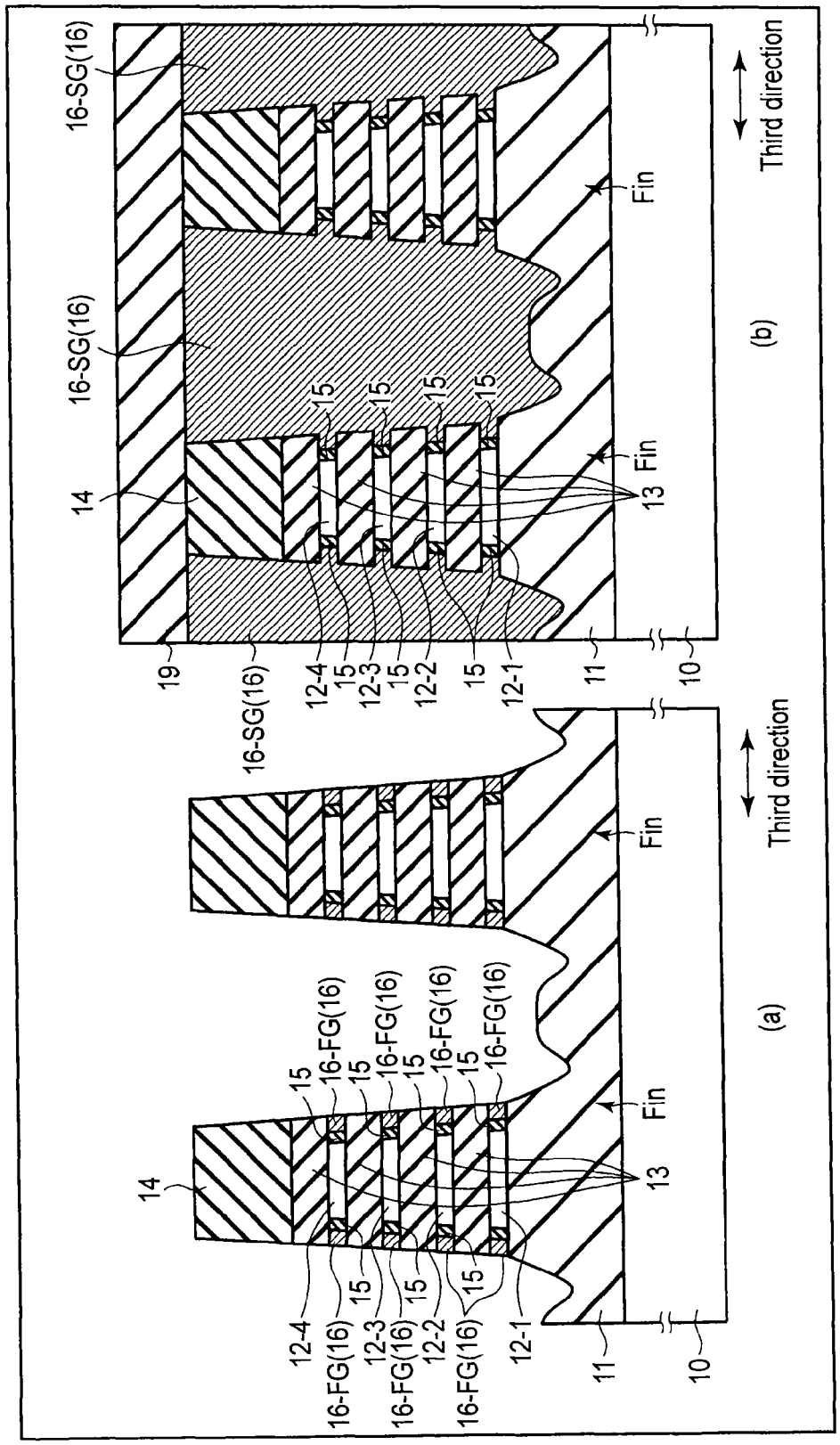
F I G. 10

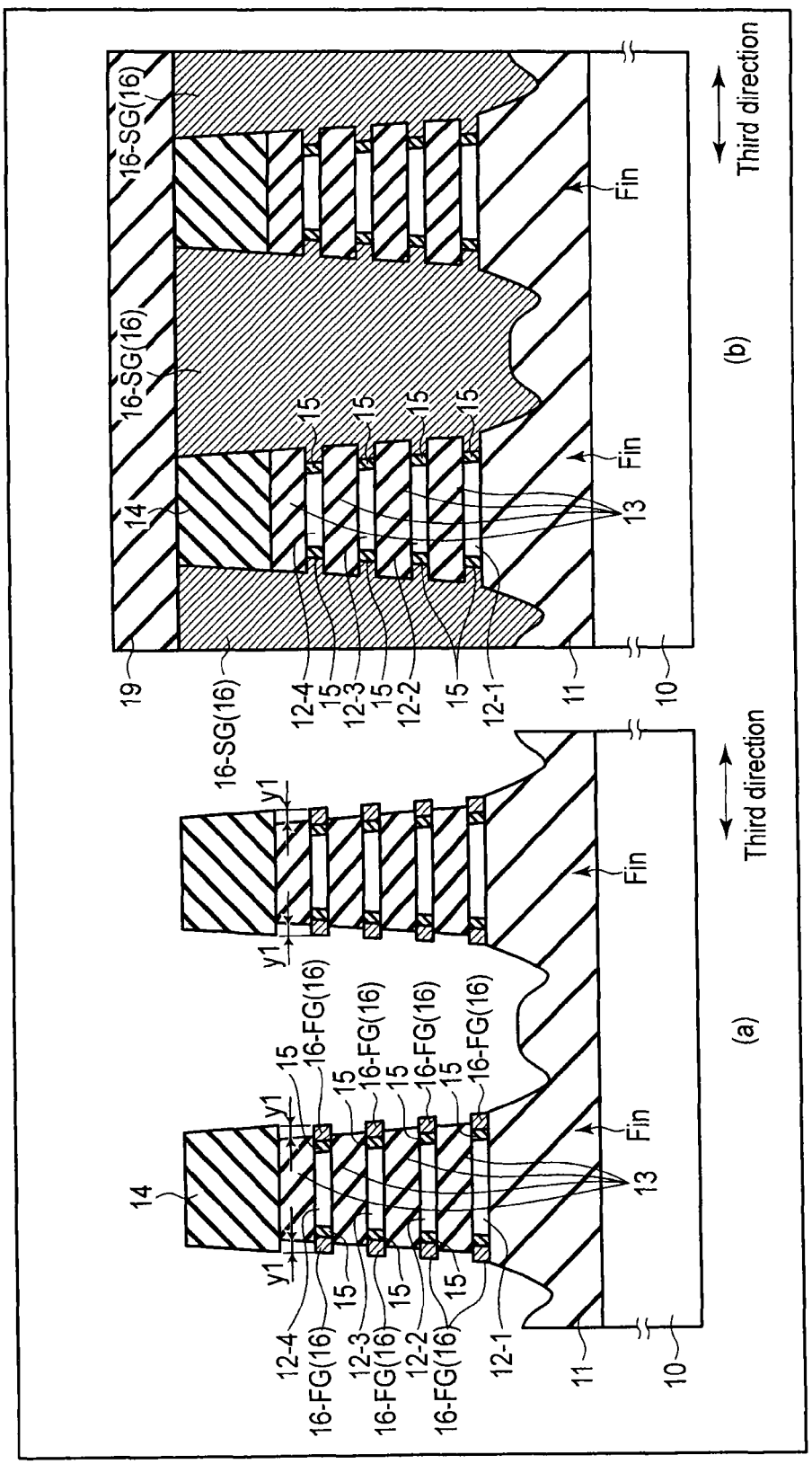
F I G. 11

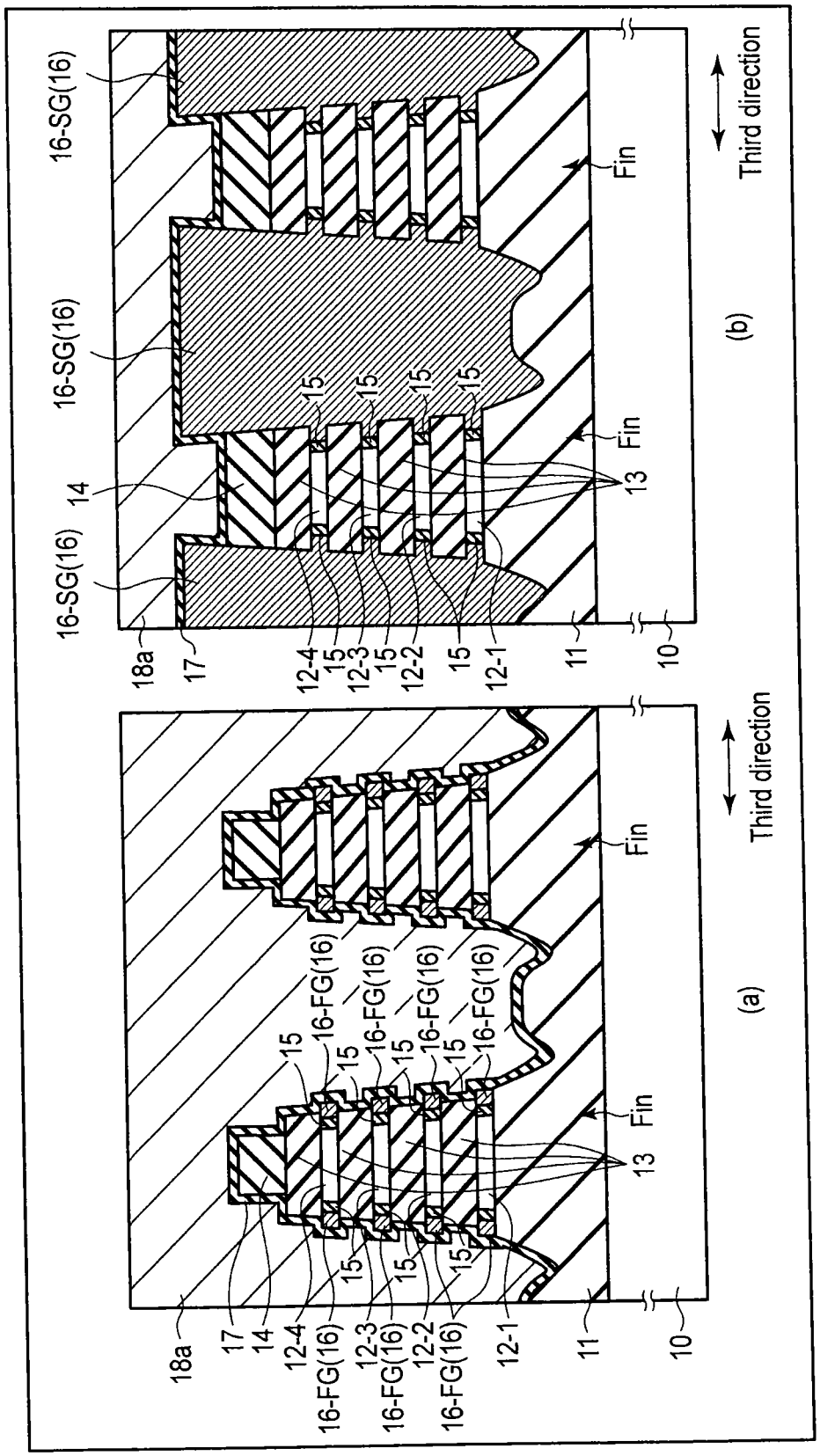
F I G. 13

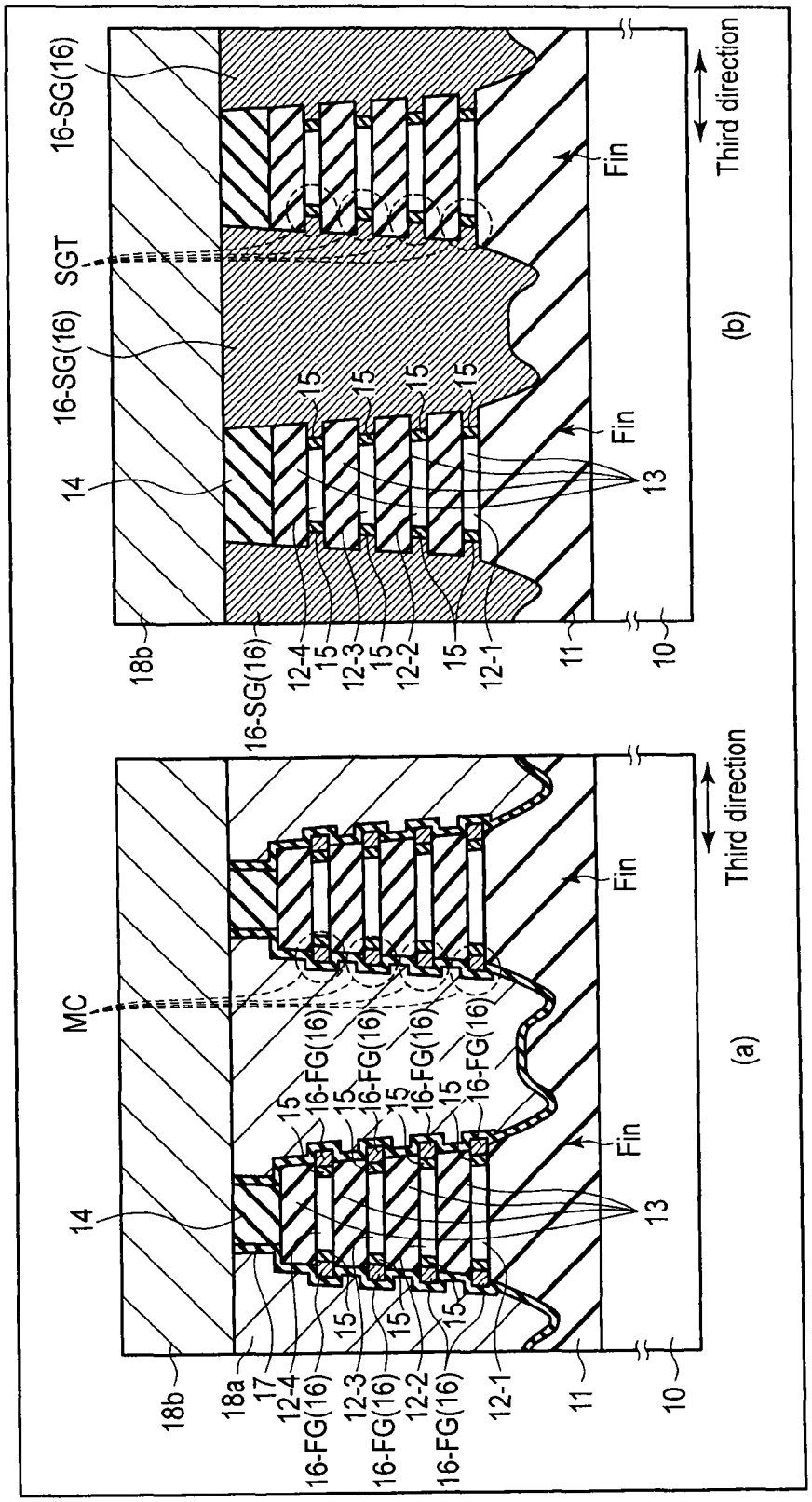
F I G. 14

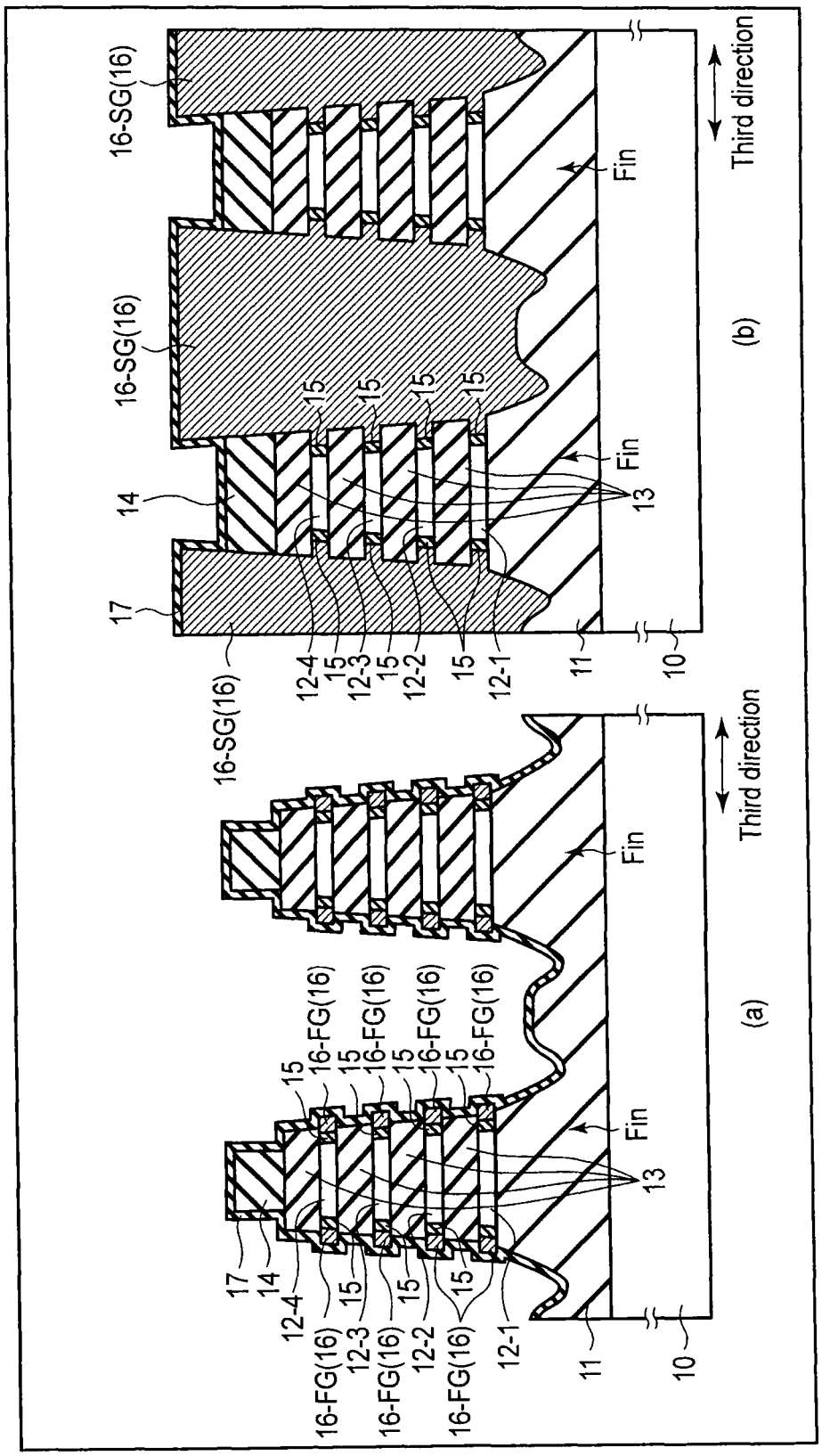
F I G. 16

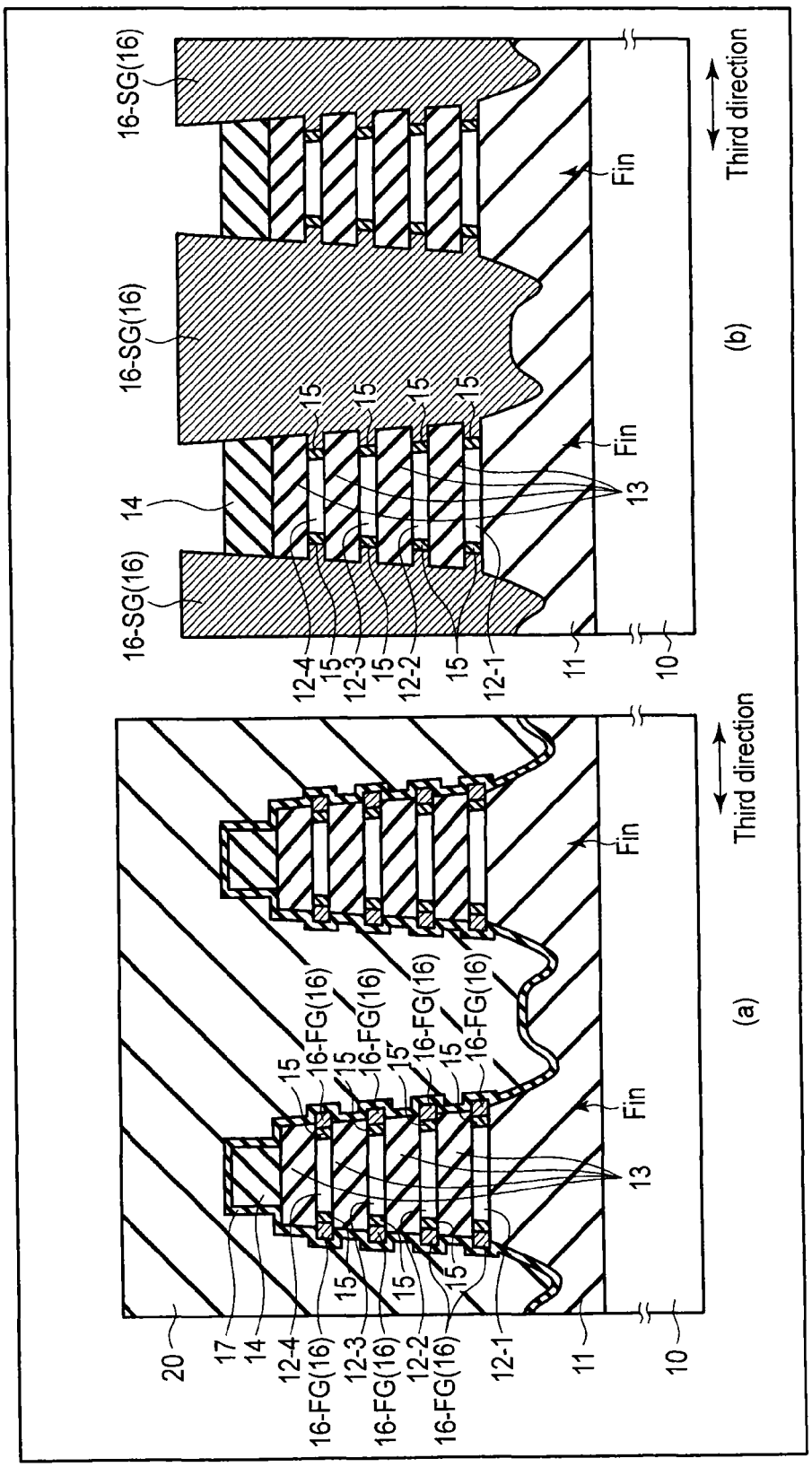
F I G. 17

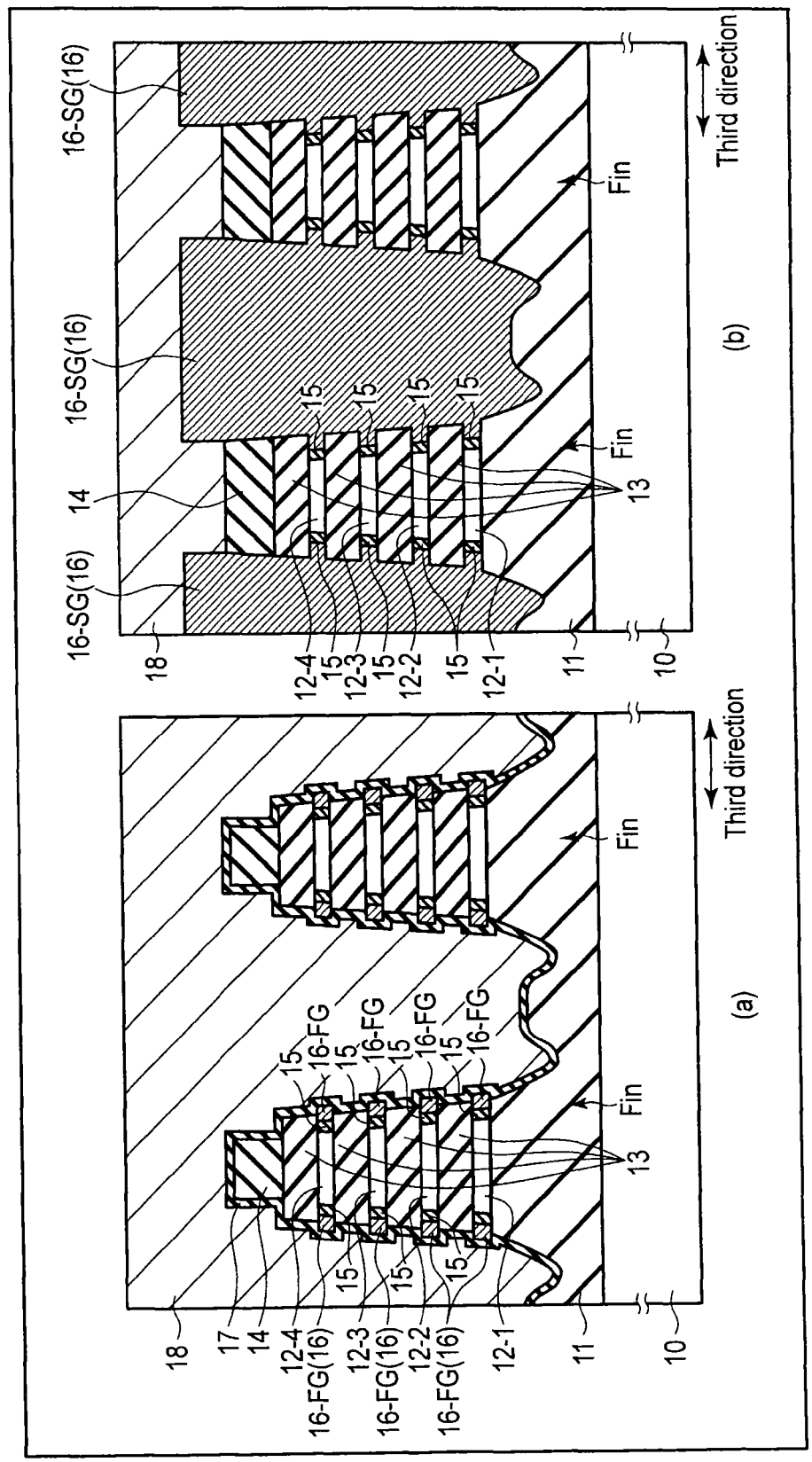
F I G. 18

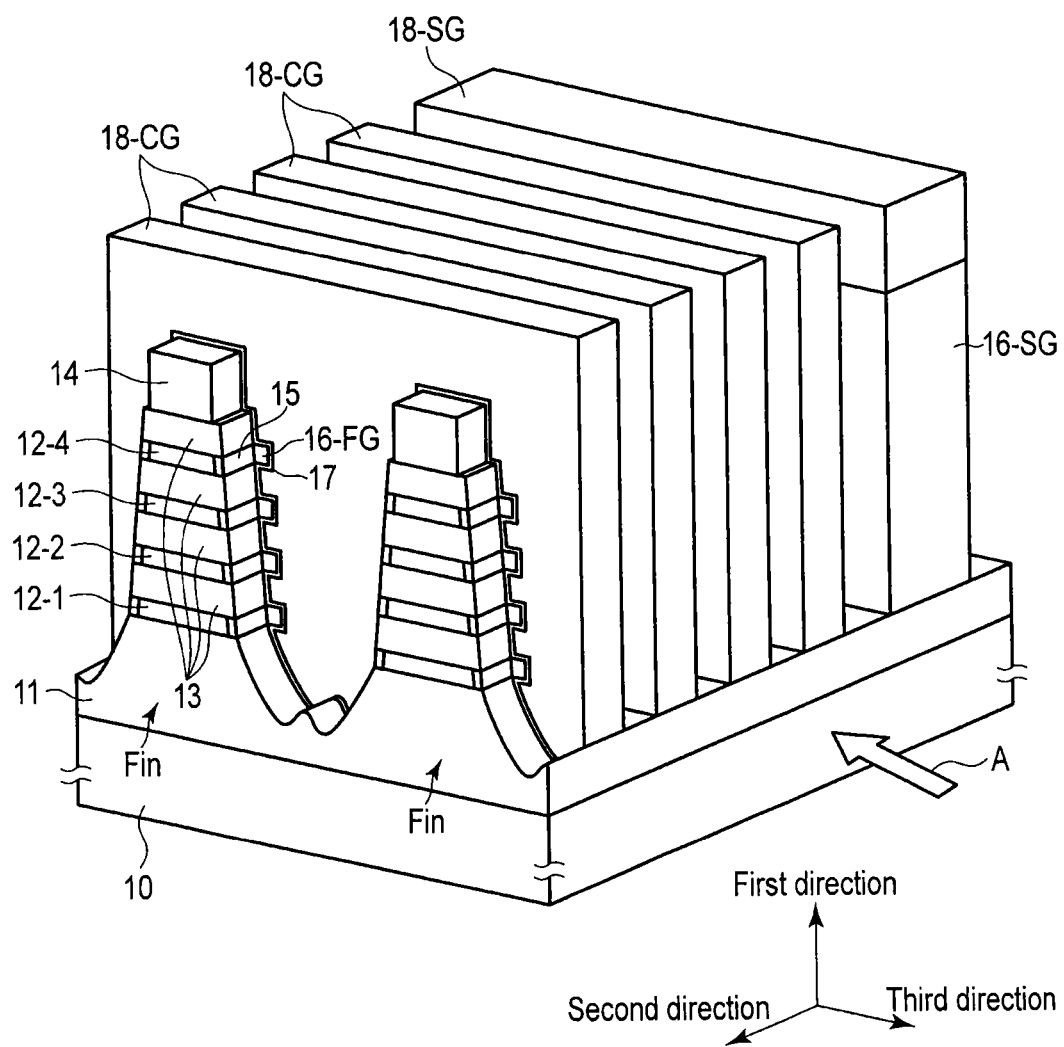
F I G. 20

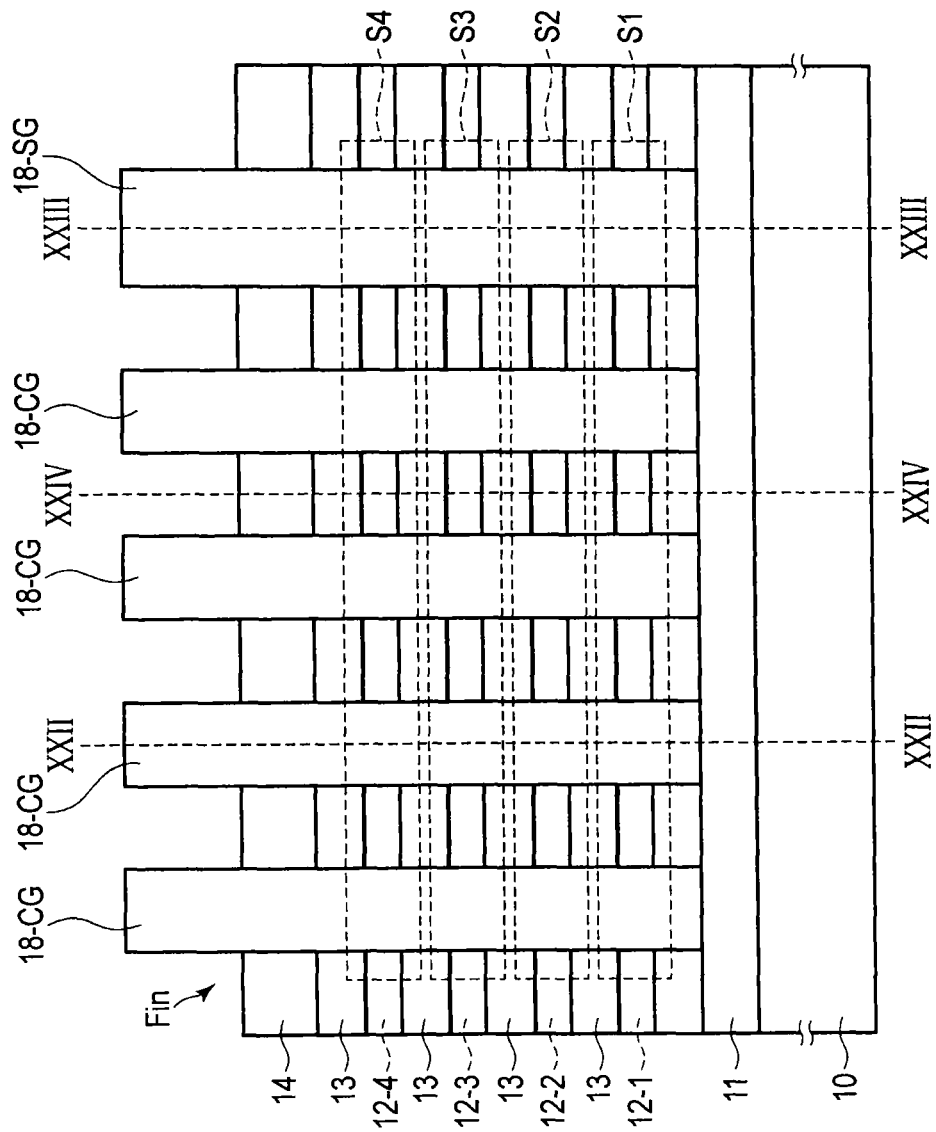
F I G. 21

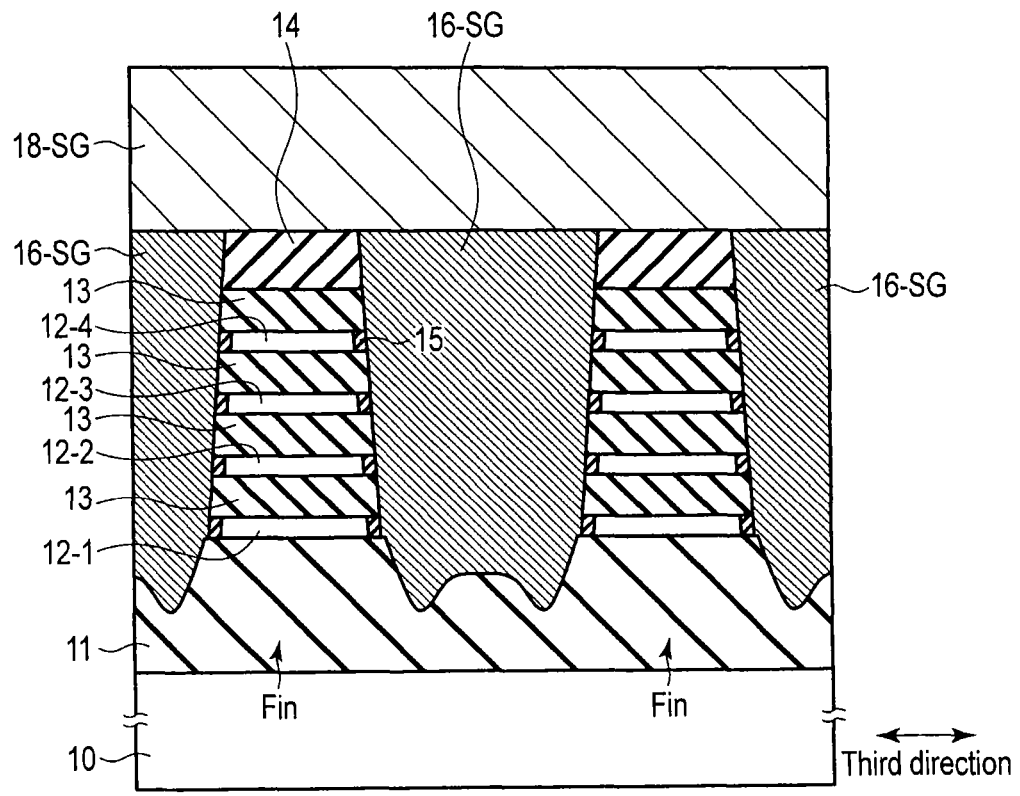
F I G. 2 3
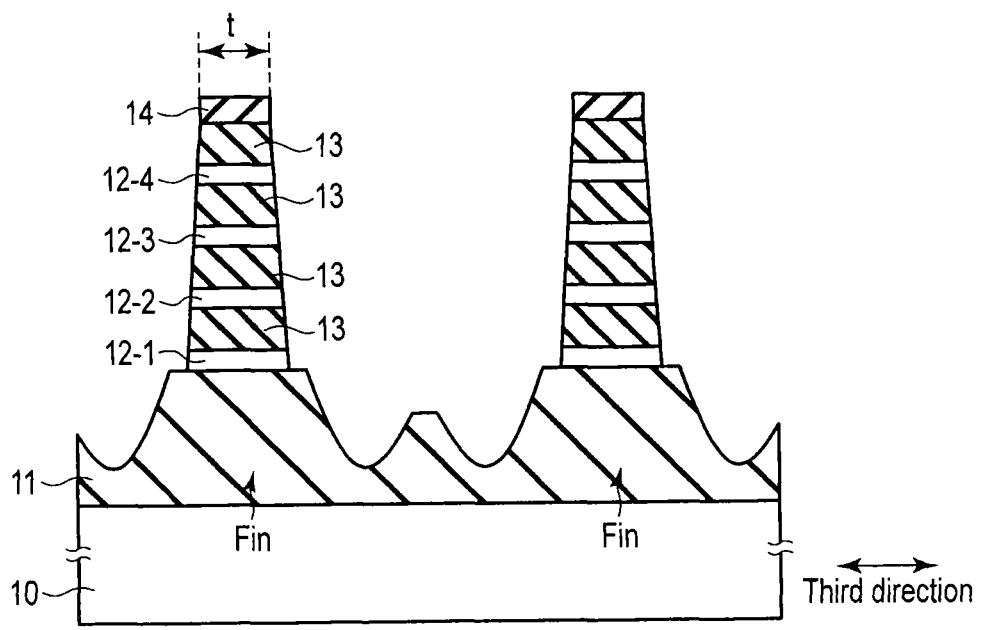
F I G. 2 4

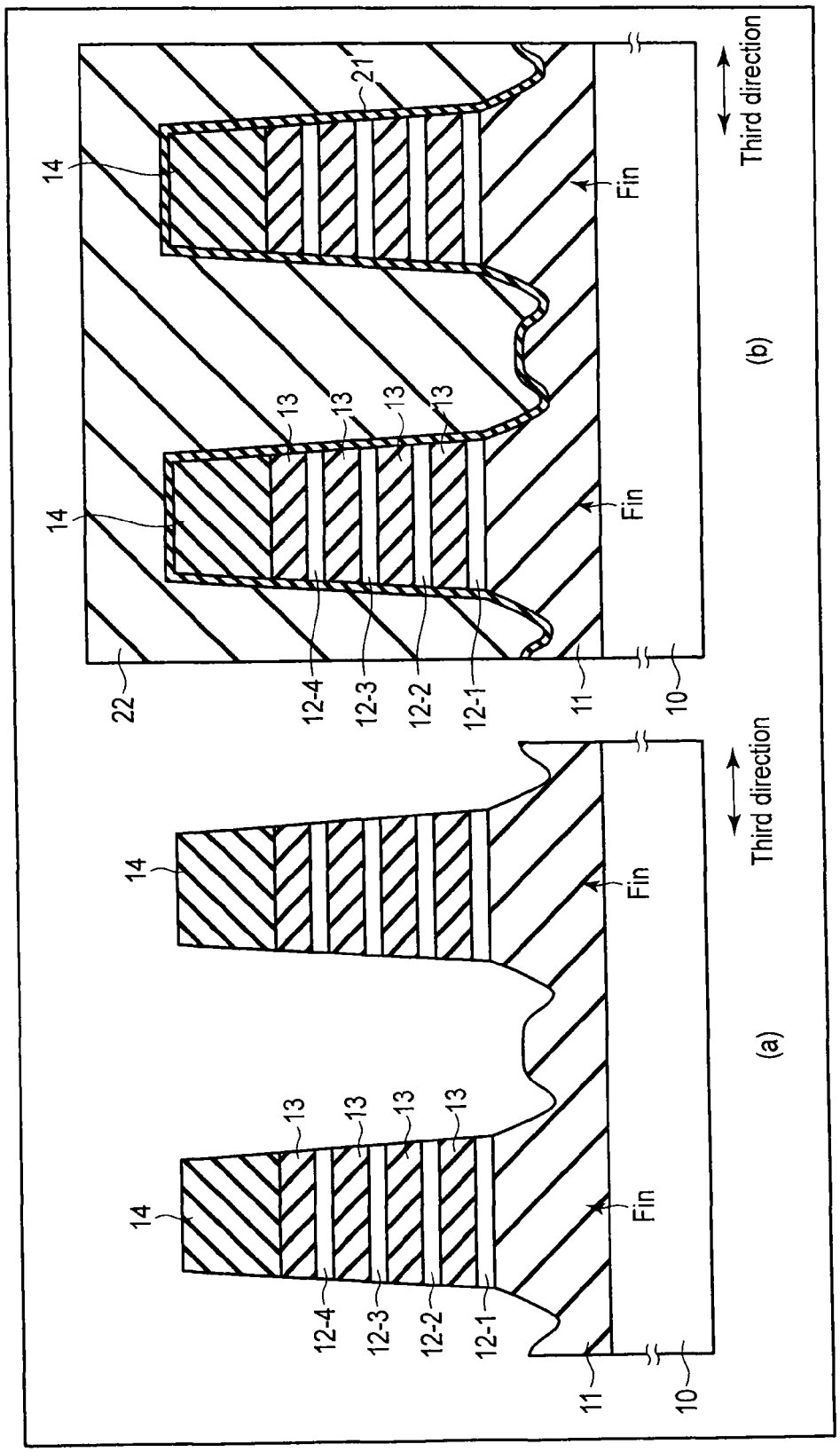
F I G. 28

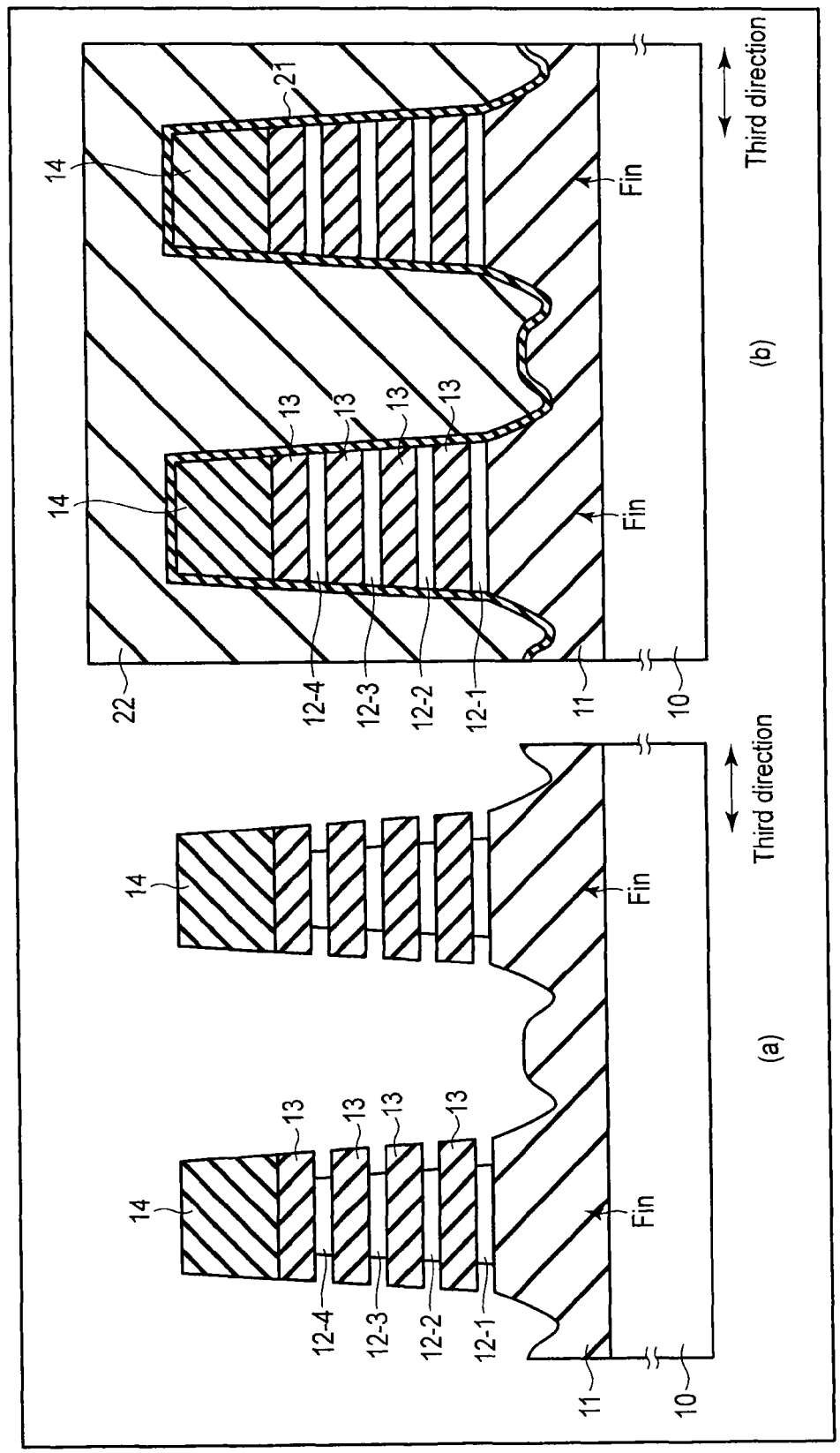
F I G. 29

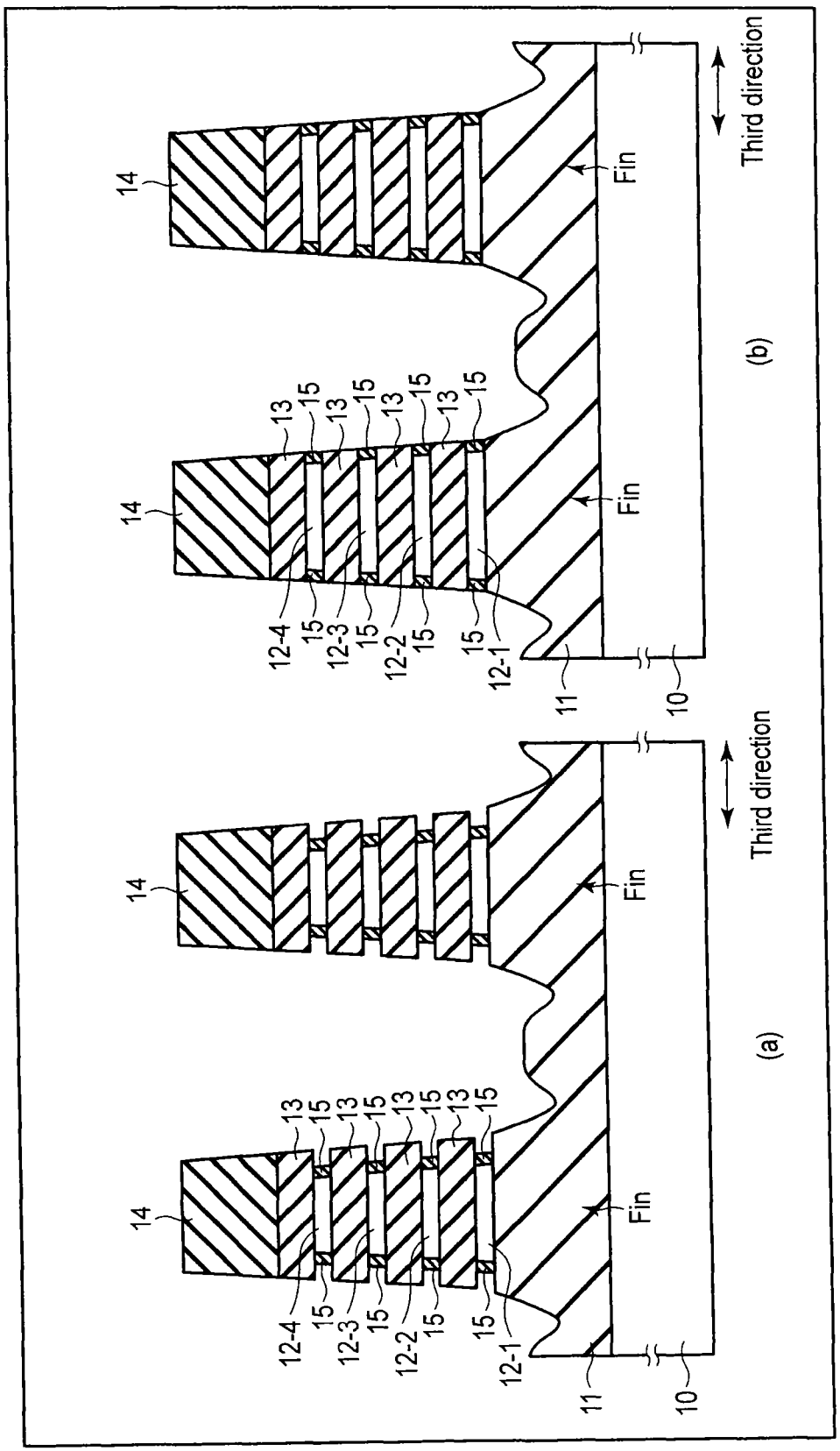
F I G. 30

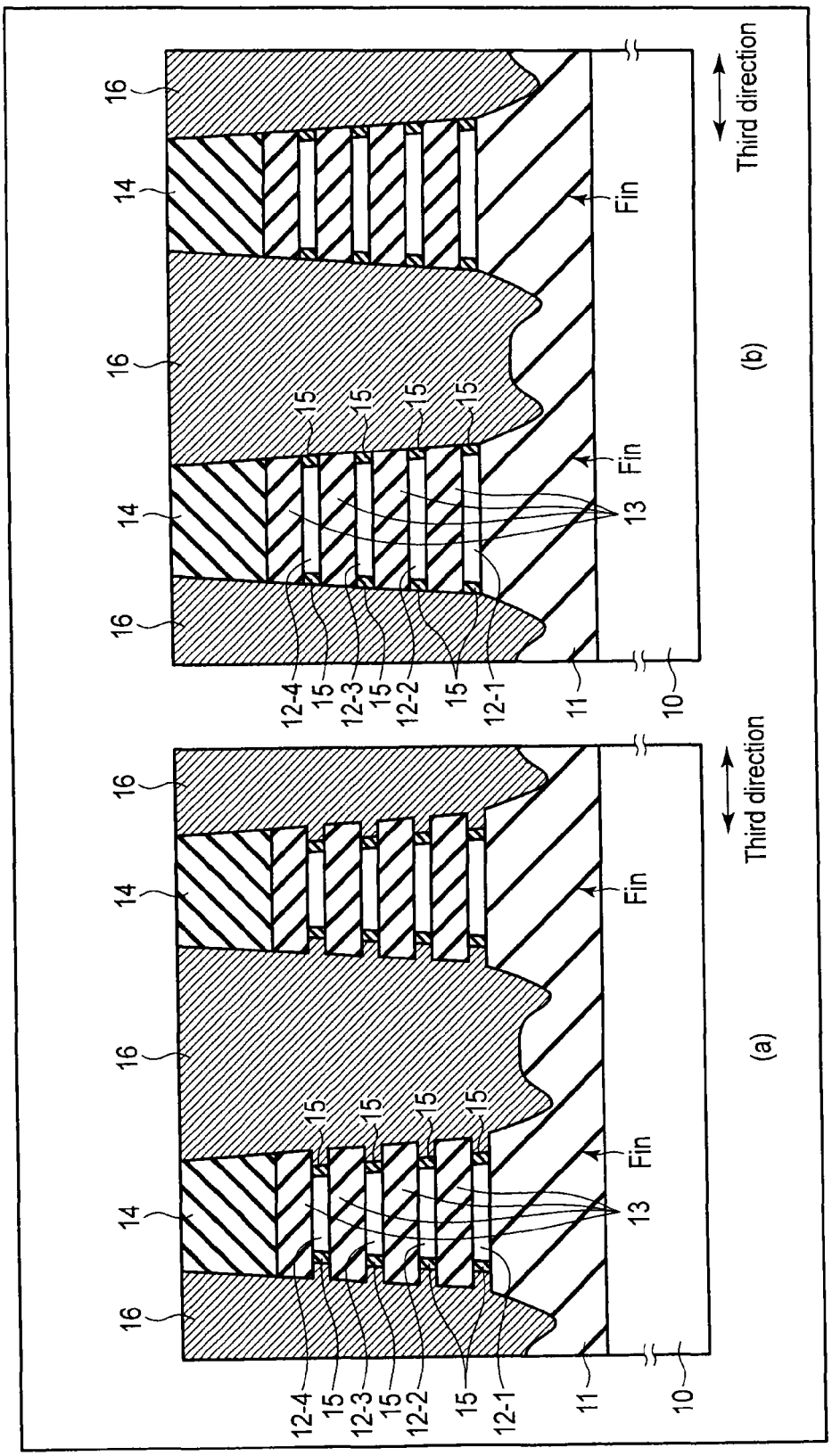
F I G. 31

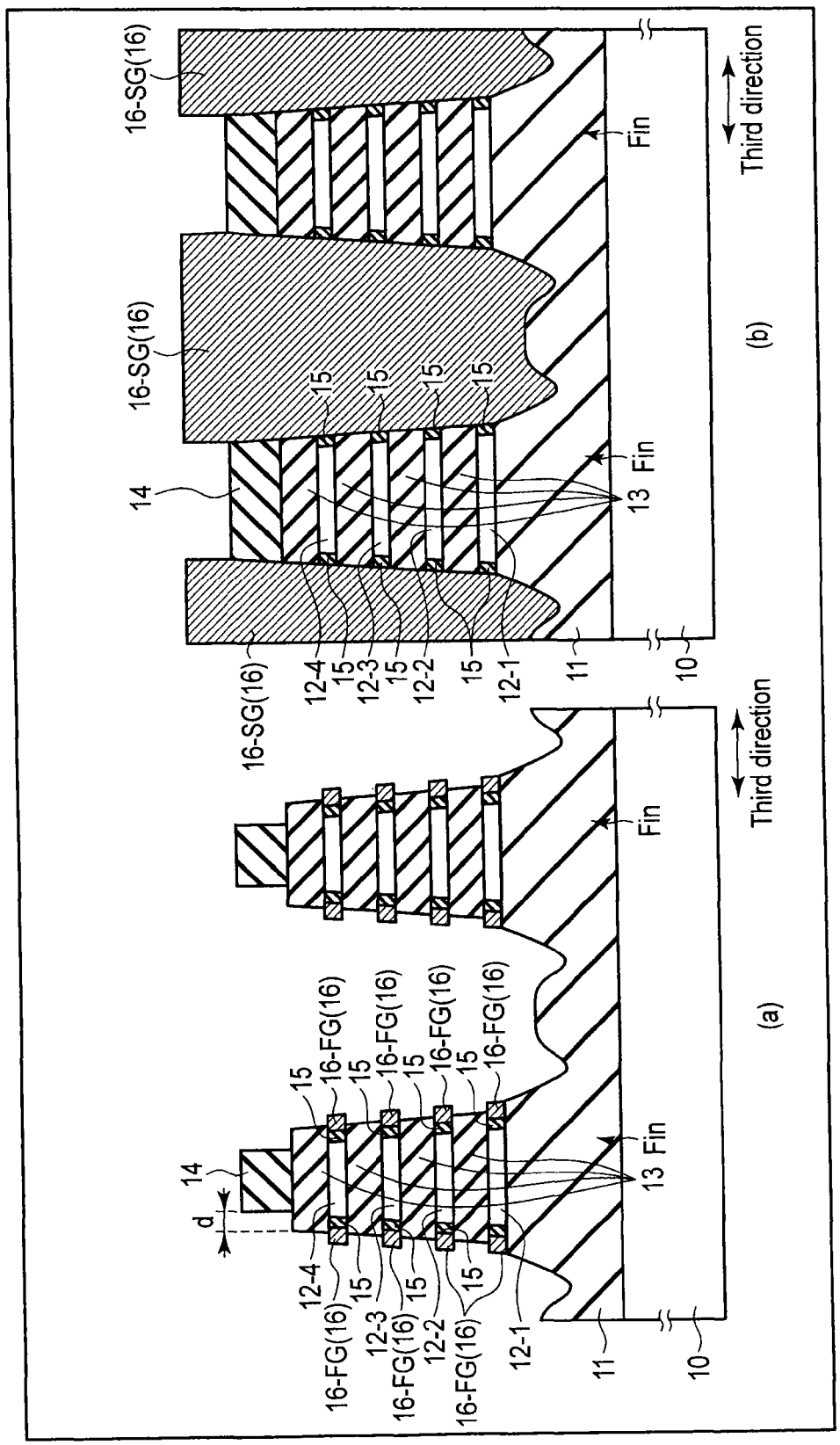
F I G. 34

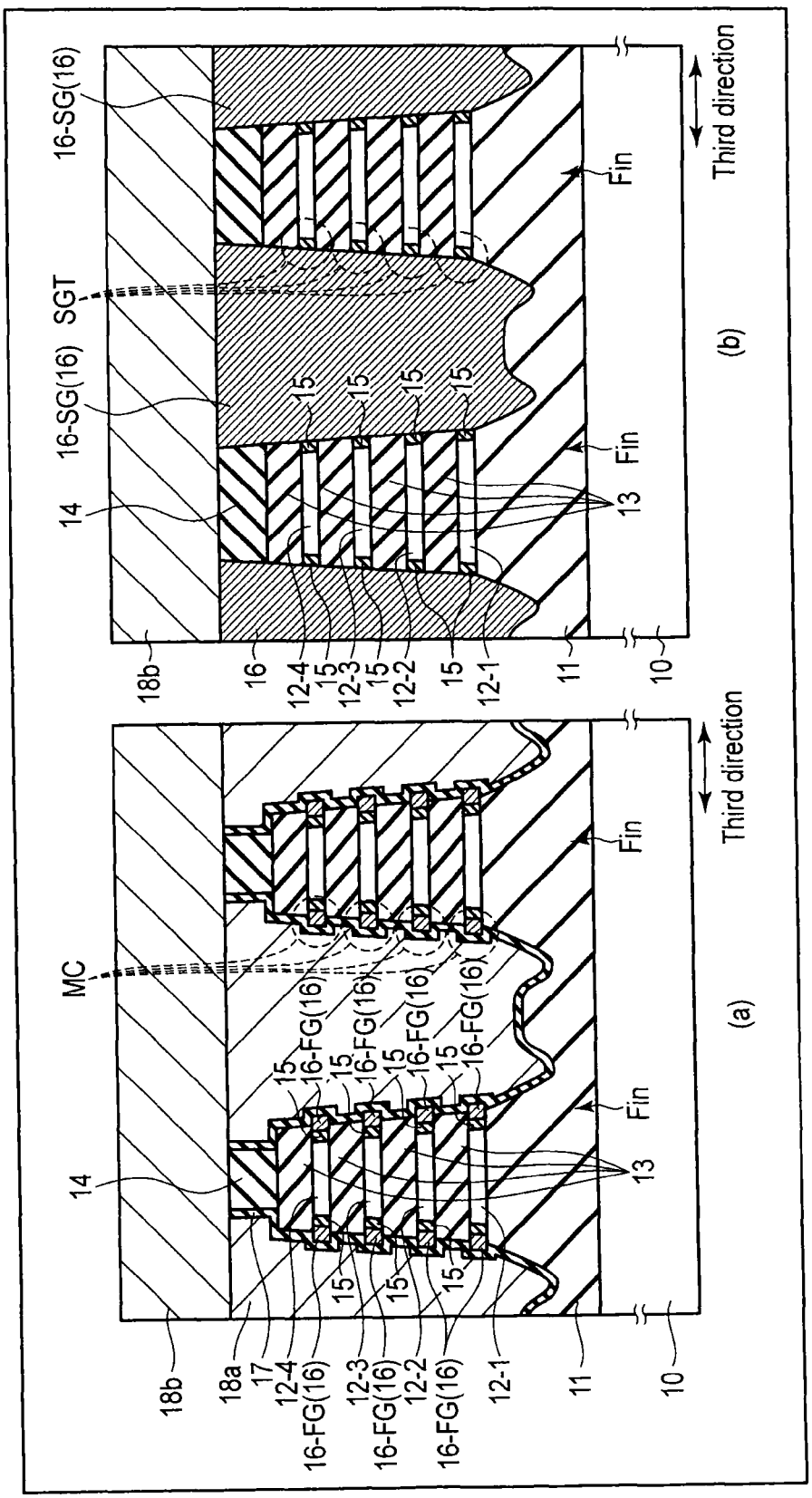
F I G. 36

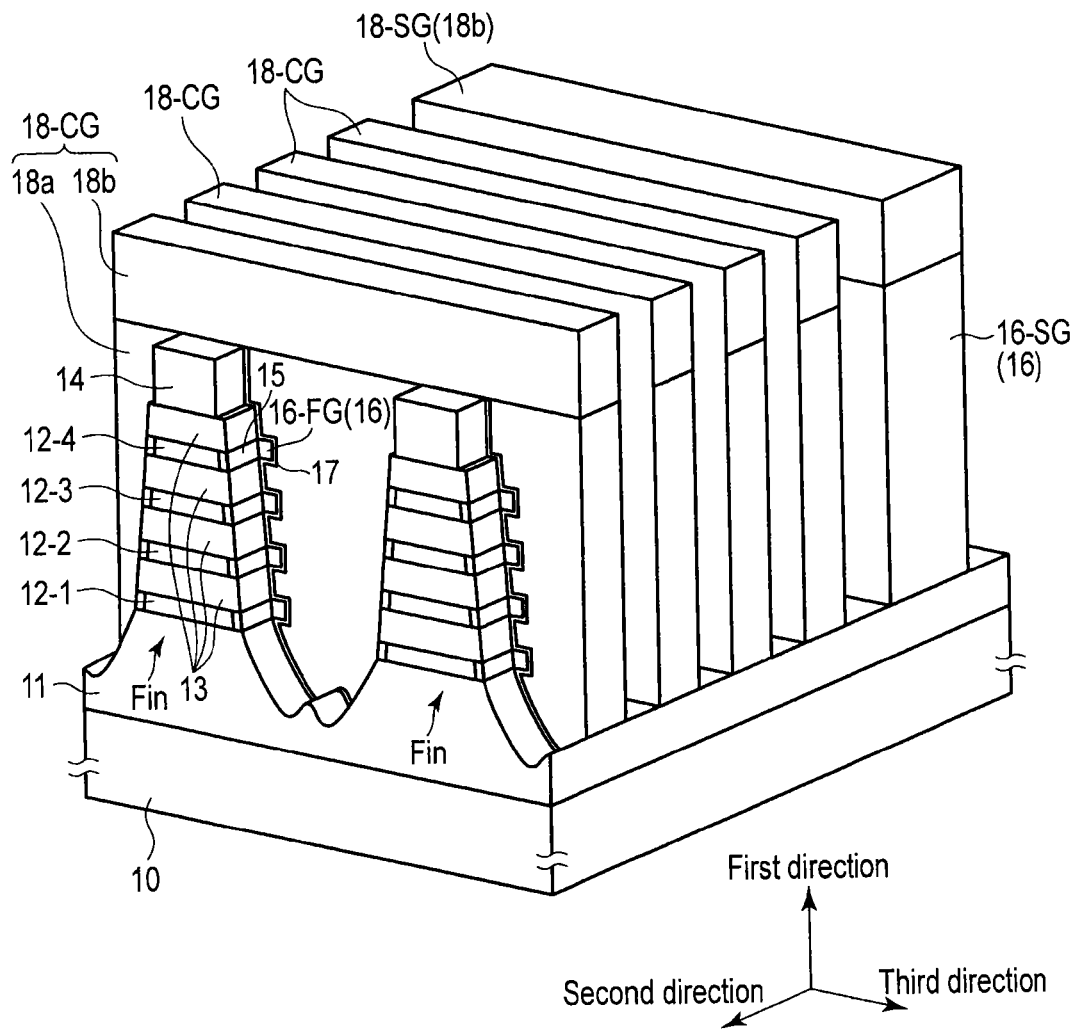
F I G. 37

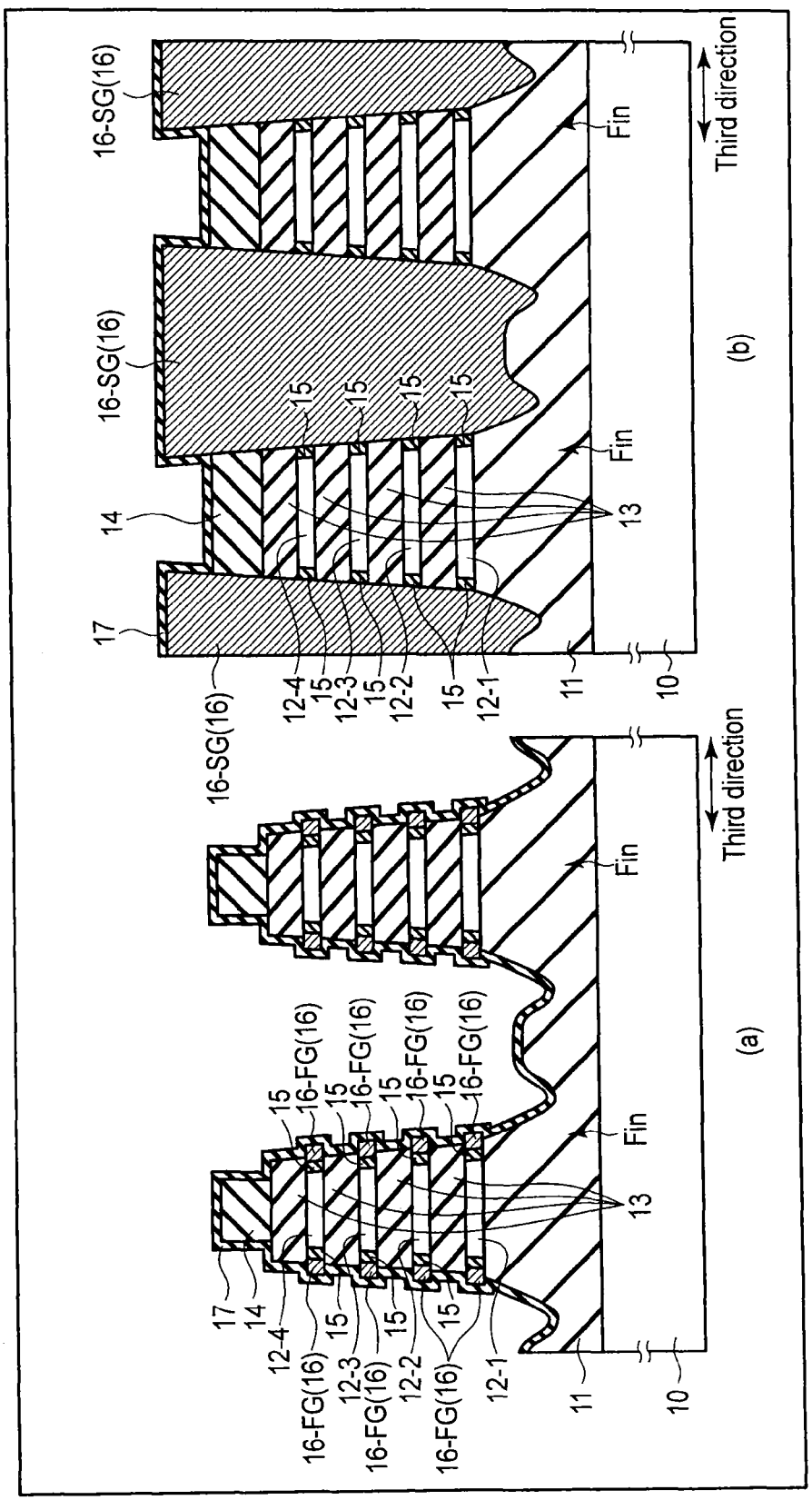
F I G. 38

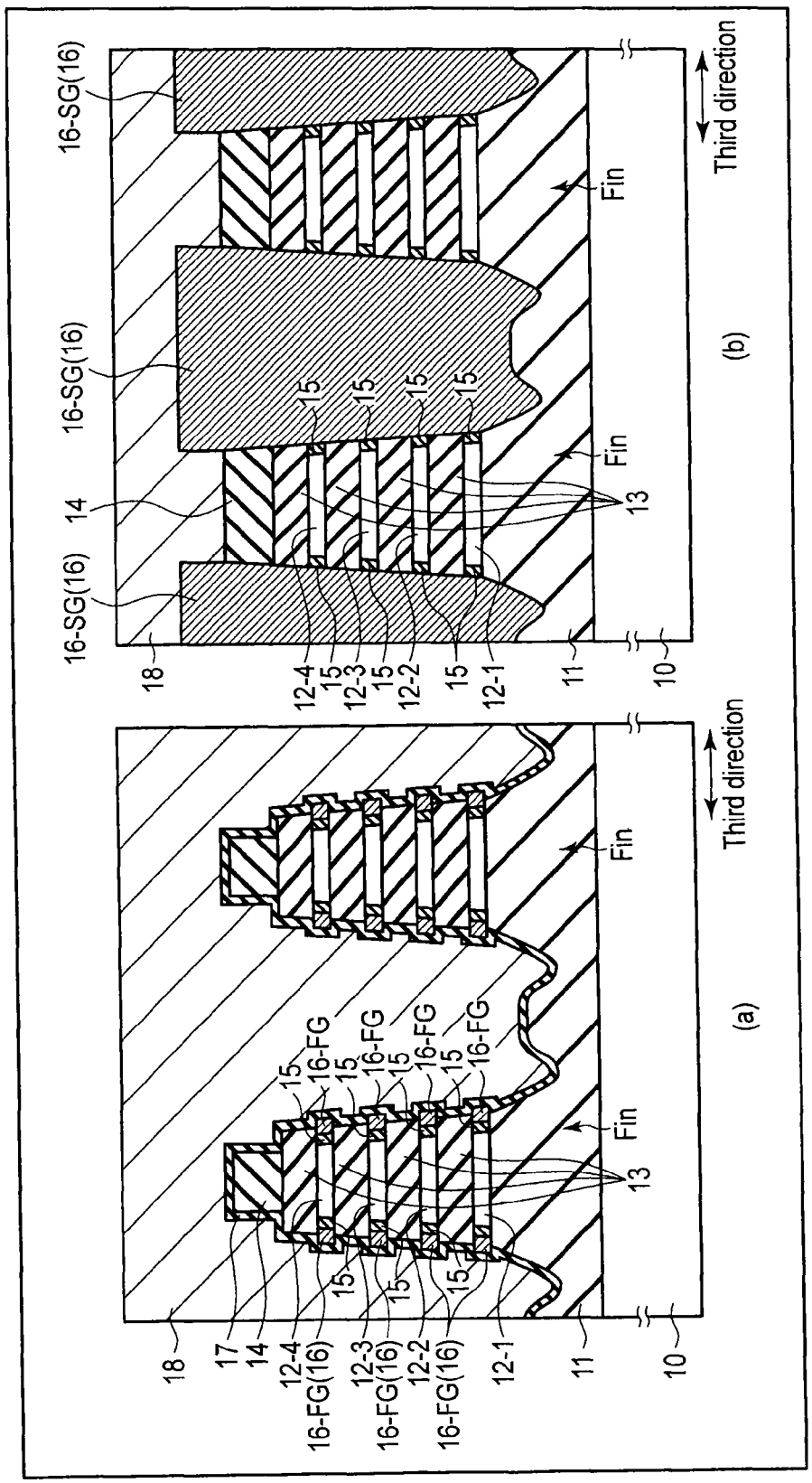
F I G. 40

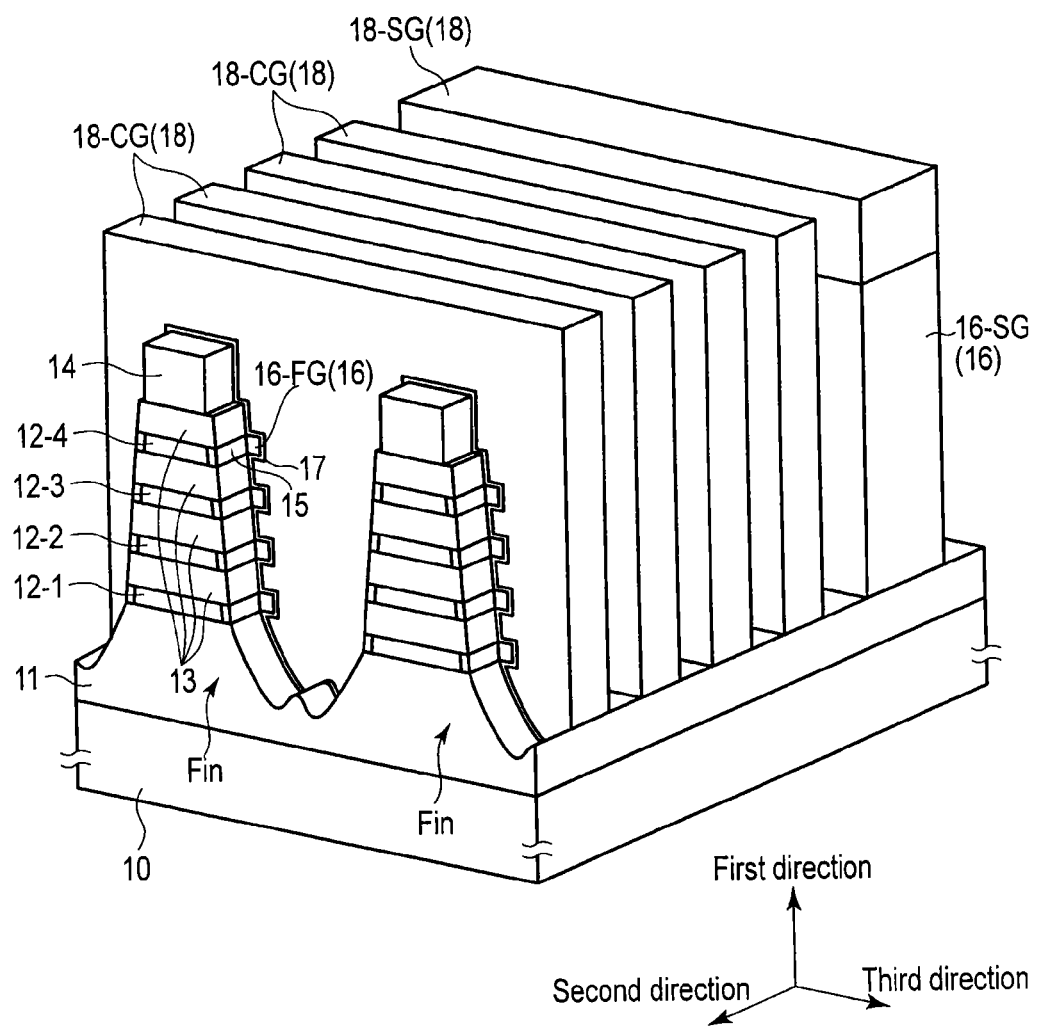
F I G. 4 1

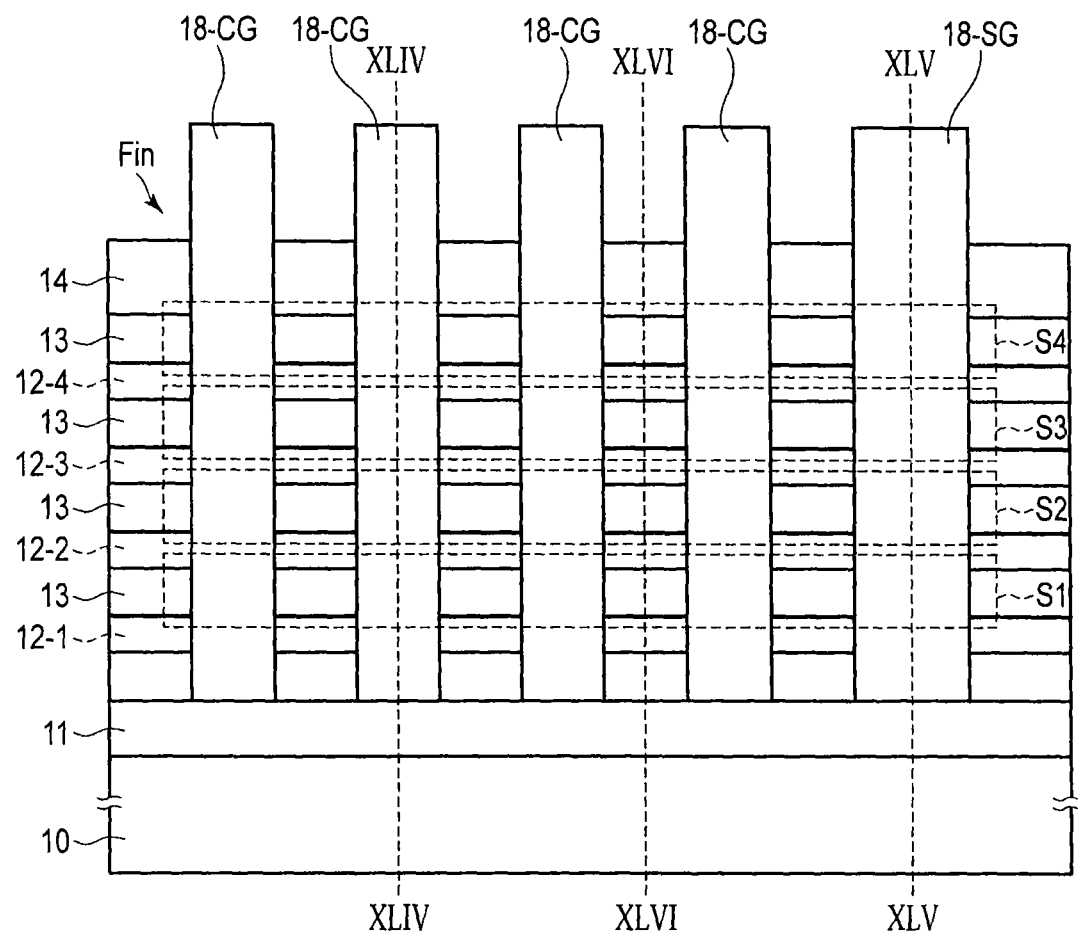
F I G. 4 3

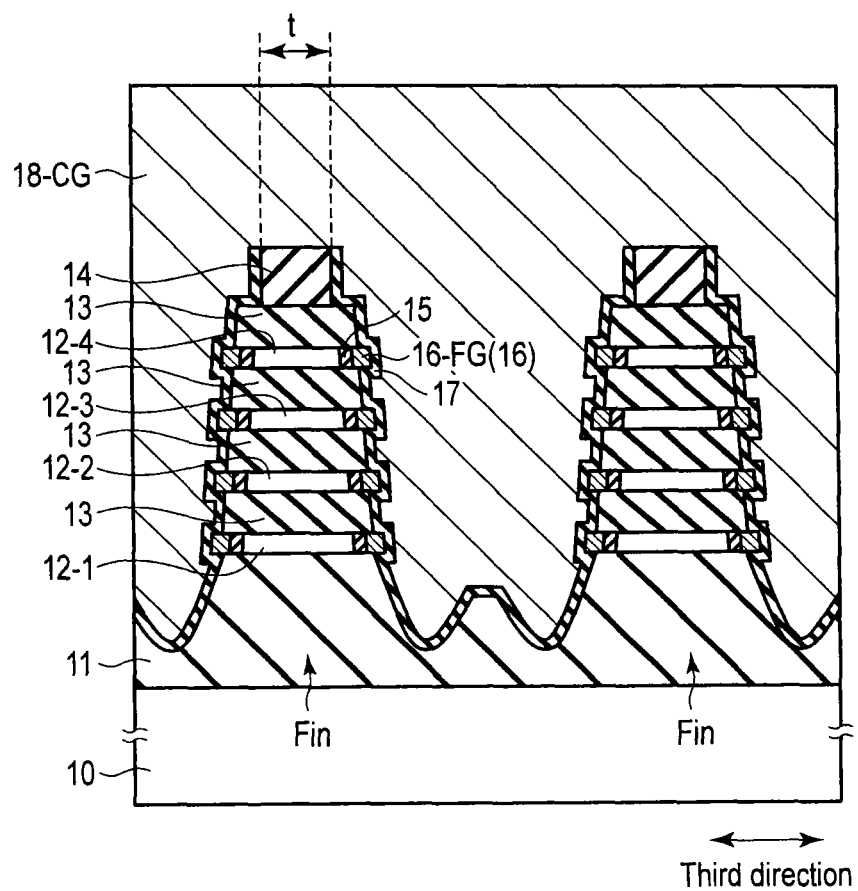
F I G. 44

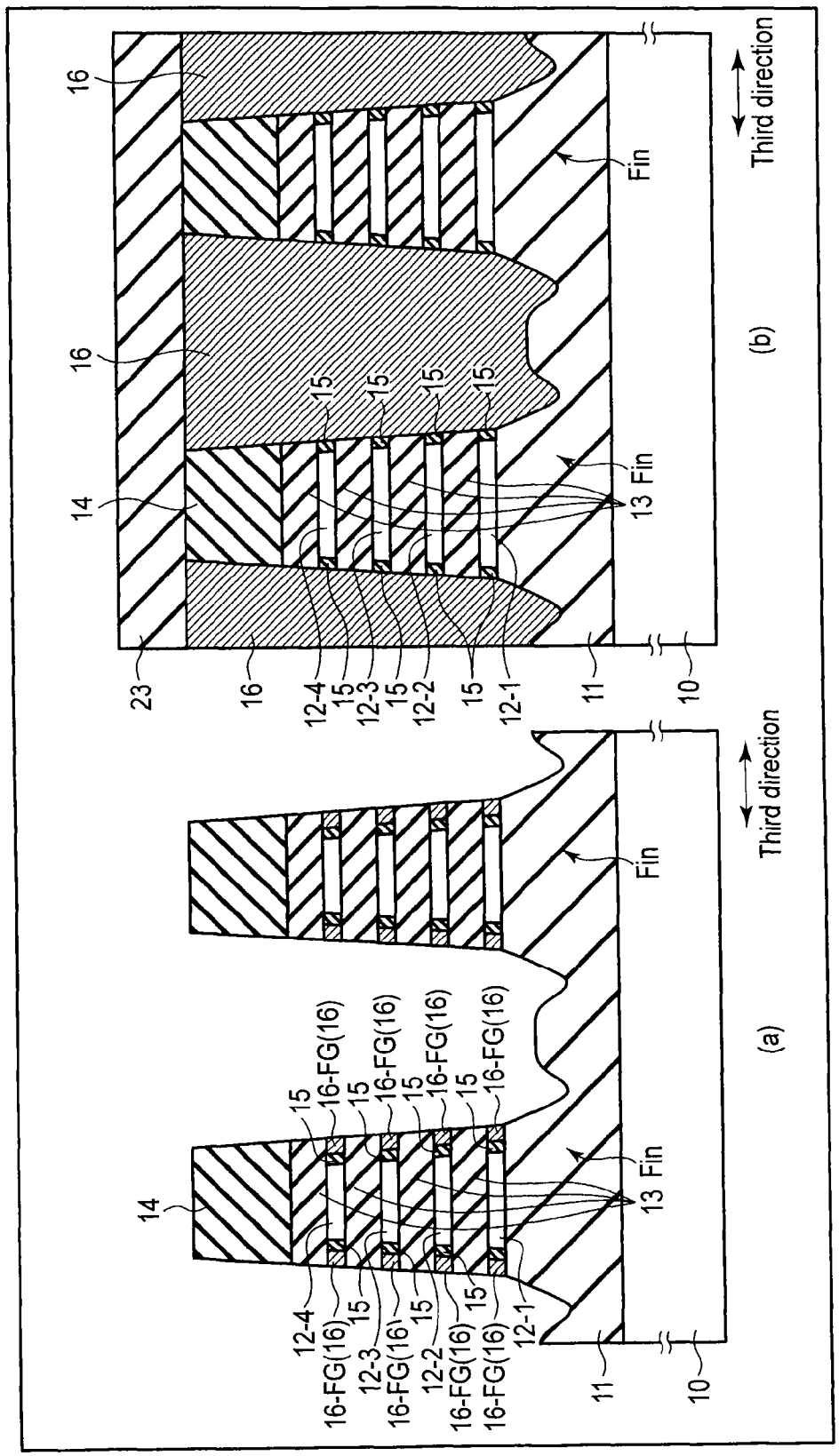
F I G. 47

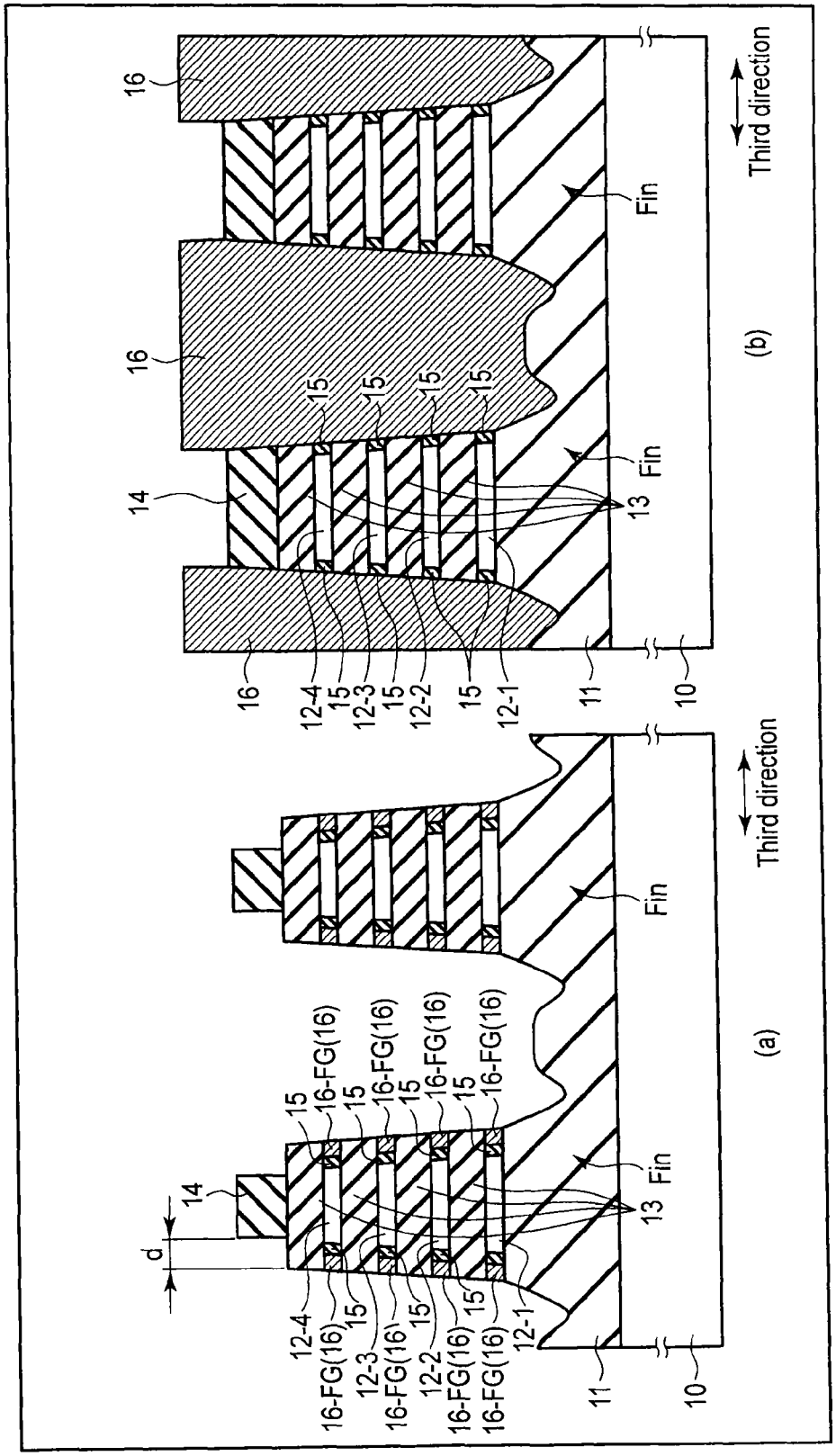
F I G. 48

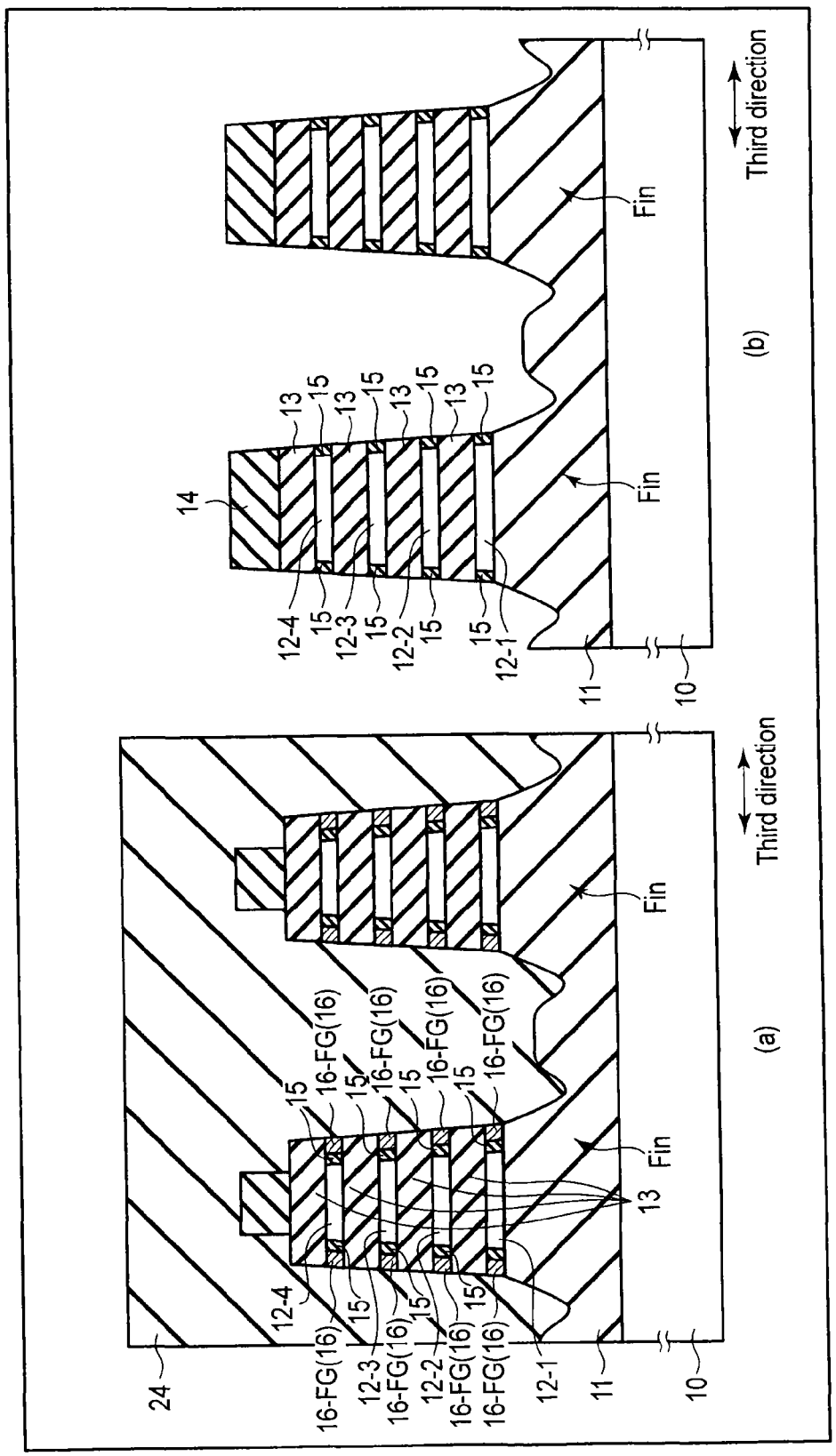
F I G. 49

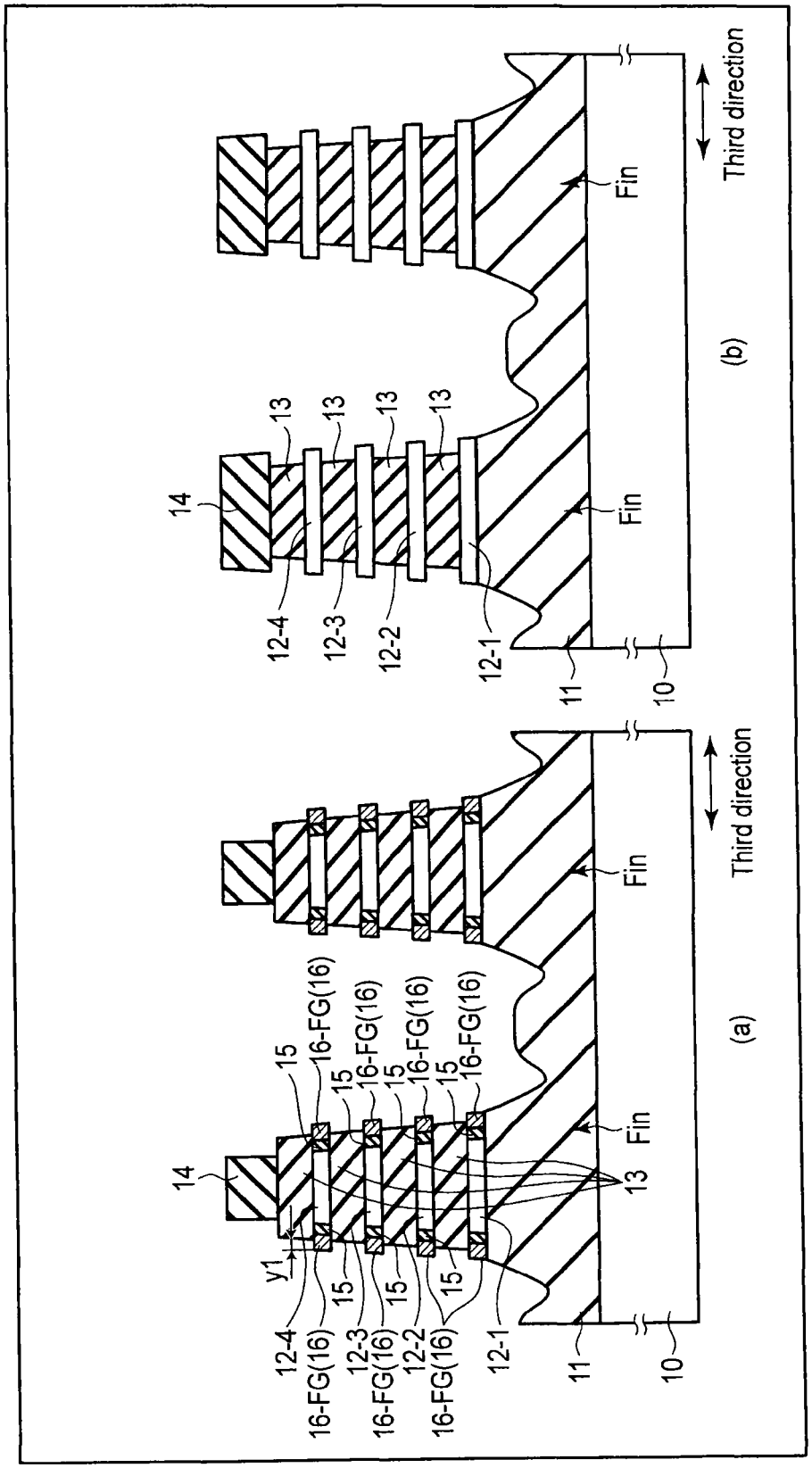
F I G. 50

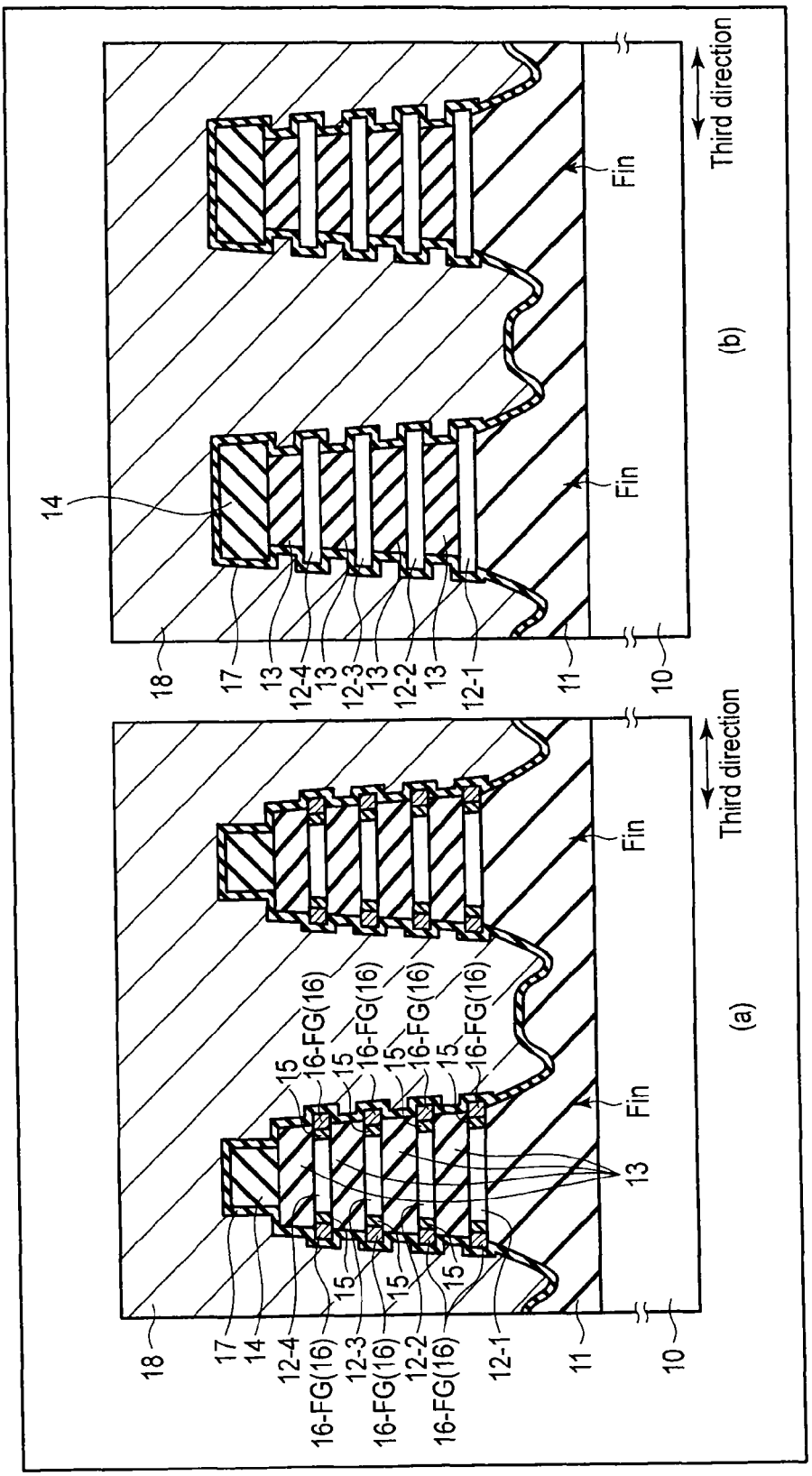
F I G. 51

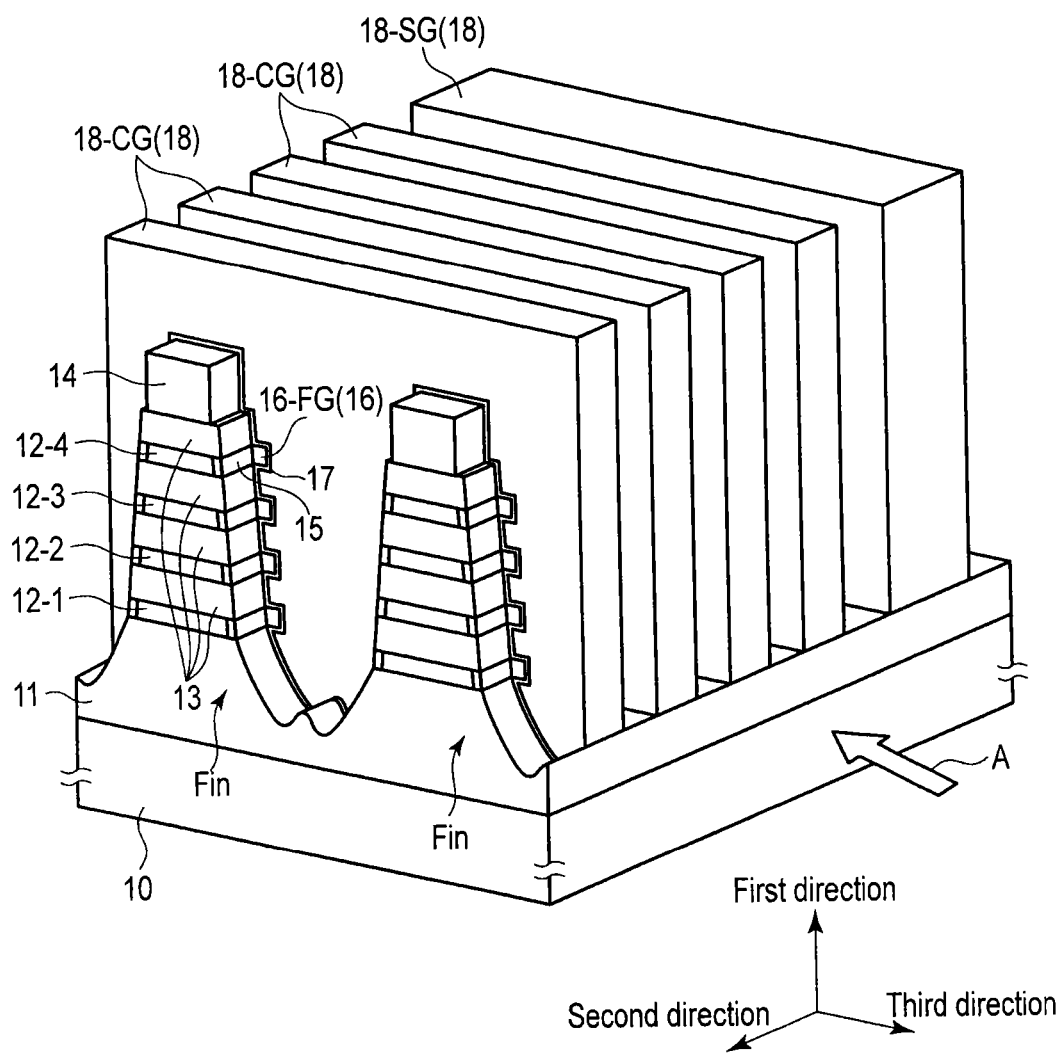
F I G. 52

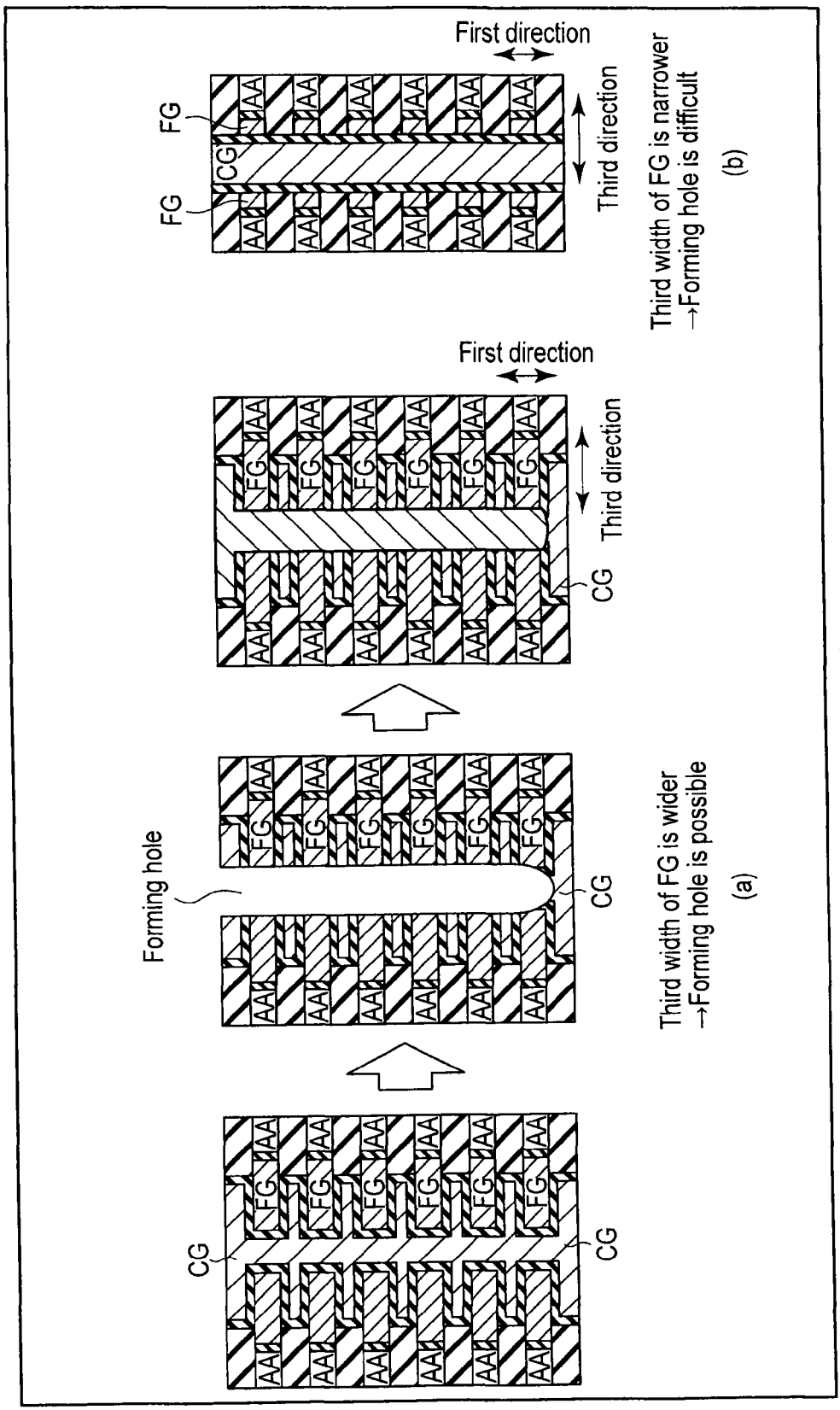
F I G. 53

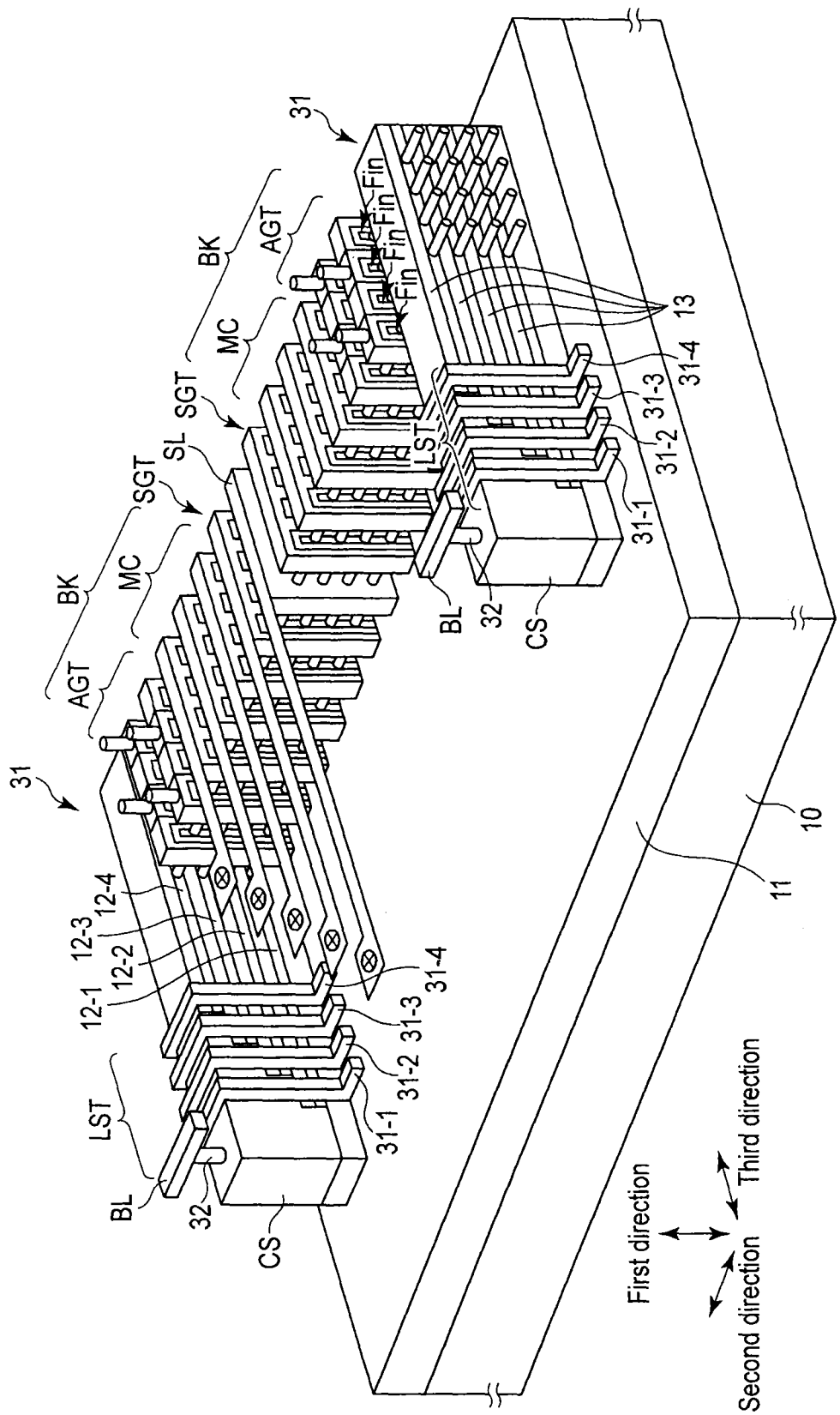
F I G. 54

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2012-112306, filed May 16, 2012, the entire contents of which are incorporated herein by reference.

FIELD

Embodiments described herein relate generally to a nonvolatile semiconductor memory device and a method of manufacturing the same.

BACKGROUND

A NAND type flash memory, which is a nonvolatile semiconductor memory device, is widely used as a mass data storage device. Currently, it is expected that further miniaturization will progress as the reduction in cost per bit and the increase in capacity progress by the miniaturization of memory elements. However, for further miniaturization of a flash memory, there are many problems to solve, such as development of lithography technology and suppression of short channel effects, inter-element interference and inter-element variation. For this reason, there is a high possibility that it becomes difficult to further improve the storage density continuously only by the development of miniaturization technology in a simple plane.

Therefore, in recent years, in order to increase the integration density of memory cells, development for transition from a conventional two-dimensional (planar) memory structure to a three-dimensional (volumetric) memory structure has been made, and a variety of three-dimensional nonvolatile semiconductor memory devices have been proposed. Among them, a vertical gate (VG) type semiconductor memory structure is characterized in that a stacked active area (AA) and a gate contact (GC) can be formed collectively since a layout including peripheral elements is substantially equal to a planar structure.

However, when a NAND type memory cell array structure is employed, a memory string includes a memory cell and a select transistor. Also, usually, unlike a memory cell having a floating gate electrode (FG), a select transistor is formed in a metal-insulator-semiconductor (MIS) type not having a floating gate electrode (FG) so that a threshold value thereof does not vary.

In order to realize such a select transistor, in the conventional technology, while a select transistor and a memory cell have the same structure, a portion corresponding to a floating gate electrode (FG) and a portion corresponding to a control gate electrode (CG) in the select transistor are shorted mutually by employing a process of providing a hole in an inter-electrode insulating layer. Accordingly, a MIS type select transistor can be realized.

However, it is very difficult to employ this technology in a vertical gate type semiconductor memory structure. This is because, in such a three-dimensional structure, a floating gate electrode and a control gate electrode are aligned in a direction parallel to the surface of a semiconductor substrate. Therefore, in such a three-dimensional nonvolatile semiconductor memory device, when a MIS type select transistor not having a floating gate electrode is formed forcibly, the characteristic degradation and failure of a select transistor occur due to misalignment or the like.

BRIEF DESCRIPTION OF THE DRAWINGS

FIG. 1 is a perspective view illustrating a first embodiment;
FIG. 3 is a cross-sectional view taken along line in FIG. 2;
FIGS. 6 to 19 are views illustrating a process of a manufacturing method;
FIG. 20 is a perspective view illustrating a second embodiment;
FIG. 21 is a side view taken along arrow A in FIG. 20;
FIG. 23 is a cross-sectional view taken along line XXIII-XXIII in FIG. 21;
FIG. 24 is a cross-sectional view taken along line XXIV-XXIV in FIG. 21;
FIGS. 26 to 41 are views illustrating a process of a manufacturing method;
FIG. 43 is a side view taken along arrow A in FIG. 42;
FIG. 44 is a cross-sectional view taken along line XLIV-XLIV in FIG. 43;
FIGS. 47 to 52 are views illustrating a process of a manufacturing method;
FIG. 53 is a view illustrating a select transistor manufacturing method as a comparative example;
and
FIG. 54 is a perspective view illustrating a VLB as an application example.

DETAILED DESCRIPTION

Figure 2:
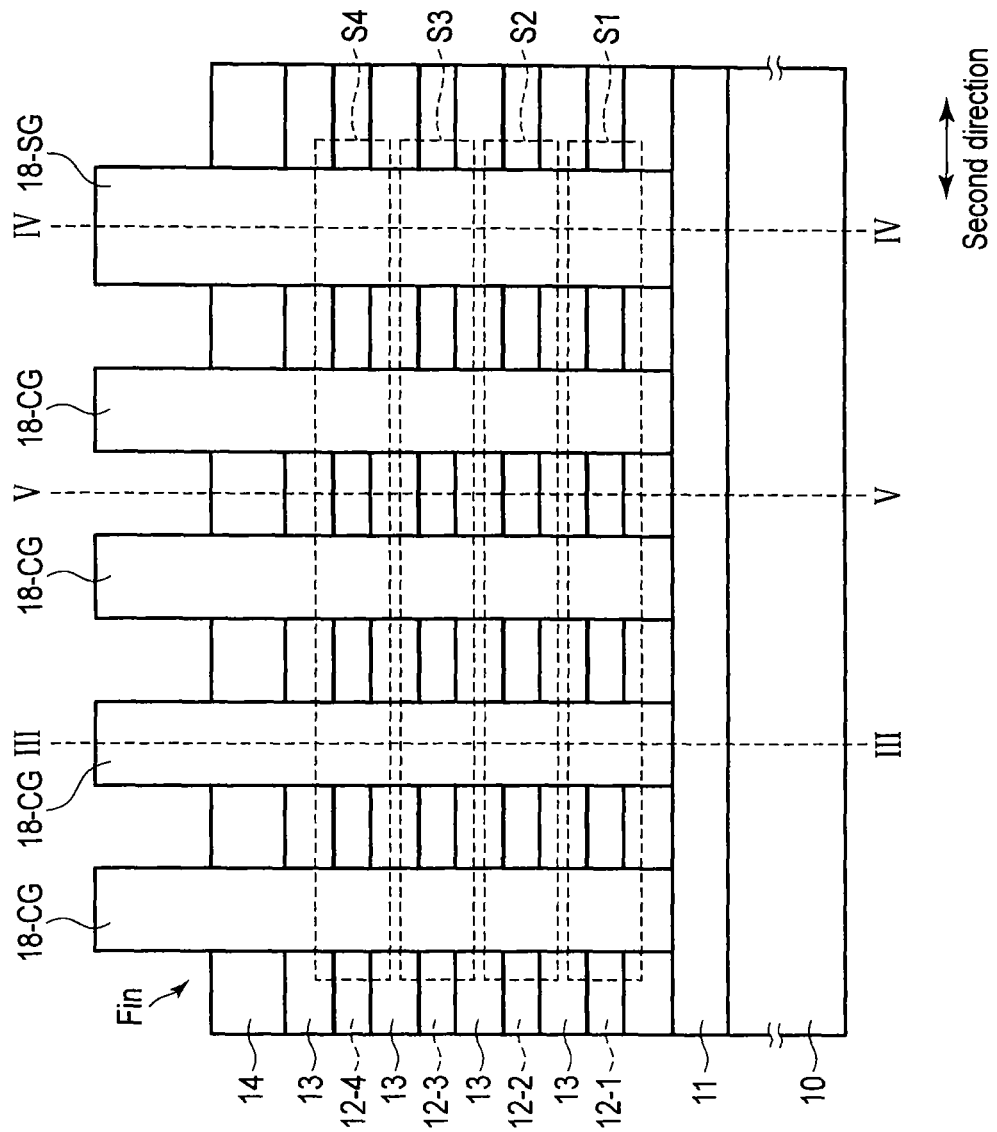
FIG. 2 is a side view taken along arrow A in FIG. 1.

In general, according to one embodiment, a nonvolatile semiconductor memory device comprising: a semiconductor substrate; a first fin structure having first to n-th semiconductor layers (n is a natural number equal to or more than 2) stacked in a first direction perpendicular to a surface of the semiconductor substrate, and extending in a second direction parallel to the surface of the semiconductor substrate; first to n-th memory cells provided on surfaces of the first to n-th semiconductor layers in a third direction perpendicular to the first and second directions respectively; and first to n-th select transistors connected in series to the first to n-th memory cells respectively, wherein the first to n-th memory cells comprise a first gate structure including a first insulating layer, a floating gate electrode with a first conductive layer, a second insulating layer, and a control gate electrode with a second conductive layer, in order thereof from the surfaces of the first to n-th semiconductor layers in the third direction, the first to n-th select transistors comprise a second gate structure including the first insulating layer, and a select gate electrode with the first conductive layer, in order thereof from the surfaces of the first to n-th semiconductor layers in the third direction, the first conductive layers of the floating gate electrodes of the first to n-th memory cells are independent of one another, the second conductive layers of the control gate electrodes of the first to n-th memory cells are connected to one another in the first direction, and the first conductive layers of the select gate electrodes of the first to n-th select transistors are connected to one another in the first direction.

Hereinafter, embodiments will be described with reference to the drawings.

Also, throughout the embodiments, like configurations will be denoted by like symbols, and redundant descriptions will be omitted. Also, the respective drawings are schematic views for promoting the description and understanding of the invention, and their shapes, sizes and ratios may be different from those of actual devices; however, designs thereof may be modified appropriately in consideration of the following descriptions and the known technologies.

SUMMARY

The following embodiments relate to a three-dimensional nonvolatile semiconductor memory device including a fin structure having semiconductor layers (active area) stacked on a semiconductor substrate.

A memory cell of the nonvolatile semiconductor memory device includes, for example, a gate structure in which a first insulating layer (tunnel oxide layer), a charge storage layer, a second insulating layer, and a control gate electrode are stacked in that order on side surfaces of semiconductor layers constituting a fin structure.

For example, as one of the vertical gate type three-dimensional stacked memories, a vertical gate ladder-bit cost scalable memory (VLB) corresponds to the nonvolatile semiconductor memory device to which the embodiments relate.

The VLB is classified into a vertical gate-floating gate type (VG-FG type) in which a charge storage layer is a floating gate electrode that is in an electrically floating state, and a vertical gate—Si/oxide/nitride/oxide/Si type (VG-SONOS type) in which a charge storage layer is a charge trap insulating layer that traps a charge. The embodiments relate to both of the two types of VLBs.

In the three-dimensional nonvolatile semiconductor memory device above, select transistors are used to select a block (memory string), a semiconductor layer, and a fin structure. For example, in the VLB, a block select transistor is used to select a block (memory string), a layer select transistor is used to select a semiconductor layer, and an assist gate transistor is used to select a fin structure.

Embodiments relate to structures of the select transistors and manufacturing methods thereof.

For example, a nonvolatile semiconductor memory device according to an embodiment includes a fin structure having first to n-th semiconductor layers (n is a natural number equal to or more than 2) stacked in a first direction perpendicular to a surface of a semiconductor substrate, and extending in a second direction parallel to the surface of the semiconductor substrate.

First to n-th memory cells are provided on a surface of the first to n-th semiconductor layers inside the fin structure in a third direction perpendicular to the first and second directions respectively. Also, first to n-th select transistors are connected in series to the first to n-th memory cells.

Since positions of the first to n-th select transistors are different according to the types of select transistors (block select transistor, layer select transistor, and assist gate transistor), a description thereof is omitted herein and details thereof will be described later.

The first to n-th memory cells include a gate structure in which a first insulating layer, a charge storage layer, a second insulating layer, and a control gate electrode are disposed in that order on the surface of the first to n-th semiconductor layers in the third direction.

When the charge storage layer is a floating gate electrode that is in an electrically floating state, the floating gate electrode is independent of each of the first to n-th memory cells, and the control gate electrode is shared by the first to n-th memory cells by extending in the first direction.

When the charge storage layer is a charge trap insulating layer that traps a charge, the charge storage layer may be independent of each of the first to n-th memory cells or may be connected thereto. Also, in this case, the control gate electrode is shared by the first to n-th memory cells by extending in the first direction.

In this case, the first to n-th select transistors have one of the following two gate structures.

First Structure

—Gate Structure in which Gate Insulating Layer (First Insulating Layer) and Select Gate Electrode with First Conductive Layer are Disposed in that Order—

The first structure is applied to the case where the memory cell has a floating gate electrode (for example, a VG-FG type).

That is, in this structure, the gate insulating layer of the first to n-th select transistors includes the same material (first insulating layer) as the gate insulating layer of the first to n-th memory cells, and the select gate electrode of the first to n-th select transistors includes the same material (first conductive layer) as the charge storage layer (floating gate electrode) of the first to n-th memory cells.

Also, the first conductive layer constituting the select gate electrode is shared by the first to n-th select transistors by extending in the first direction.

Second Structure

—Gate Structure in which Gate Insulating Layer (Second Insulating Layer) and Select Gate Electrode With Second Conductive Layer are Disposed in that Order—

The second structure is applied to both the case where the memory cell has a floating gate electrode (for example, a VG-FG type) and the case where the memory cell has a charge trap insulating layer (for example, a VG-SONOS type).

That is, in this structure, the gate insulating layer of the first to n-th select transistors includes the same material (second insulating layer) as the inter-electrode insulating layer or the block insulating layer of the first to n-th memory cells, and the select gate electrode of the first to n-th select transistors includes the same material (second conductive layer) as the control gate electrode of the first to n-th memory cells.

Also, the second conductive layer constituting the select gate electrode is shared by the first to n-th select transistors by extending in the first direction.

According to the above structure, since the first to n-th select transistors have a MIS structure different from the structure of the first to n-th memory cells, a process of forming a hole necessary in the conventional technology becomes unnecessary. Therefore, the above-described two structures can be easily obtained even when an increase in the number of first to n-th semiconductor layers, a reduction in the height (width in the third direction) of the floating gate electrode of the first to n-th memory cells, and a reduction in the space between fins occur due to the high integration and miniaturization of memory cells.

Therefore, since the characteristic degradation and failure of the first to n-th select transistors can be prevented, the high integration and high reliability of the three-dimensional nonvolatile semiconductor memory device can be realized simultaneously.

First Embodiment

This embodiment is applied to the case where a memory cell structure is a floating gate type.

That is, this embodiment relates to a structure (second structure) in which the select transistor includes the first insulating layer (gate insulating layer) and the first conductive layer (select gate electrode) when the memory cell includes the first insulating layer (gate insulating layer), the first conductive layer (floating gate electrode), the second insulating layer, and the second conductive layer (control gate electrode).

Structure

Figure 4:
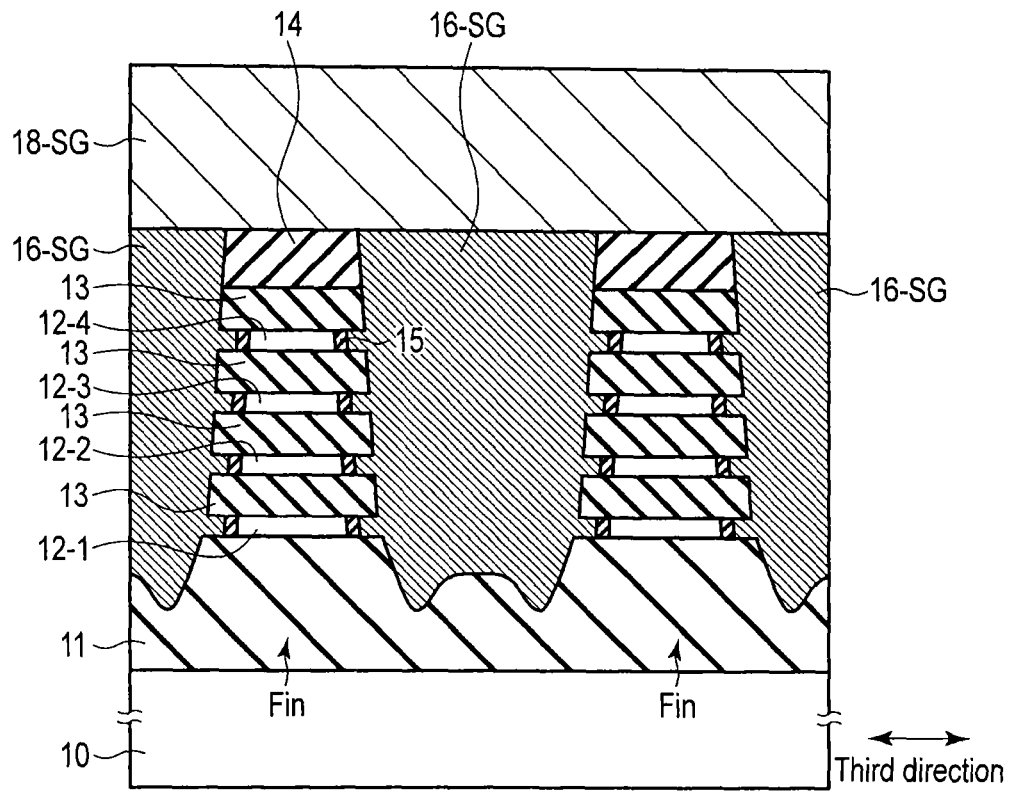
FIG. 4 is a cross-sectional view taken along line IV-IV in FIG. 2.
Figure 5:
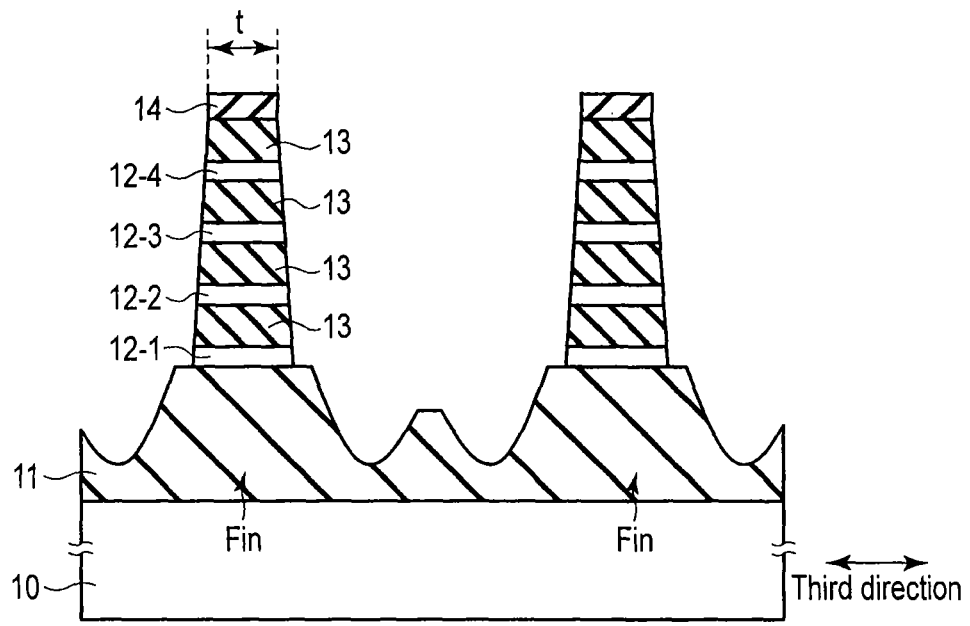
FIG. 5 is a cross-sectional view taken along line V-V in FIG. 2.

FIG. 1 illustrates a structure of a VG-FG type VLB. FIG. 2 is a side view of the structure of FIG. 1 taken along arrow A; FIG. 3 is a cross-sectional view taken along line in FIG. 2; FIG. 4 is a cross-sectional view taken along line IV-IV in FIG. 2; and FIG. 5 is a cross-sectional view taken along line V-V in FIG. 2.

In this embodiment, main portions of a memory cell array of the VG-FG type VLB will be described. The entire memory cell array of the VG-FG type VLB will be described in an application example.

Semiconductor substrate 10 is, for example, a silicon substrate. Insulating layer 11 is, for example, a silicon oxide layer referred to as buried oxide (BOX), and is used as an element isolation insulating layer.

On insulating layer 11, first, second, third and fourth semiconductor layers (active area) 12-1, 12-2, 12-3 and 12-4 are stacked in a first direction perpendicular to a surface of semiconductor substrate 10. First, second, third and fourth semiconductor layers 12-1, 12-2, 12-3 and 12-4 extend in a second direction parallel to the surface of semiconductor substrate 10, and are insulated from one another.

In this embodiment, four semiconductor layers are stacked; however, the invention is not limited thereto and two or more semiconductor layers may be stacked. Also, as the number of stacked semiconductor layers increases, it is more preferable since the memory capacity as a semiconductor memory increases.

First, second, third and fourth semiconductor layers 12-1, 12-2, 12-3 and 12-4 are insulated from one another by insulating layer (for example, silicon oxide layer) 13.

Insulating layer (for example, silicon nitride layer) 14 is disposed as a hard mask layer on insulating layer 13 on uppermost fourth semiconductor layer 12-4.

First, second, third and fourth semiconductor layers 12-1, 12-2, 12-3 and 12-4 and insulating layers 13 and 14 constitute a fin structure Fin. First, second, third and fourth semiconductor layers 12-1, 12-2, 12-3 and 12-4 are preferably in a monocrystalline state, but may be in a polycrystalline state or an amorphous state.

First, second, third and fourth memory strings S1, S2, S3 and S4 use first, second, third and fourth semiconductor layers 12-1, 12-2, 12-3 and 12-4 as channels respectively. Each of first, second, third and fourth memory strings S1, S2, S3 and S4 includes memory cells MC connected in series in the second direction, and select transistor SGT connected in series to memory cells MC.

Memory cells MC constituting first, second, third and fourth memory strings S1, S2, S3 and S4 include gate insulating layer (tunnel oxide layer) 15, floating gate electrode 16-FG, inter-electrode insulating layer 17, and control gate electrode 18-CG on the surface of first, second, third and fourth semiconductor layers 12-1, 12-2, 12-3 and 12-4 in a third direction perpendicular to the first and second directions respectively.

Floating gate electrode 16-FG includes a first conductive layer (for example, conductive polysilicon layer). First conductive layer constituting floating gate electrode 16-FG is independent of each of memory cells MC constituting first, second, third and fourth memory strings S1, S2, S3 and S4.

Control gate electrode 18-CG includes a second conductive layer (for example, conductive polysilicon layer). Second conductive layer constituting control gate electrode 18-CG is shared by first, second, third and fourth memory strings S1, S2, S3 and S4 by extending in the first direction along the surface of first, second, third and fourth semiconductor layers 12-1, 12-2, 12-3 and 12-4 in the third direction.

In order to increase the coupling ratio of memory cells MC, control gate electrode 18-CG covers the side surface of floating gate electrode 16-FG in the first direction and the side surface of floating gate electrode 16-FG in the third direction.

Also, control gate electrode 18-CG completely fills the space between two fin structures Fin aligned in the third direction (only between memory cells MC inside two fin structures Fin). When viewed from the top of semiconductor substrate 10, control gate electrode 18-CG extends in the third direction as a whole.

Select transistors SGT constituting first, second, third and fourth memory strings S1, S2, S3 and S4 include gate insulating layer 15 and select gate electrode 18-SG on the surface of first, second, third and fourth semiconductor layers 12-1, 12-2, 12-3 and 12-4 in the third direction perpendicular to the first and second directions respectively.

Select gate electrode 18-SG includes a first conductive layer (for example, conductive polysilicon layer). First conductive layer constituting select gate electrode 18-SG is shared by first, second, third and fourth memory strings S1, S2, S3 and S4 by extending in the first direction along the surface of first, second, third and fourth semiconductor layers 12-1, 12-2, 12-3 and 12-4 in the third direction.

Also, select gate electrode 18-SG includes a second conductive layer (for example, conductive polysilicon layer) provided on the surface (top surface) of the first conductive layer constituting select gate electrode 18-SG in the first direction.

Select gate electrode 16-SG completely fills the space between two fin structures Fin aligned in the third direction (only between memory cells MC inside two fin structures Fin). When viewed from the top of semiconductor substrate 10, select gate electrodes 16-SG and 18-SG extend in the third direction as a whole.

In this embodiment, the width of first, second, third and fourth semiconductor layers 12-1, 12-2, 12-3 and 12-4 in the third direction inside the region in which select transistors SGT are provided is substantially equal to the width of first, second, third and fourth semiconductor layers 12-1, 12-2, 12-3 and 12-4 in the third direction inside the region in which memory cells MC are provided.

Also, the width of first, second, third and fourth semiconductor layers 12-1, 12-2, 12-3 and 12-4 in the third direction inside the region in which select transistors SGT and memory cells MC are provided is wider than the width of first, second, third and fourth semiconductor layers 12-1, 12-2, 12-3 and 12-4 in the third direction inside the other regions.

That is, the width of first, second, third and fourth semiconductor layers 12-1, 12-2, 12-3 and 12-4 in the third direction inside the regions other than the region in which select transistors SGT and memory cells MC are provided is substantially equal to width t of insulating layer 14 as a hard mask layer in the third direction.

In this embodiment, four memory strings corresponding to four semiconductor layers are stacked; however, the invention is not limited thereto and two or more memory strings corresponding to two or more semiconductor layers may be stacked.

According to the above structure, since gate insulating layer 15 and select gate electrode 16-SG of select transistor SGT can be formed simultaneously with gate insulating layer (tunnel oxide layer) 15 and floating gate electrode 16-FG of memory cell MC, a process of forming a hole necessary in the conventional technology becomes unnecessary. Therefore, since the characteristic degradation and failure of select transistor SGT can be prevented, the high integration and high reliability of the three-dimensional nonvolatile semiconductor memory device can be realized simultaneously.

Examples of Materials

As materials constituting the above-described VG-FG type VLB, optimal materials may be appropriately selected according the respective generations of a semiconductor memory; however, the most commonly used material will be described as an example hereinafter.

Semiconductor substrate 10 is, for example, a monocrystalline silicon substrate.

Also, insulating layer 11 is, for example, a silicon oxide layer. When a portion contacting first semiconductor layer 12-1 is an oxide layer, insulating layer 11 may have a multi-layer structure including a different insulating layer. Likewise, insulating layer 13 is, for example, a silicon oxide layer. When a portion contacting first, second, third and fourth semiconductor layers 12-1, 12-2, 12-3 and 12-4 is an oxide layer, insulating layer 13 may have a multi-layer structure including a different insulating layer.

Each of first, second, third and fourth semiconductor layers 12-1, 12-2, 12-3 and 12-4 is, for example, a silicon (Si) layer. First, second, third and fourth semiconductor layers 12-1, 12-2, 12-3 and 12-4 are preferably monocrystalline, but may be polycrystalline or amorphous.

Uppermost insulating layer 14 constituting fin structure Fin is, for example, a silicon nitride layer. In order to function as a hard mask layer, insulating layer 14 is formed of a material having an etching selectivity different from that of insulating layers 11 and 13.

Gate insulating layer (tunnel oxide layer) 15 constituting memory cell MC is, for example, a silicon oxide layer. Gate insulating layer 15 may be a stacked structure of silicon oxynitride, silicon oxide and silicon nitride. Also, gate insulating layer 15 may include silicon nanoparticles, metal ions, or the like.

Floating gate electrode 16-FG and select gate electrode 16-SG may be selected from polysilicon (undoped or doped), amorphous silicon (undoped or doped), metal, and the like. Floating gate electrode 16-FG and select gate electrode, 16-SG may have a stacked structure including different materials.

Also, floating gate electrode 16-FG and select gate electrode 16-SG may include silicon nanoparticles, metal ions, or the like.

Inter-electrode insulating layer 17 constituting memory cell MC includes, for example, a material that supports both the improvement of a coupling ratio and the prevention of a leakage current in a write/erase operation.

For example, inter-electrode insulating layer 17 may be selected from the group consisting of silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), lanthanum aluminate ($LaAlO_3$), and lanthanum aluminum silicate (LaAlSiO).

Inter-electrode insulating layer 17 may include a material obtained by changing a composition ratio of the element constituting the above-described material, or may include a material obtained by mixing silicon nanoparticles or metal ions in the above-described material.

Control gate electrode 18-CG and select gate electrode 18-SG include, for example, one of a conductive polysilicon layer and a metal silicide layer such as nickel silicide (NiSi).

Control gate electrode 18-CG and select gate electrode 18-SG may include, for example, metal compounds such as tantalum nitride (TaN), tantalum carbide (TaC), and titanium nitride (TiN), or Ni, V, Cr, Mn, Y, Mo, Ru, Rh, Hf, Ta, W, Ir, Co, Ti, Er, Pt, Pd, Zr, Gd, Dy, Ho, Er, and silicide thereof, which have a metallic electrical conduction property.

Also, an interlayer insulating layer covering the structure illustrated in FIGS. 1 to 5 may include a material having a dielectric constant of about the same level as that of a silicon oxide layer having a dielectric constant of 3.9. TEOS may be used as an example of the interlayer insulating layer. Alternatively, for example, a silicon oxide layer formed by firing the polysilazane solvent by heat treatment may be used as the interlayer insulating layer.

The material constituting floating gate electrode 16-FG, control gate electrode 18-CG, and select gate electrodes 16-SG and 18-SG may use any material as long as the following process can be employed.

Manufacturing Method

FIGS. 6 to 19 illustrate a method of manufacturing the VG-FG type VLB illustrated in FIGS. 1 to 5.

Figure 6:
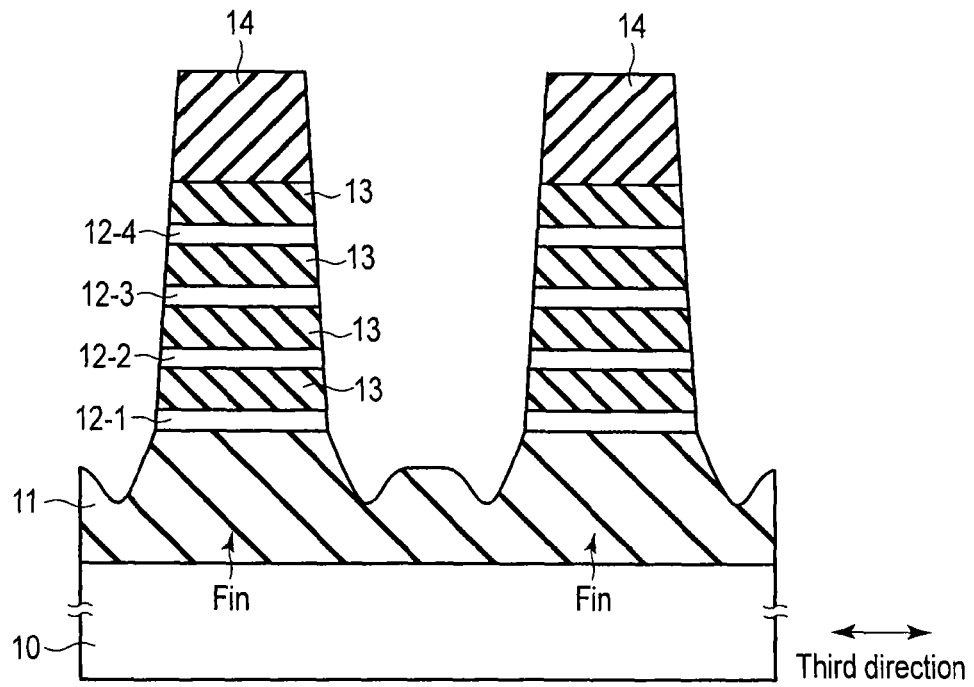

First, as illustrated in FIG. 6, for example, a p-type or n-type silicon substrate having a plane orientation of 100 and a specific resistance of 10 Ωcm to 20 Ωcm is prepared as semiconductor substrate 10. Insulating layers 11 and 13 as silicon oxide layers, and first, second, third and fourth semiconductor layers 12-1, 12-2, 12-3 and 12-4 as polysilicon layers are alternately formed on semiconductor substrate 10. Subsequently, insulating layer 14 is formed as a hard mask layer (for example, silicon nitride layer) on uppermost insulating layer 13.

Also, a resist pattern is formed on insulating layer 14 by photo engraving process (PEP). Then, by using the resist pattern as a mask, insulating layer 14, insulating layer 13, fourth semiconductor layer 12-4, insulating layer 13, third semiconductor layer 12-3, insulating layer 13, second semiconductor layer 12-2, insulating layer 13, and first semiconductor layer 12-1 are sequentially etched by reactive ion etching (RIE). At this time, a portion of insulating layer 11 as an element isolation insulating layer is also etched.

Accordingly, a fin structure Fin is formed. Thereafter, the resist pattern is removed.

Figure 7:
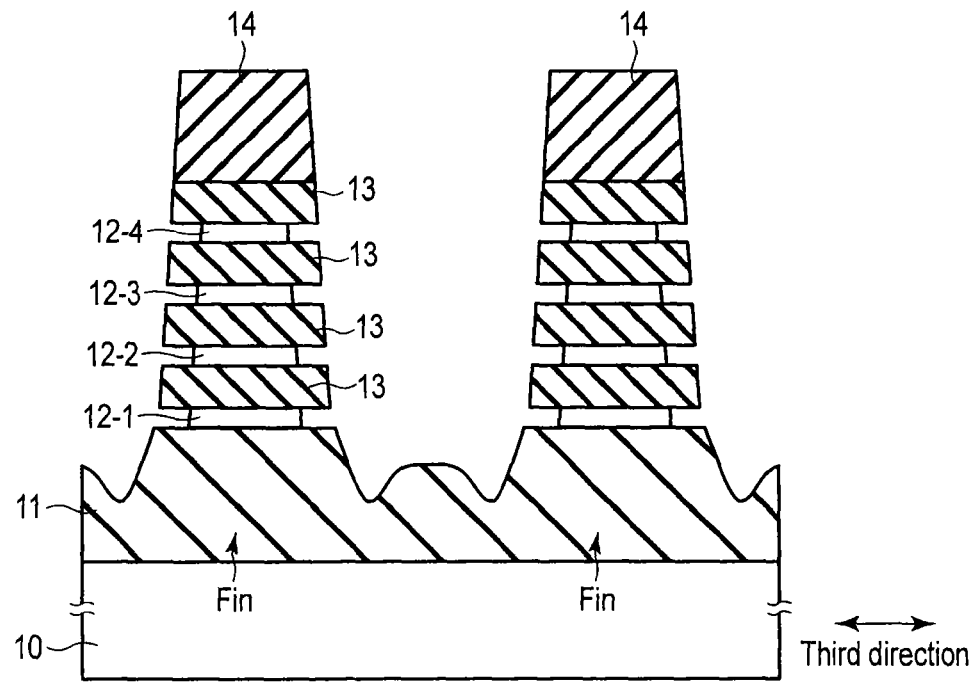

Next, as illustrated in FIG. 7, the surface of first, second, third and fourth semiconductor layers 12-1, 12-2, 12-3 and 12-4 constituting fin structure Fin in the third direction is recess-etched, for example, by wet etching using choline, chemical dry etching (CDE), or dry etching using chlorine gas. As a result, a recess portion is formed on the surface of the fin structure Fin in the third direction.

That is, by this etching, the surface of first, second, third and fourth semiconductor layers 12-1, 12-2, 12-3 and 12-4 in the third direction is recessed inwardly from the surface of insulating layer 13 in the third direction, and as a result, the width of first, second, third and fourth semiconductor layers 12-1, 12-2, 12-3 and 12-4 in the third direction is shrunk.

Figure 8:
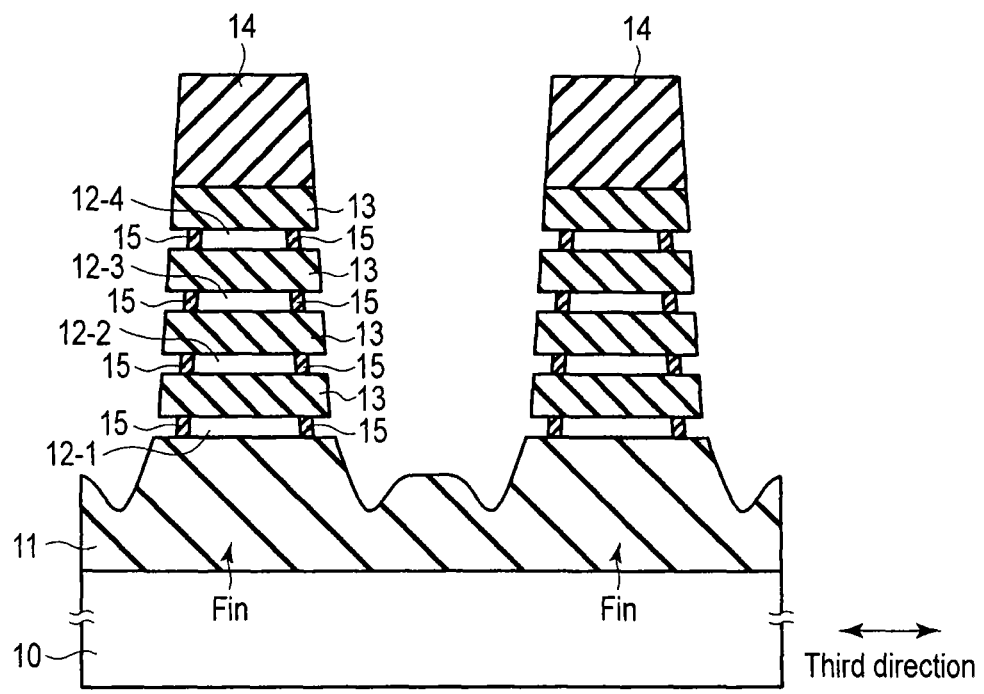

Next, as illustrated in FIG. 8, for example, by slot plane antenna (SPA) plasma generation technology, gate insulating layer (for example, silicon oxide layer) 15 is formed inside the recess portion of fin structure Fin in the third direction, that is, on the surface of first, second, third and fourth semiconductor layers 12-1, 12-2, 12-3 and 12-4 in the third direction.

Gate insulating layer 15 serves as a tunnel oxide layer of a memory cell or a gate insulating layer of a select transistor.

Figure 9:
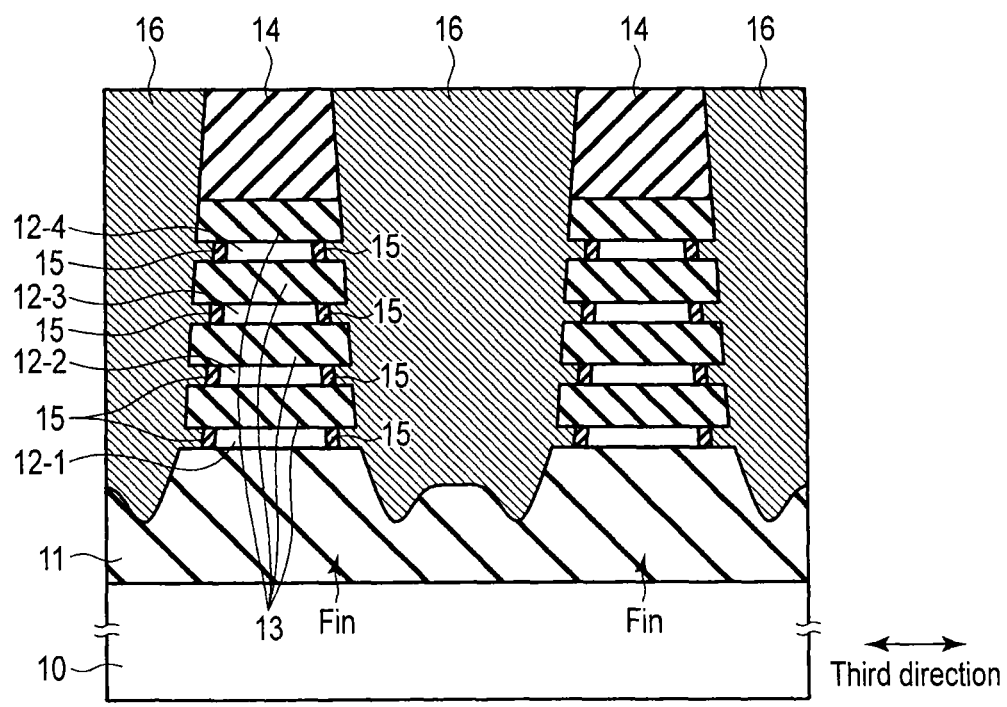

Next, as illustrated in FIG. 9, for example, by CVD, the entire surface of fin structure Fin is covered by first conductive layer 16 as a polysilicon layer. First conductive layer 16 completely fills the space between two fin structures Fin aligned in the third direction.

Also, for example, by using chemical mechanical polishing (CMP), the top surface of first conductive layer 16 is polished to planarize the top surface of first conductive layer 16. At this time, the top surface of insulating layer 14 may be employed as an end point of the CMP.

Since a region in which a memory cell is formed is different from a region in which a select transistor is formed, the subsequent processes will be described with reference to different drawings respectively.

First, as illustrated in FIG. 10B, for example, by PEP, mask layer (resist layer) 19 is formed to cover a region in which a select transistor is formed.

By the above process, a MIS structure including gate insulating layer 15 and first conductive layer 16 as select gate electrode 16-SG is already formed in the region in which a select transistor is formed. Select gate electrode 16-SG completely fills the space between two fin structures Fin.

Thereafter, by using mask layer 19 as a mask, first conductive layer 16 is etched by RIE. Accordingly, as illustrated in FIG. 10A, floating gate electrode 16-FG is formed inside the recess portion of fin structure Fin in the region in which a memory cell is formed.

That is, in the region in which a memory cell is formed, floating gate electrodes 16-FG are separated from each other in the vertical direction (first direction).

However, at this point, floating gate electrodes 16-FG inside the recess portion of fin structure Fin are in the state of extending in the second direction perpendicular to the plane of paper, and are in the state of being connected to each other in one semiconductor layer (memory string).

Next, as illustrated in FIG. 11A, the surface of insulating layer 13 in the third direction is recess-etched, for example, by wet etching or isotropic dry etching using $HF/NH_3$ gas.

Preferably, etching amount y1 of insulating layer 13 may be set such that the surface of insulating layer 13 in the third direction after the etching is disposed between two side surfaces of floating gate electrode 16-FG in the third direction (the surface on the side of gate insulating layer 15 and the surface opposite to gate insulating layer 15).

This is to prevent the control gate electrode, which is formed later, from excessively approaching the edge portion of first, second, third and fourth semiconductor layers 12-1, 12-2, 12-3 and 12-4, in order to cover three surfaces of the floating gate electrode.

When the control gate electrode is set to cover three surfaces of the floating gate electrode, the coupling ratio of a memory cell can be improved since the facing area of the control gate electrode and the floating gate electrode increases.

Also, as illustrated in FIG. 11B, in this step, a region in which a select transistor is formed has no change from the step of FIG. 10B since the region is covered by mask layer 19. Thereafter, mask layer 19 is removed.

However, without removing mask layer 19 in this process, after forming a second conductive layer as a control gate electrode and an inter-electrode insulating layer which will be described later, mask layer 19 can be removed together with them.

In this case, since the inter-electrode insulating layer inside the region in which a select transistor is formed can be removed simultaneously with mask layer 19 by lift-off technology, CMP or PEP described later can be omitted, and the manufacturing cost can be reduced by the reduction of the number of steps.

Next, as illustrated in FIG. 12A, in the region in which a memory cell is formed, insulating layer 14 as a hard mask layer is etched, for example, by isotropic etching to shrink the width of insulating layer 14 in the third direction.

This step is performed so that floating gate electrodes 16-FG inside one memory string (one layer extending in the second direction) are securely separated from each other in each memory cell in the patterning of a control gate that will be described later.

Shrink amount d of insulating layer 14 by this step is set to an amount (theoretical value) that is sufficient to separate floating gate electrodes 16-FG inside one memory string from each other in each memory cell in the patterning of a control gate electrode.

Specifically, shrink amount d is set such that the surface of insulating layer 14 in the third direction after the shrink is disposed inside the interface of gate insulating layer 15 and floating gate electrode 16-FG. More preferably, the surface of insulating layer 14 in the third direction after the shrink is disposed outside the interface of first, second, third and fourth semiconductor layers 12-1, 12-2, 12-3 and 12-4 of gate insulating layer 15 and inside the interface between gate oxide film 15 and floating gate electrode 16-FG.

At this time, as illustrated in FIG. 12B, the top surface of insulating layer 14 as a hard mask layer is etched in the region in which a select transistor is formed.

Next, as illustrated in FIG. 13A, for example, by CVD, interlayer insulating layer (for example, $SiO_2/Si_3N_4/SiO_2$) 17 covering the entire surface of fin structure Fin is formed in the region in which a memory cell is formed. Subsequently, second conductive layer (for example, polysilicon layer) 18a is formed to cover fin structures Fin and completely fill the space between fin structures Fin.

At this time, as illustrated in FIG. 13B, inter-electrode insulating layer 17 and second conductive layer 18a are formed on first conductive layer 16 as select gate electrode 16-SG in the region in which a select transistor is formed.

Therefore, as illustrated in FIGS. 14A and 14B, the top surface of second conductive layer 18a and a portion of inter-electrode insulating layer 17 are polished by CMP. At this time, when the top surface of insulating layer 14 as a hard mask layer is employed as an end point of the CMP, all of inter-electrode insulating layer 17 is removed and the top surface of first conductive layer 16 as select gate electrode 16-SG is exposed in the region in which a select transistor is formed.

Thereafter, for example, by CVD, second conductive layer (for example, metal layer) 18b is formed on second conductive layer 18a in the region in which a memory cell array is formed, and on first conductive layer 16 as select gate electrode 16-SG in the region in which a select transistor is formed.

Also, as necessary, the top surface (surface in the first direction) of second conductive layer 18b may be planarized by CMP. In this case, the CMP may be performed after forming an insulating layer such as a silicon oxide layer on second conductive layer 18b.

Figure 15:
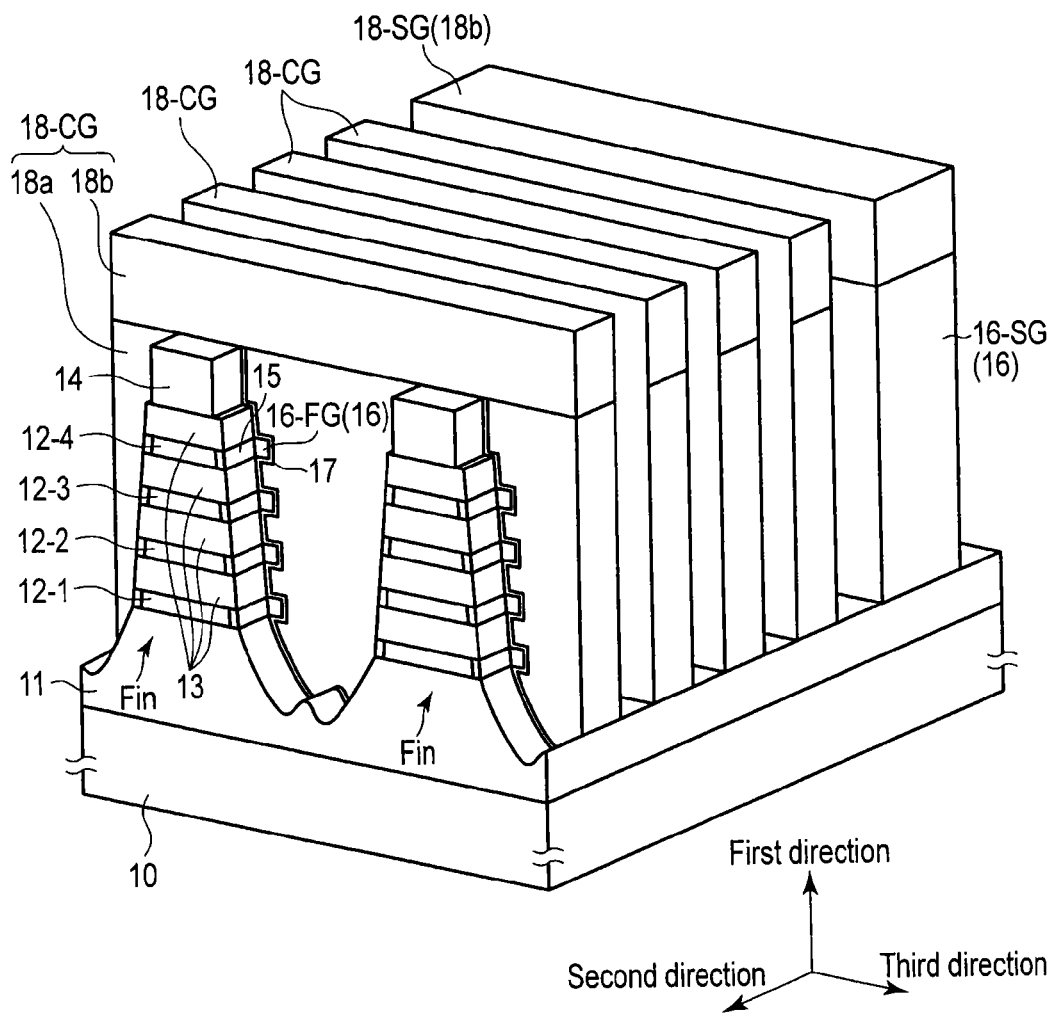

Next, as illustrated in FIG. 15, a resist pattern is formed on second conductive layer 18b by PEP, and control gate electrode 18-CG and select gate electrodes 16-SG and 18-SG are patterned by using the resist pattern as a mask.

The resist pattern used in the patterning has a line & space pattern extending in the third direction. Therefore, first and second conductive layers 16 and 18 and inter-electrode insulating layer 17, which are present in a portion not covered by the resist pattern, are completely removed.

At the same time, floating gate electrode 16-FG, which is present in the portion not covered by the resist pattern, is also removed. That is, in one memory string, floating gate electrodes 16-FG constituting one layer extending in the second direction are separated from each other in each memory cell by this step.

Finally, although not illustrated, for example, by CVD, interlayer insulating layer (for example, silicon oxide layer) is filled between select gate electrodes 18-SG and control gate electrodes 18-CG having a line & space pattern.

The VG-FG type VLB of FIGS. 1 to 5 is completed by the above processes.

Also, in the above-described manufacturing method, the steps illustrated in FIGS. 13 to 15 can be replaced with the following steps.

Figure 12:
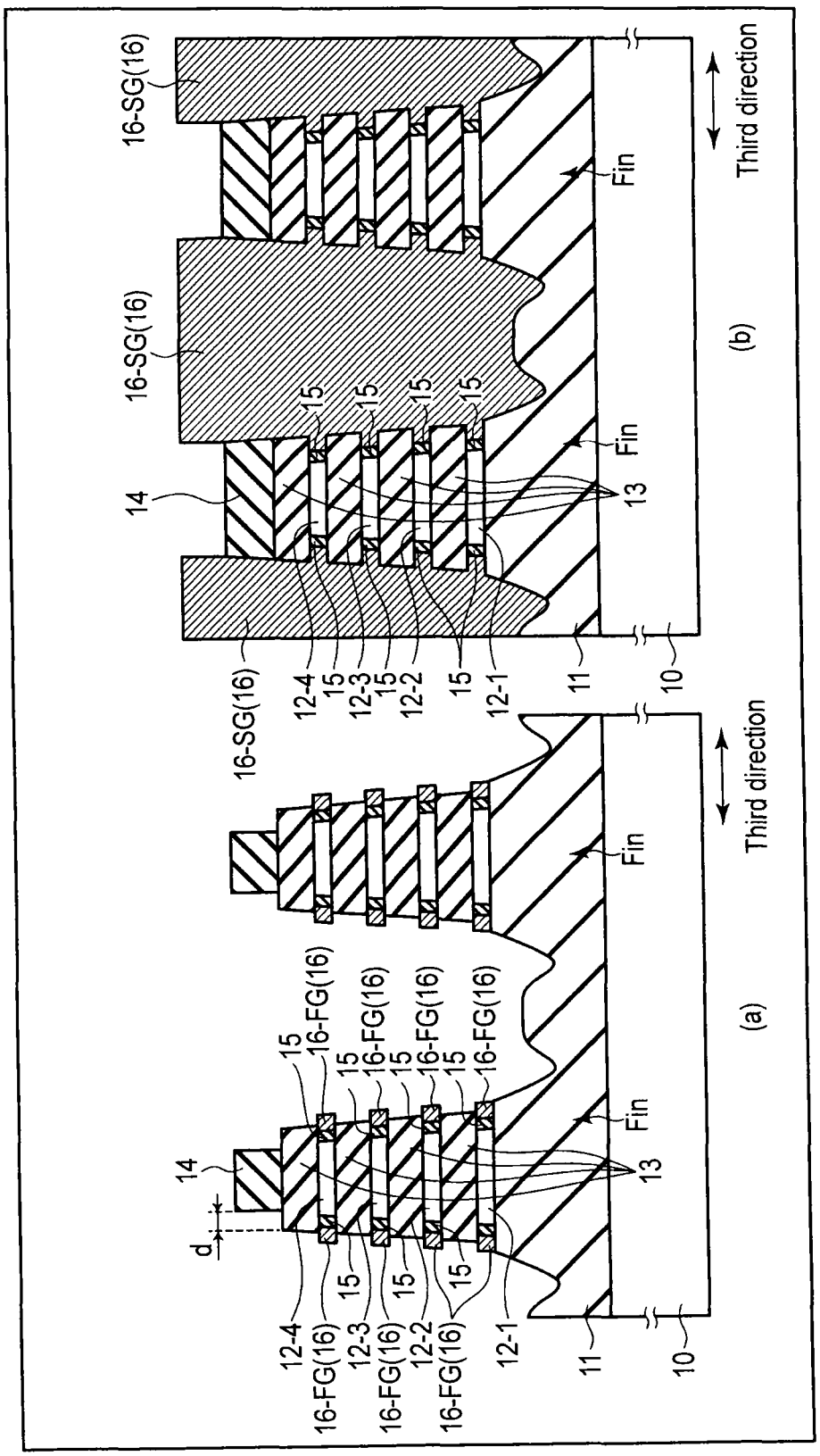

After the step of FIG. 12, for example, as illustrated in FIG. 16A, in the region in which a memory cell is formed, inter-electrode insulating layer (for example, $SiO_2/Si_3N_4/SiO_2$) 17 covering the entire surface of fin structure Fin is formed, for example, by CVD.

At this time, as illustrated in FIG. 16B, inter-electrode insulating layer 17 is formed on first conductive layer 16 as select gate electrode 16-SG in the region in which a select transistor is formed.

Therefore, as illustrated in FIG. 17A, by PEP, mask layer (resist layer) 20 is formed to cover a region in which a memory cell is formed.

Then, by using mask layer 20 as a mask, inter-electrode insulating layer 17 present inside the region in which a select transistor is formed is selectively removed by RIE. Accordingly, as illustrated in FIG. 17B, the top surface of first conductive layer 16 as select gate electrode 16-SG is exposed in the region in which a select transistor is formed.

Thereafter, mask layer 20 is removed.

Next, as illustrated in FIG. 18A, in the region in which a memory cell is formed, second conductive layer (for example, polysilicon layer) 18 is formed to fin structures Fin and completely fill the space between fin structures Fin. At this time, as illustrated in FIG. 18B, second conductive layer 18 is formed on first conductive layer 16 as select gate electrode 16-SG in the region in which a select transistor is formed.

Also, as necessary, the top surface (surface in the first direction) of second conductive layer 18 may be planarized by CMP. In this case, the CMP may be performed after forming an insulating layer such as a silicon oxide layer on second conductive layer 18.

Figure 19:
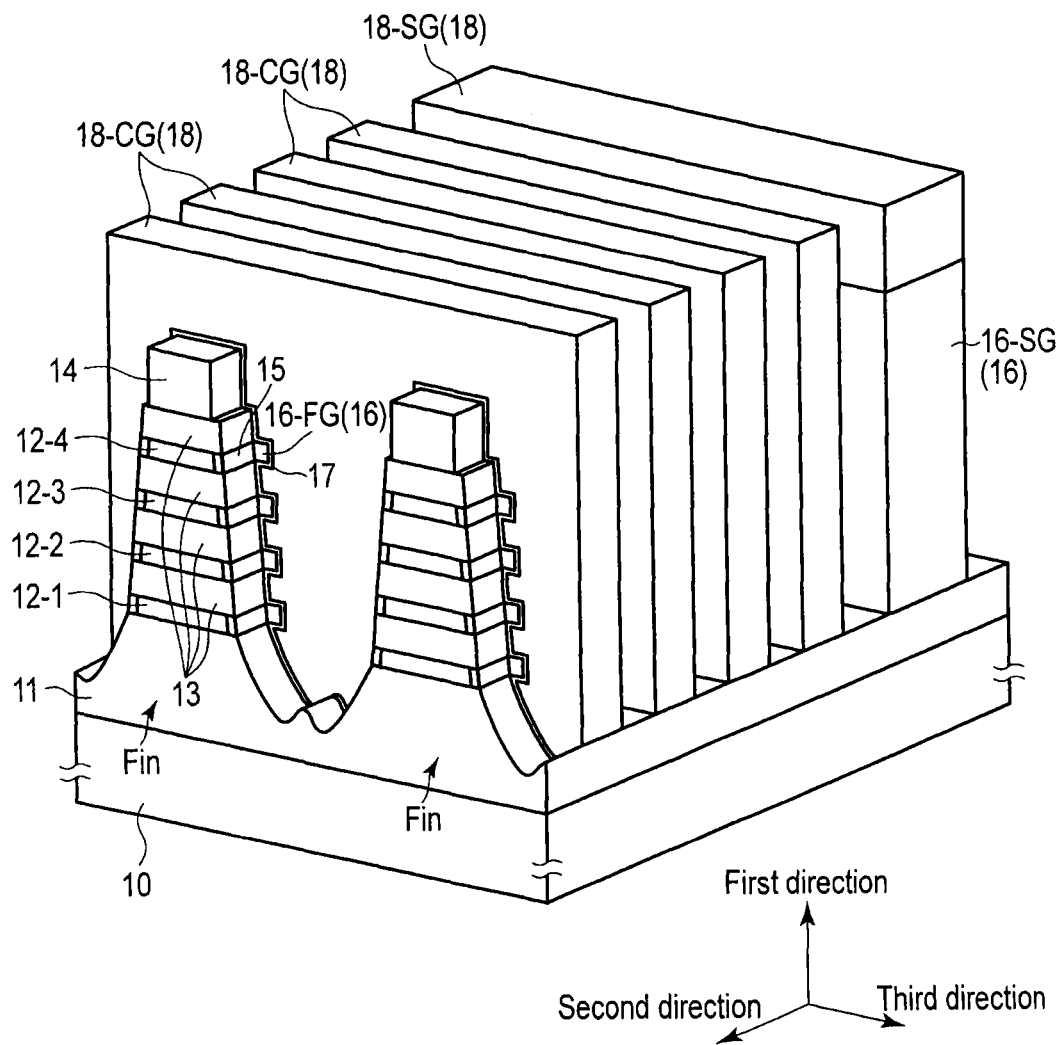

Next, as illustrated in FIG. 19, a resist pattern is formed on second conductive layer 18 by PEP, and control gate electrode 18-CG and select gate electrodes 16-SG and 18-SG are patterned by using the resist pattern as a mask.

The resist pattern used in the patterning has a line & space pattern extending in the third direction. Therefore, first and second conductive layers 16 and 18 and inter-electrode insulating layer 17, which are present in a portion not covered by the resist pattern, are completely removed.

At the same time, floating gate electrode 16-FG, which is present in the portion not covered by the resist pattern, is also removed. That is, in one memory string, floating gate electrodes 16-FG constituting one layer extending in the second direction are separated from each other in each memory cell by this step.

Finally, although not illustrated, for example, by CVD, interlayer insulating layer (for example, silicon oxide layer) is filled between select gate electrodes 18-SG and control gate electrodes 18-SG having a line & space pattern.

The VG-FG type VLB of FIGS. 1 to 5 is completed by the above processes.

Second Embodiment

The second embodiment is a modification of the first embodiment.

As compared with the first embodiment, this embodiment is characterized in that the width of a semiconductor layer (active area) in the third direction is wide in a region in which a select transistor is formed. Since the width of the active area is increased, the resistance value of a channel of a select transistor is reduced, and a read/write operation on a memory cell can be speeded up.

Structure

Figure 22:
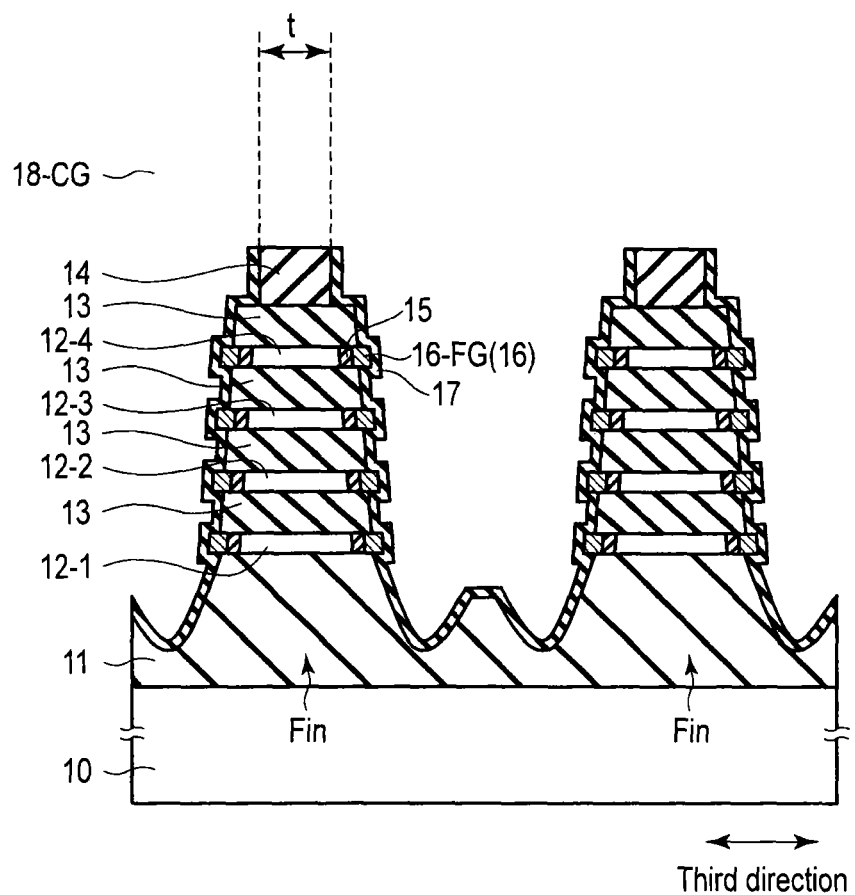
FIG. 22 is a cross-sectional view taken along line XXII-XXII in FIG. 21.

FIG. 20 illustrates a structure of a VG-FG type VLB. FIG. 21 is a side view of the structure of FIG. 20 taken along arrow A; FIG. 22 is a cross-sectional view taken along line XXII-XXII in FIG. 21; FIG. 23 is a cross-sectional view taken along line XXIII-XXIII in FIG. 21; and FIG. 24 is a cross-sectional view taken along line XXIV-XXIV in FIG. 21.

In this embodiment, main portions of a memory cell array of the VG-FG type VLB will be described. The entire memory cell array of the VG-FG type VLB will be described in an application example. Also, in this embodiment, portions the same as in the first embodiment will be denoted by the same symbols, and redundant descriptions will be omitted.

Insulating layer 11 as a device isolation insulating layer is disposed on semiconductor substrate 10, and fin structure Fin is disposed on insulating layer 11.

Fin structure Fin includes first, second, third and fourth semiconductor layers 12-1, 12-2, 12-3 and 12-4 (active area) and insulating layers 13 and 14.

First, second, third and fourth memory strings S1, S2, S3 and S4 use first, second, third and fourth semiconductor layers 12-1, 12-2, 12-3 and 12-4 as channels respectively.

Each of first, second, third and fourth memory strings S1, S2, S3 and S4 includes memory cells MC connected in series in the second direction, and select transistor SGT connected in series to memory cells MC.

Memory cells MC constituting first, second, third and fourth memory strings S1, S2, S3 and S4 include gate insulating layer (tunnel oxide layer) 15, floating gate electrode 16-FG, inter-electrode insulating layer 17, and control gate electrode 18-CG on the surface of first, second, third and fourth semiconductor layers 12-1, 12-2, 12-3 and 12-4 in a third direction perpendicular to the first and second directions respectively.

Since the structure of memory cell MC is the same as in the first embodiment, a description thereof will be omitted herein.

Select transistor SGT includes gate insulating layer 15 and select gate electrodes 18-SG on the surface of first, second, third and fourth semiconductor layers 12-1, 12-2, 12-3 and 12-4 in the third direction perpendicular to the first and second directions.

The structure of select transistor SGT is substantially the same as in the first embodiment. However, in a region in which select transistor SGT is formed, the width of first, second, third and fourth semiconductor layers 12-1, 12-2, 12-3 and 12-4 in the third direction is wider than that in the first embodiment.

Figure 25:
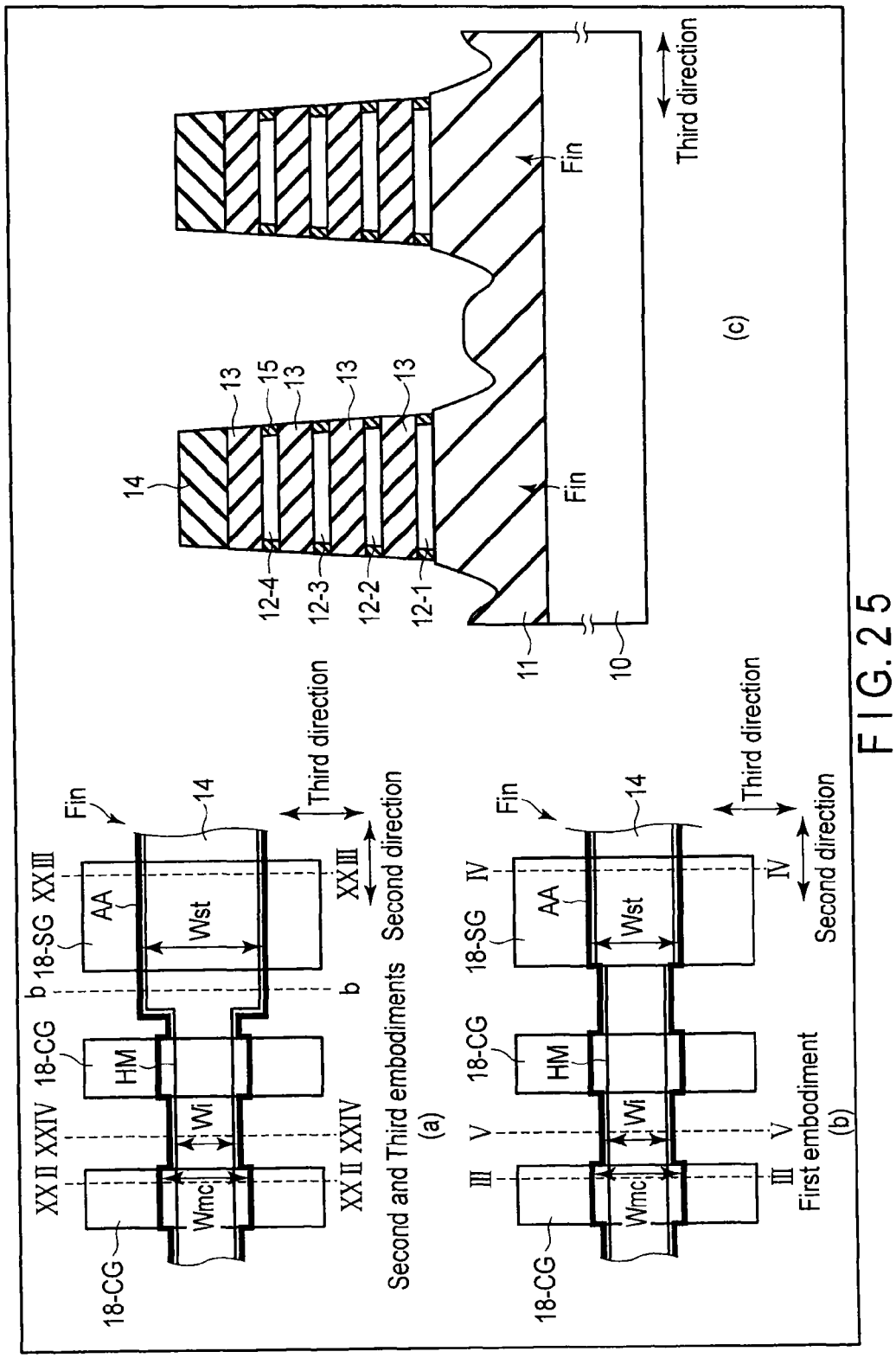
FIG. 25 is a view illustrating a comparative example of a fin width.

For example, as illustrated in FIGS. 25A and 25B, the width of a semiconductor layer (active area AA) constituting fin structure Fin in the third direction is Wmc in a region in which a memory cell is formed, Wst in a region in which a select transistor is formed, and Wi in the other regions. In this embodiments, these three widths have a relation of Wst>Wmc>Wi.

However, FIG. 25A is a plan view of fin structure Fin, and FIG. 25B is a cross-sectional view taken along line b-b in FIG. 25A. Also, the cross-sectional views of FIGS. 22 to 24 correspond respectively to a cross-sectional view taken along line XXII-XXII in FIG. 25A, a cross-sectional view taken along line XXIII-XXIII in FIG. 25A, and a cross-sectional view taken along line XXIV-XXIV in FIG. 25A.

Also, as a comparative example, FIG. 25C illustrates the width of semiconductor layer (active area AA) in the third direction in the first embodiment.

In the first embodiment, the width of semiconductor layer (active area AA) constituting fin structure Fin in the third direction is equal in a region in which memory cell MC is formed and in a region in which select transistor SGT is formed.

For example, as illustrated in FIG. 25C, the width of a semiconductor layer (active area AA) constituting fin structure Fin in the third direction is Wmc in a region in which a memory cell is formed, Wst in a region in which a select transistor is formed, and Wi in the other regions. In this example, these three widths have a relation of Wst=Wmc, Wst>Wi and Wmc>Wi.

Also, in FIGS. 25A and 25C, HM represents a planar layout of insulating layer 14 as a hard mask layer.

In this example, four memory strings corresponding to four semiconductor layers are stacked; however, the invention is not limited thereto and two or more memory strings corresponding to two or more semiconductor layers may be stacked.

According to the above structure, since gate insulating layer 15 and select gate electrode 16-SG of select transistor SGT can be formed simultaneously with gate insulating layer (tunnel oxide layer) 15 and floating gate electrode 16-FG of memory cell MC, a process of forming a hole necessary in the conventional technology becomes unnecessary. Therefore, since the characteristic degradation and failure of select transistor SGT can be prevented, the high integration and high reliability of the three-dimensional nonvolatile semiconductor memory device can be realized simultaneously.

Also, as a unique merit of the second embodiment, since the width of the semiconductor layer (active area) in the third direction is increased in the region in which a select transistor is formed, the fin structure hardly collapses during the manufacturing process.

The collapse of the fin structure becomes remarkable as the fin structure becomes narrower and higher due to an increase in the number of stacked semiconductor layers, an improvement in the integration degree, and the like. When this embodiment is employed, the collapse of the fin structure can be prevented since the width in the third direction at the end of the fin structure in the second direction (the end of a memory string) is increased.

Also, according to this embodiment, a process of separating floating gate electrodes in each memory cell in one memory string (particularly, a process of separating a floating gate electrode and a select gate electrode) is easy to perform.

This is because the difference (margin) between width Wst of the semiconductor layer in the third direction in the region in which a select transistor is formed and width Wi of the semiconductor layer in the third direction in the region (separation region) other than the region in which a memory cell and a select transistor are formed can be sufficiently increased.

Examples of Materials

As in the first embodiment, as materials constituting the above-described VG-FG type VLB, optimal materials may be appropriately selected according the respective generations of a semiconductor memory. Since the material examples have already been described in the first embodiment, a description thereof will be omitted herein.

Manufacturing Method

FIGS. 26 to 41 illustrate a method of manufacturing the VG-FG type VLB illustrated in FIGS. 20 to 25.

Figure 26:
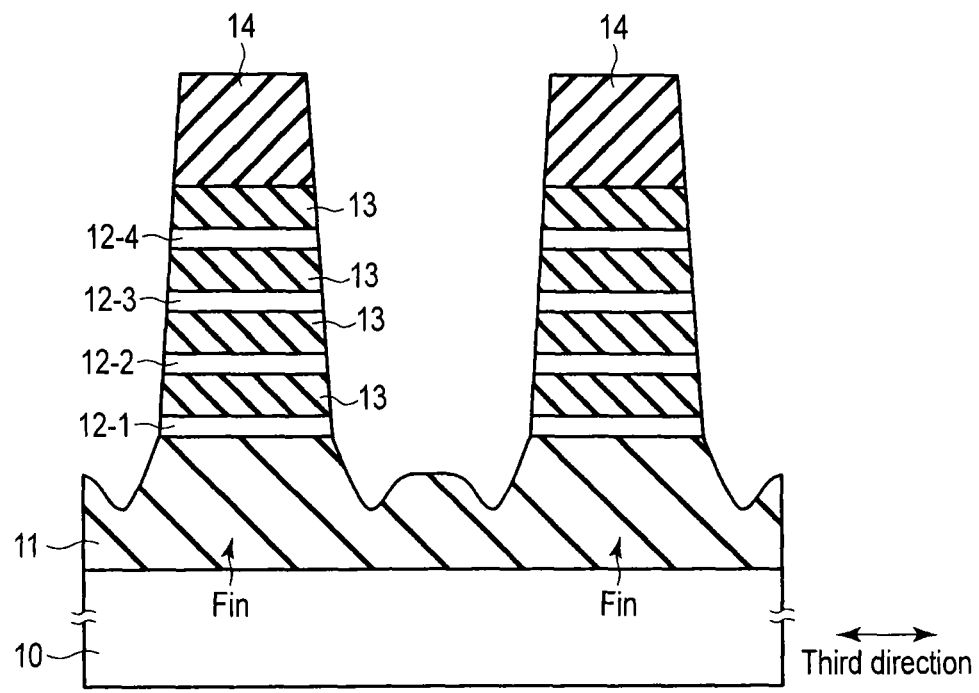

First, as illustrated in FIG. 26, for example, a p-type or n-type silicon substrate having a plane orientation of 100 and a specific resistance of 10 Ωcm to 20 Ωcm is prepared as semiconductor substrate 10. Insulating layers 11 and 13 as silicon oxide layers, and first, second, third and fourth semiconductor layers 12-1, 12-2, 12-3 and 12-4 as polysilicon layers are alternately formed on semiconductor substrate 10. Subsequently, insulating layer 14 is formed as a hard mask layer (for example, silicon nitride layer) on uppermost insulating layer 13.

Also, a resist pattern is formed on insulating layer 14 by PEP. Then, by using the resist pattern as a mask, insulating layer 14, insulating layer 13, fourth semiconductor layer 12-4, insulating layer 13, third semiconductor layer 12-3, insulating layer 13, second semiconductor layer 12-2, insulating layer 13, and first semiconductor layer 12-1 are sequentially etched by RIE. At this time, a portion of insulating layer 11 as an element isolation insulating layer is also etched.

Accordingly, a fin structure Fin is formed. Thereafter, the resist pattern is removed.

Figure 27:
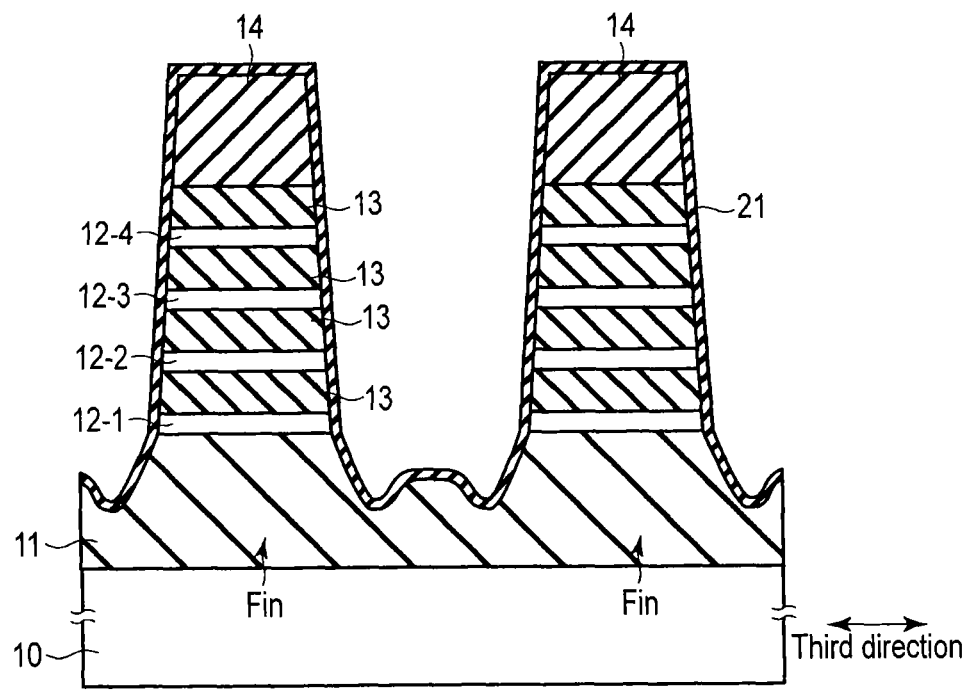
Figure 32:
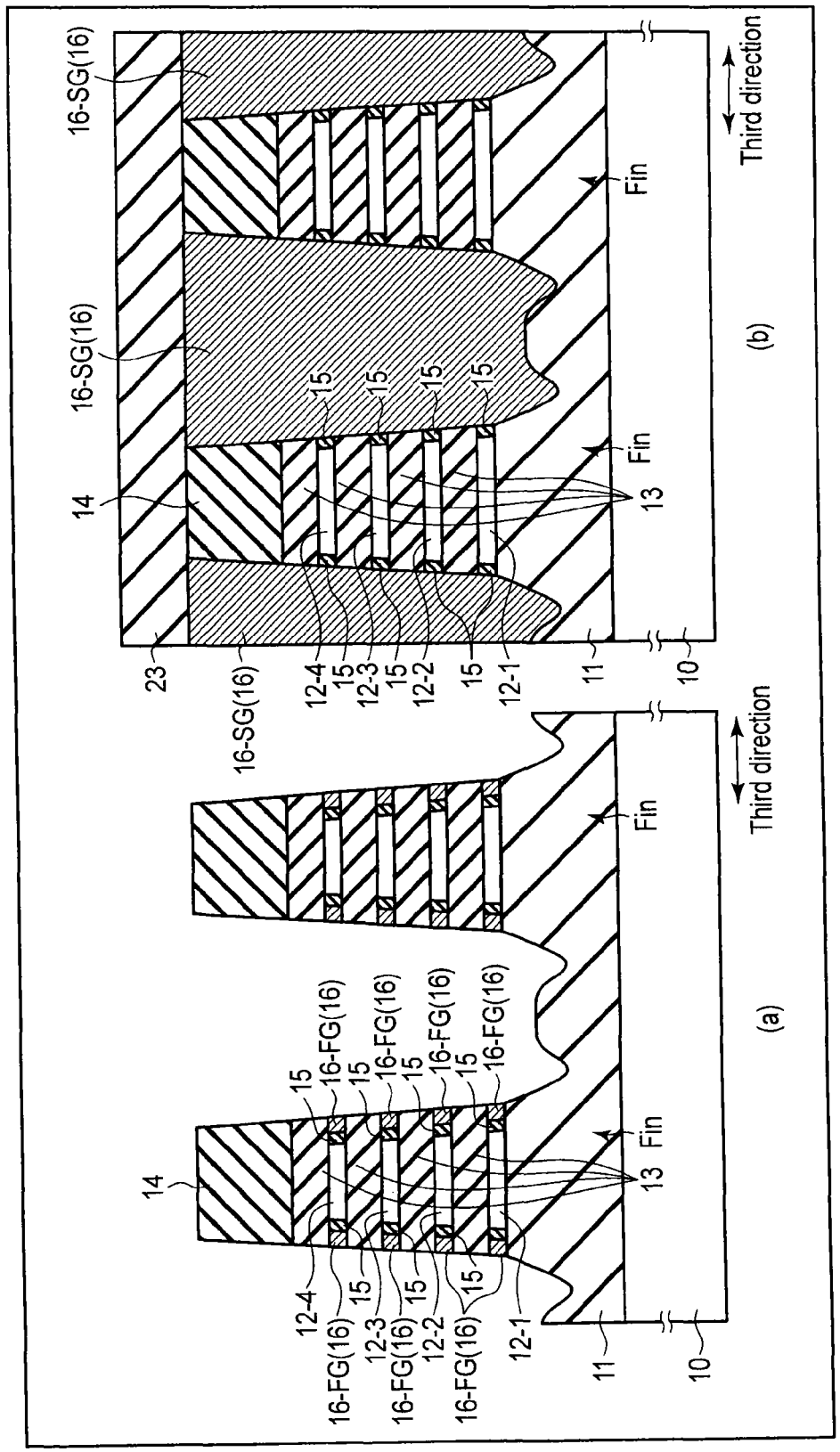
Figure 33:
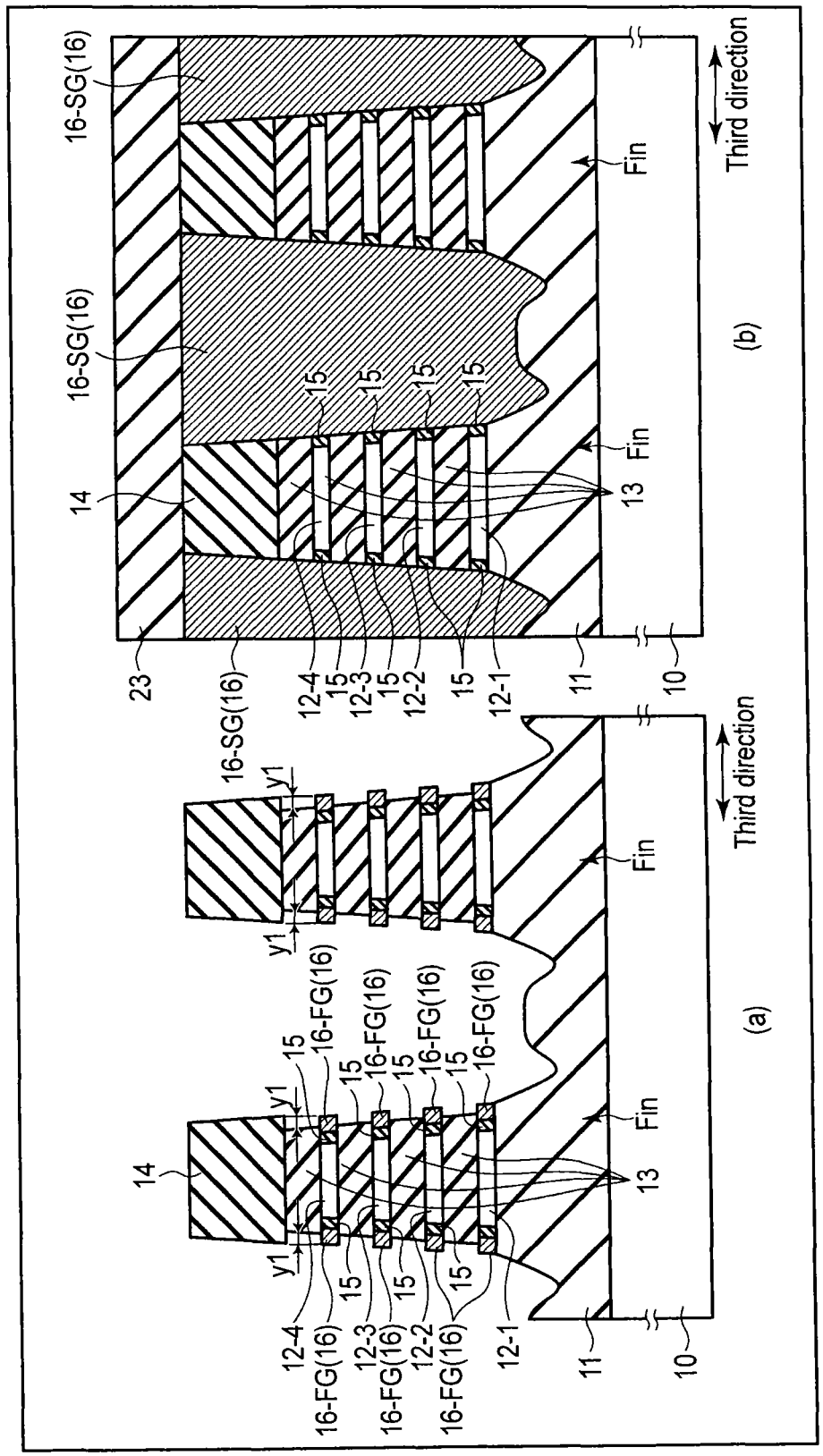

Next, as illustrated in FIG. 27, by CVD, passivation insulating layer (for example, silicon oxide layer) 21 is formed to cover the entire of fin structure Fin.

Also, as illustrated in FIGS. 28A and 28B, while the region in which a select transistor is formed is being covered by a mask layer (for example, resist layer), wet etching is performed to selectively remove passivation insulating layer 21 in the region in which a memory cell is formed. In the region in which a select transistor is formed, passivation insulating layer 21 is left after the etching. Thereafter, the mask layer is removed.

Next, as illustrated in FIG. 29A, the surface of first, second, third and fourth semiconductor layers 12-1, 12-2, 12-3 and 12-4 constituting fin structure Fin in the third direction is recess-etched, for example, by wet etching using choline, chemical dry etching (CDE), or dry etching using chlorine gas. As a result, a recess portion is formed on the surface of the fin structure Fin in the third direction.

That is, by this etching, the surface of first, second, third and fourth semiconductor layers 12-1, 12-2, 12-3 and 12-4 in the third direction is recessed inwardly from the surface of insulating layer 13 in the third direction, and as a result, the width of first, second, third and fourth semiconductor layers 12-1, 12-2, 12-3 and 12-4 in the third direction is shrunk.

Herein, as illustrated in FIG. 29B, during the etching, passivation insulating layer 21 is required to passivate a region in which a select transistor is formed, that is, to prevent the region from being removed by the etching (low etching reactivity).

For example, when the recess portion is formed by wet etching using alkali solution, an oxygen-containing material may be used as passivation insulating layer 21 in order to reduce the etching reactivity.

Examples of the oxygen-containing material may include silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), lanthanum aluminate ($LaAlO_3$), and lanthanum aluminum silicate (LaAlSiO).

Also, it may be preferable that the thickness of passivation insulating layer 21 is uniform and has a thickness of 1 nm or more before etching.

Thereafter, passivation insulating layer 21 is removed.

In this example, a process of removing passivation insulating layer 21 at this point is described; however, passivation insulating layer 21 may be left without being removed.

Next, as illustrated in FIGS. 30A and 30B, for example, by slot plane antenna (SPA) plasma generation technology, gate insulating layer (for example, silicon oxide layer) 15 is formed inside the recess portion of fin structure Fin in the third direction, that is, on the surface of first, second, third and fourth semiconductor layers 12-1, 12-2, 12-3 and 12-4 in the third direction.

Gate insulating layer 15 serves as a tunnel oxide layer of a memory cell or a gate insulating layer of a select transistor.

Also, when passivation insulating layer 21 is not removed in the step of FIG. 29, a gate insulating layer of the select transistor has a stacked structure of passivation insulating layer 21 and gate insulating layer 15.

Next, as illustrated in FIGS. 31A and 31B, for example, by CVD, the entire surface of fin structure Fin is covered by first conductive layer 16 as a polysilicon layer. First conductive layer 16 completely fills the space between two fin structures Fin aligned in the third direction.

Also, for example, by using CMP, the top surface of first conductive layer 16 is polished to planarize the top surface of first conductive layer 16. At this time, the top surface of insulating layer 14 may be employed as an end point of the CMP.

Next, as illustrated in FIG. 32B, for example, by PEP, mask layer (resist layer) 23 is formed to cover a region in which a select transistor is formed.

By the above process, a MIS structure including gate insulating layer 15 and first conductive layer 16 as select gate electrode 16-SG is already formed in the region in which a select transistor is formed. Select gate electrode 16-SG completely fills the space between two fin structures Fin.

Thereafter, by using mask layer 23 as a mask, first conductive layer 16 is etched by RIE. Accordingly, as illustrated in FIG. 32A, floating gate electrode 16-FG is formed inside the recess portion of fin structure Fin in the region in which a memory cell is formed.

That is, in the region in which a memory cell is formed, floating gate electrodes 16-FG are separated from each other in the vertical direction (first direction).

However, at this point, floating gate electrodes 16-FG inside the recess portion of fin structure Fin are in the state of extending in the second direction perpendicular to the plane of paper, and are in the state of being connected to each other in one semiconductor layer (memory string).

Next, as illustrated in FIG. 33A, the surface of insulating layer 13 in the third direction is recess-etched, for example, by wet etching or isotropic dry etching using $HF/NH_3$ gas.

Preferably, etching amount y1 of insulating layer 13 may be set such that the surface of insulating layer 13 in the third direction after the etching is disposed between two side surfaces of floating gate electrode 16-FG in the third direction (the surface on the side of gate insulating layer 15 and the surface opposite to gate insulating layer 15).

This is to prevent the control gate electrode, which is formed later, from excessively approaching the edge portion of first, second, third and fourth semiconductor layers 12-1, 12-2, 12-3 and 12-4, in order to cover three surfaces of the floating gate electrode.

When the control gate electrode is set to cover three surfaces of the floating gate electrode, the coupling ratio of a memory cell can be improved since the facing area of the control gate electrode and the floating gate electrode increases.

Also, as illustrated in FIG. 33B, in this step, a region in which a select transistor is formed has no change from the step of FIG. 32B since the region is covered by mask layer 23. Thereafter, mask layer 23 is removed.

Next, as illustrated in FIG. 34A, in the region in which a memory cell is formed, insulating layer 14 as a hard mask layer is etched, for example, by isotropic etching to shrink the width of insulating layer 14 in the third direction.

This step is performed so that floating gate electrodes 16-FG inside one memory string (one layer extending in the second direction) are securely separated from each other in each memory cell in the patterning of a control gate that will be described later.

Shrink amount d of insulating layer 14 by this step is set to an amount (theoretical value) that is sufficient to separate floating gate electrodes 16-FG inside one memory string from each other in each memory cell in the patterning of a control gate electrode.

Specifically, shrink amount d is set such that the surface of insulating layer 14 in the third direction after the shrink is disposed inside the interface of gate insulating layer 15 and floating gate electrode 16-FG. More preferably, the surface of insulating layer 14 in the third direction after the shrink is disposed outside the interface of first, second, third and fourth semiconductor layers 12-1, 12-2, 12-3 and 12-4 of gate insulating layer 15 and inside the interface between gate oxide film 15 and floating gate electrode 16-FG.

At this time, as illustrated in FIG. 34B, the top surface of insulating layer 14 as a hard mask layer is etched in the region in which a select transistor is formed.

Next, as illustrated in FIG. 35A, for example, by CVD, interlayer insulating layer (for example, $SiO_2/Si_3N_4/SiO_2$) 17 covering the entire surface of fin structure Fin is formed in the region in which a memory cell is formed. Subsequently, second conductive layer (for example, polysilicon layer) 18a is formed to cover fin structures Fin and completely fill the space between fin structures Fin.

At this time, as illustrated in FIG. 35B, inter-electrode insulating layer 17 and second conductive layer 18a are formed on first conductive layer 16 as select gate electrode 16-SG in the region in which a select transistor is formed.

Therefore, as illustrated in FIGS. 36A and 36B, the top surface of second conductive layer 18a and a portion of inter-electrode insulating layer 17 are polished by CMP. At this time, when the top surface of insulating layer 14 as a hard mask layer is employed as an end point of the CMP, all of inter-electrode insulating layer 17 is removed and the top surface of first conductive layer 16 as select gate electrode 16-SG is exposed in the region in which a select transistor is formed.

Thereafter, for example, by CVD, second conductive layer (for example, metal layer) 18b is formed on second conductive layer 18a in the region in which a memory cell array is formed, and on first conductive layer 16 as select gate electrode 16-SG in the region in which a select transistor is formed.

Also, as necessary, the top surface (surface in the first direction) of second conductive layer 18b may be planarized by CMP. In this case, the CMP may be performed after forming an insulating layer such as a silicon oxide layer on second conductive layer 18b.

Next, as illustrated in FIG. 37, a resist pattern is formed on second conductive layer 18b by PEP, and control gate electrode 18-CG and select gate electrodes 16-SG and 18-SG are patterned by using the resist pattern as a mask.

The resist pattern used in the patterning has a line & space pattern extending in the third direction. Therefore, first and second conductive layers 16 and 18 and inter-electrode insulating layer 17, which are present in a portion not covered by the resist pattern, are completely removed.

At the same time, floating gate electrode 16-FG, which is present in the portion not covered by the resist pattern, is also removed. That is, in one memory string, floating gate electrodes 16-FG constituting one layer extending in the second direction are separated from each other in each memory cell by this step.

Finally, although not illustrated, for example, by CVD, interlayer insulating layer (for example, silicon oxide layer) is filled between select gate electrodes 18-SG and control gate electrodes 18-SG having a line & space pattern.

The VG-FG type VLB of FIGS. 20 to 25 is completed by the above processes.

Figure 35:
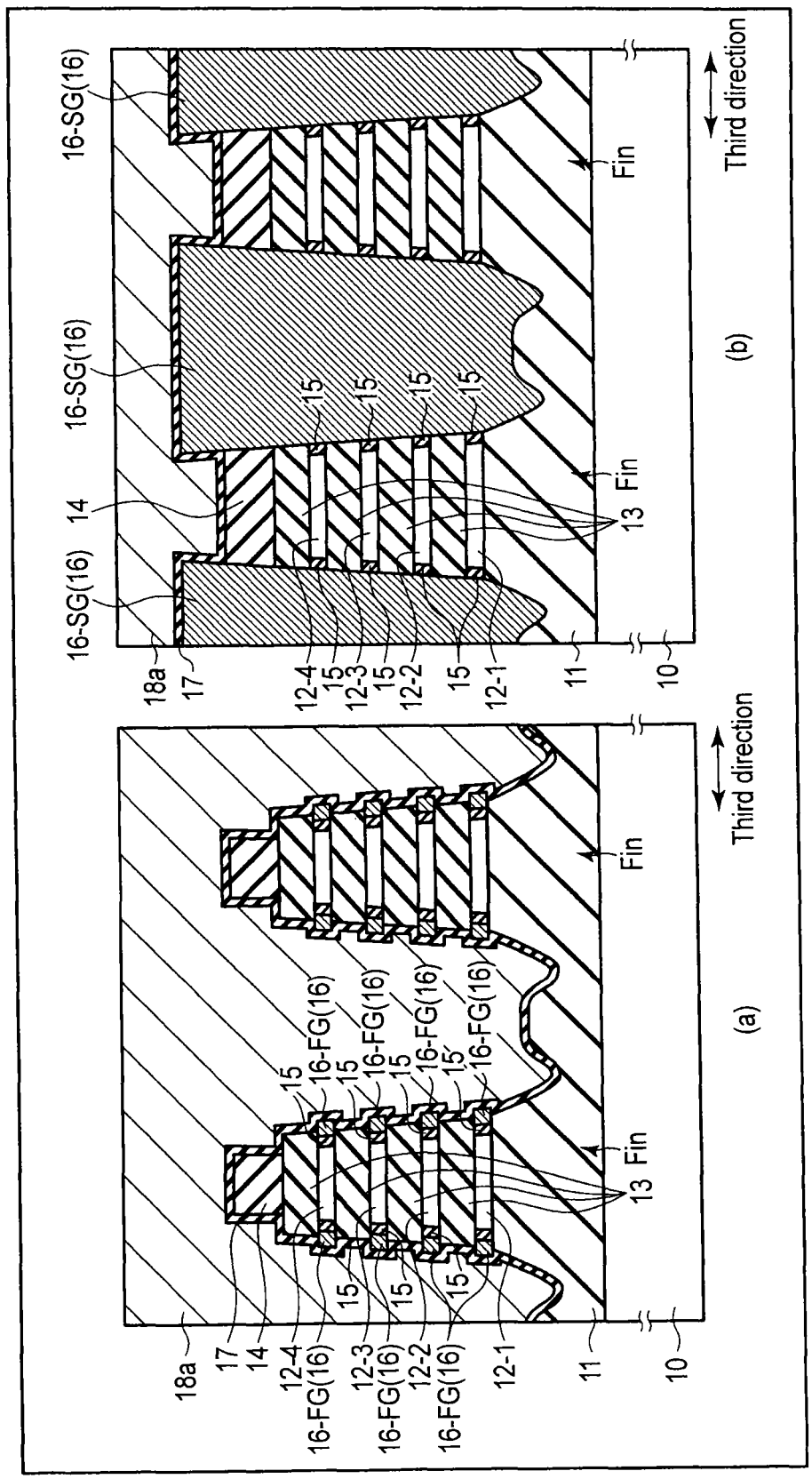
Figure 39:
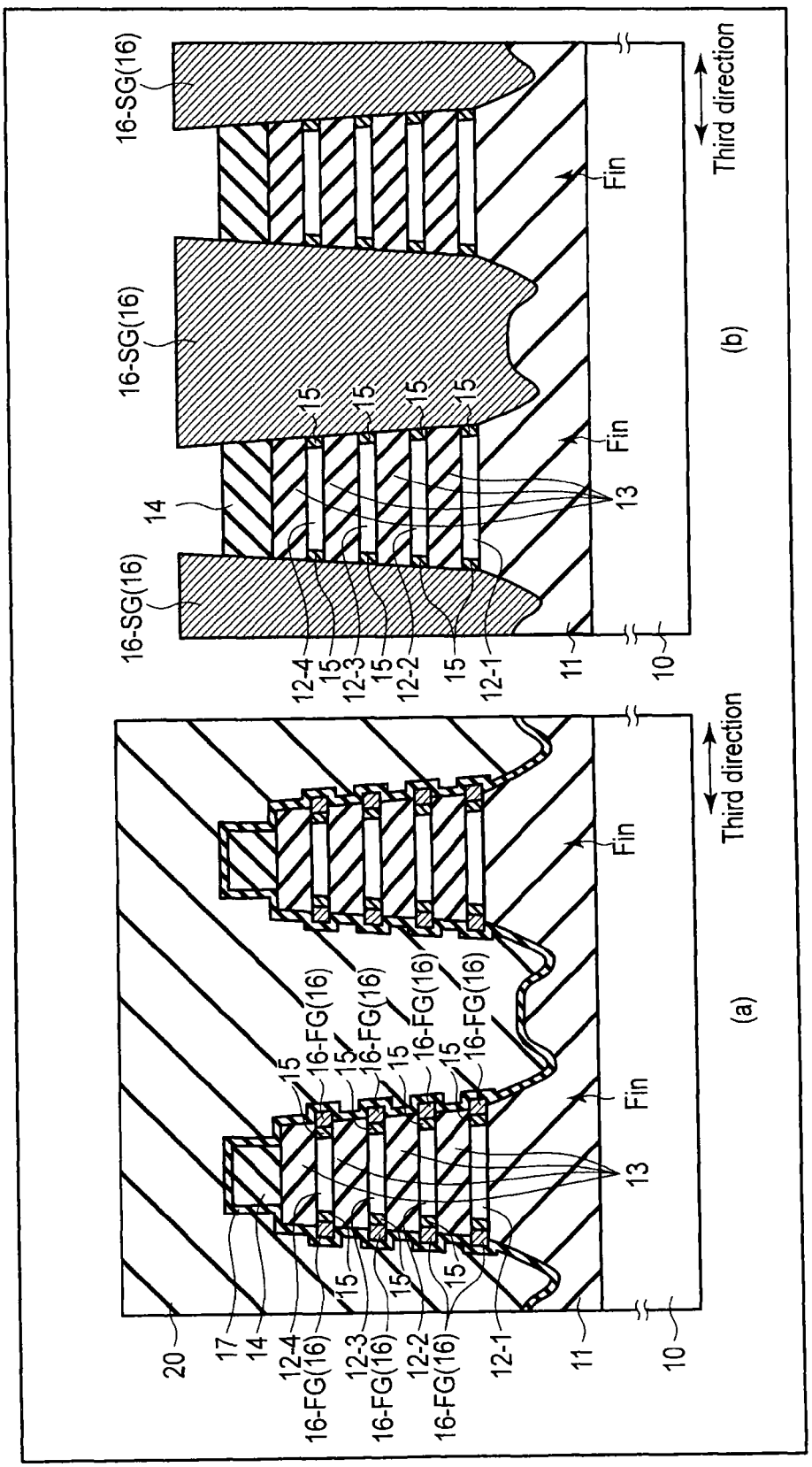

Also, in the above-described manufacturing method, the steps illustrated in FIGS. 35 to 37 can be replaced with the following steps.

After the step of FIG. 34, for example, as illustrated in FIG. 38A, in the region in which a memory cell is formed, inter-electrode insulating layer (for example, $SiO_2/Si_3N_4/SiO_2$) 17 covering the entire surface of fin structure Fin is formed, for example, by CVD.

At this time, as illustrated in FIG. 38B, inter-electrode insulating layer 17 is formed on first conductive layer 16 as select gate electrode 16-SG in the region in which a select transistor is formed.

Therefore, as illustrated in FIG. 39A, by PEP, mask layer (resist layer) 20 is formed to cover a region in which a memory cell is formed.

Then, by using mask layer 20 as a mask, inter-electrode insulating layer 17 present inside the region in which a select transistor is formed is selectively removed by RIE. Accordingly, as illustrated in FIG. 39B, the top surface of first conductive layer 16 as select gate electrode 16-SG is exposed in the region in which a select transistor is formed.

Thereafter, mask layer 20 is removed.

Next, as illustrated in FIG. 40A, in the region in which a memory cell is formed, second conductive layer (for example, polysilicon layer) 18 is formed to fin structures Fin and completely fill the space between fin structures Fin. At this time, as illustrated in FIG. 40B, second conductive layer 18 is formed on first conductive layer 16 as select gate electrode 16-SG in the region in which a select transistor is formed.

Also, as necessary, the top surface (surface in the first direction) of second conductive layer 18 may be planarized by CMP. In this case, the CMP may be performed after forming an insulating layer such as a silicon oxide layer on second conductive layer 18.

Next, as illustrated in FIG. 41, a resist pattern is formed on second conductive layer 18 by PEP, and control gate electrode 18-CG and select gate electrodes 16-SG and 18-SG are patterned by using the resist pattern as a mask.

The resist pattern used in the patterning has a line & space pattern extending in the third direction. Therefore, first and second conductive layers 16 and 18 and inter-electrode insulating layer 17, which are present in a portion not covered by the resist pattern, are completely removed.

At the same time, floating gate electrode 16-FG, which is present in the portion not covered by the resist pattern, is also removed. That is, in one memory string, floating gate electrodes 16-FG constituting one layer extending in the second direction are separated from each other in each memory cell by this step.

Finally, although not illustrated, for example, by CVD, interlayer insulating layer (for example, silicon oxide layer) is filled between select gate electrodes 18-SG and control gate electrodes 18-SG having a line & space pattern.

The VG-FG type VLB of FIGS. 20 to 25 is completed by the above processes.

Third Embodiment

The third embodiment is a modification of the first embodiment.

As compared with the first embodiment, this embodiment is characterized in that a select transistor has a tri-gate structure. In the tri-gate structure, the end of the semiconductor layer (active area) as a channel of a select transistor in the third direction is convex, and a select gate electrode covers three convex surfaces of the semiconductor layer, that is, two surfaces in the first direction and one surface in the third direction.

Since the select transistor has a tri-gate structure, the driving power of the select transistor is improved and the reliability (on/off control) of the select transistor as a switch can be improved.

Also, when the structure of this embodiment is employed, the structure of a memory cell is not limited to a floating gate type. That is, this embodiment can be applied, for example, to VG-FG type and VG-SONOS type three-dimensional nonvolatile semiconductor memory devices.

This is because the select transistor includes a second insulating layer (gate insulating layer) and a second conductive layer (select gate electrode) when the memory cell includes a first insulating layer (gate insulating layer), a charge storage layer, a second insulating layer, and a second conductive layer (control gate electrode), as described in the section of the summary (second structure).

That is, the select gate electrode of the select transistor is formed of the same material as the control gate electrode of the memory cell, and does not depend on the material constituting the charge storage layer.

Structure

Figure 42:
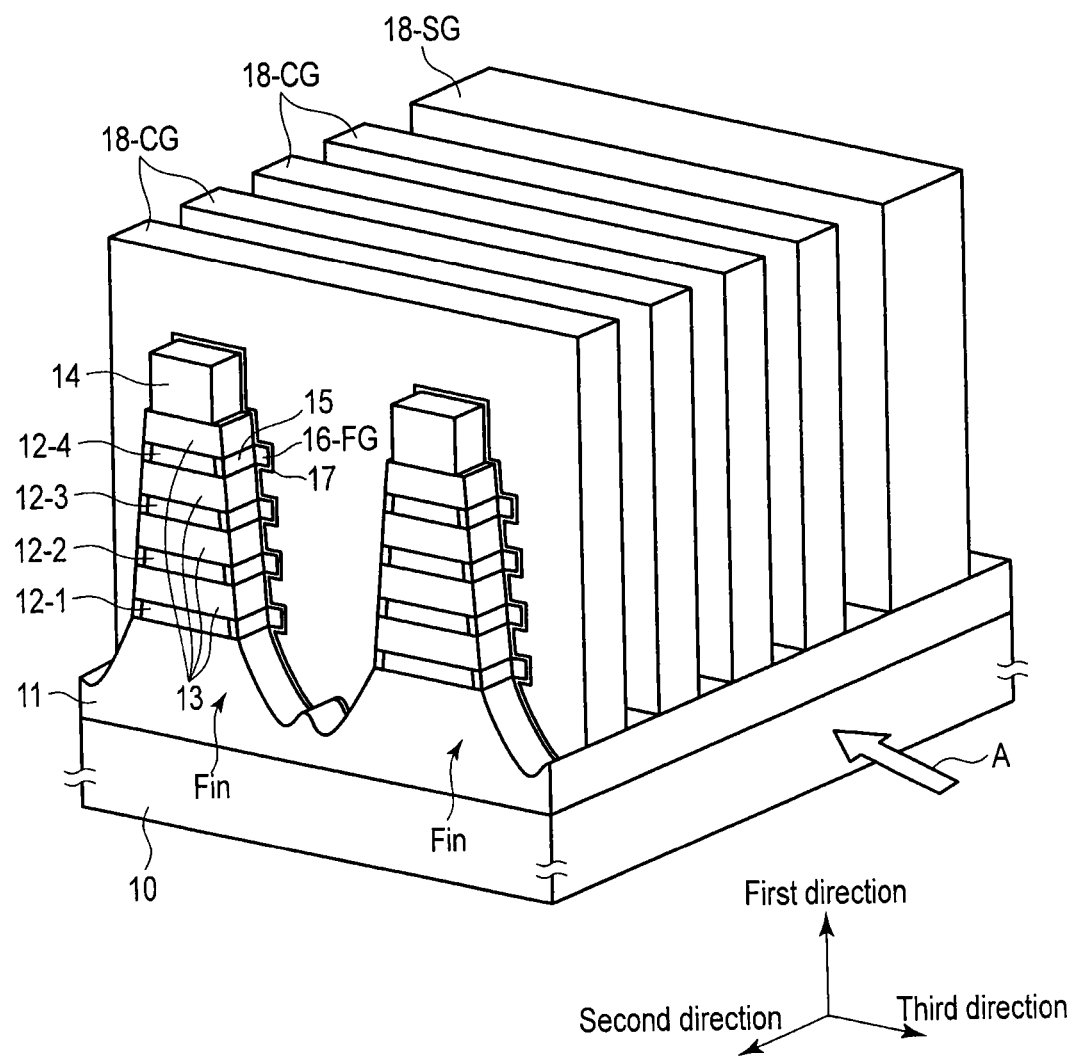
FIG. 42 is a perspective view illustrating a third embodiment.
Figure 45:
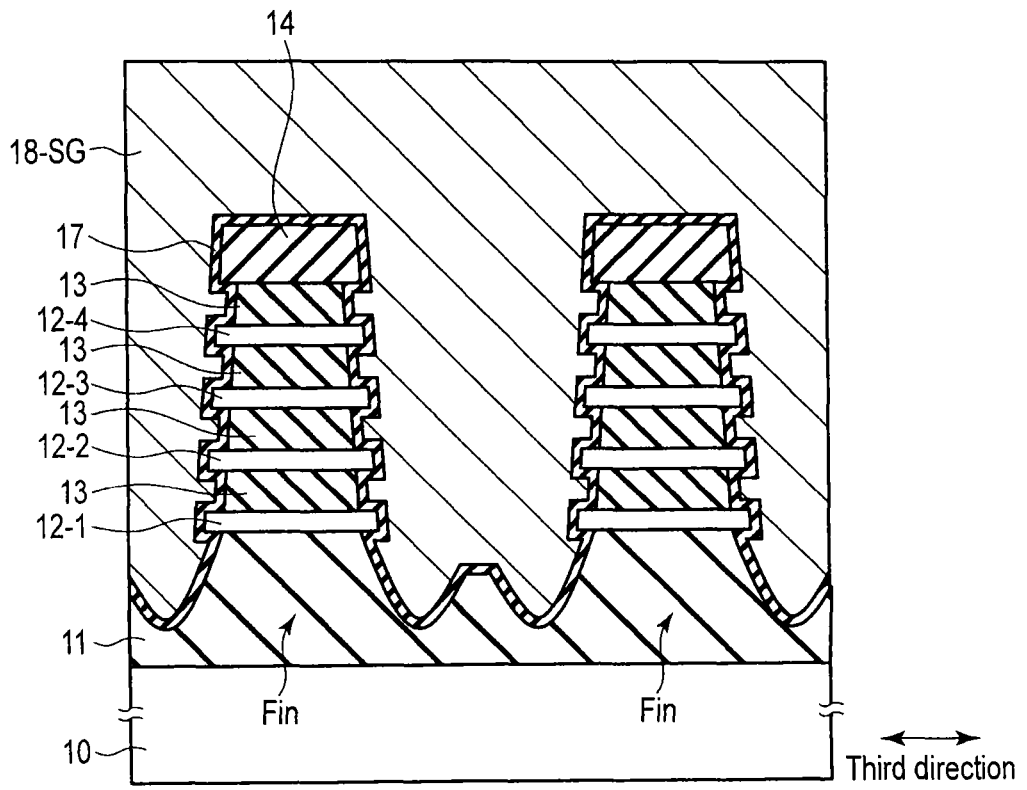
FIG. 45 is a cross-sectional view taken along line XLV-XLV in FIG. 43.
Figure 46:
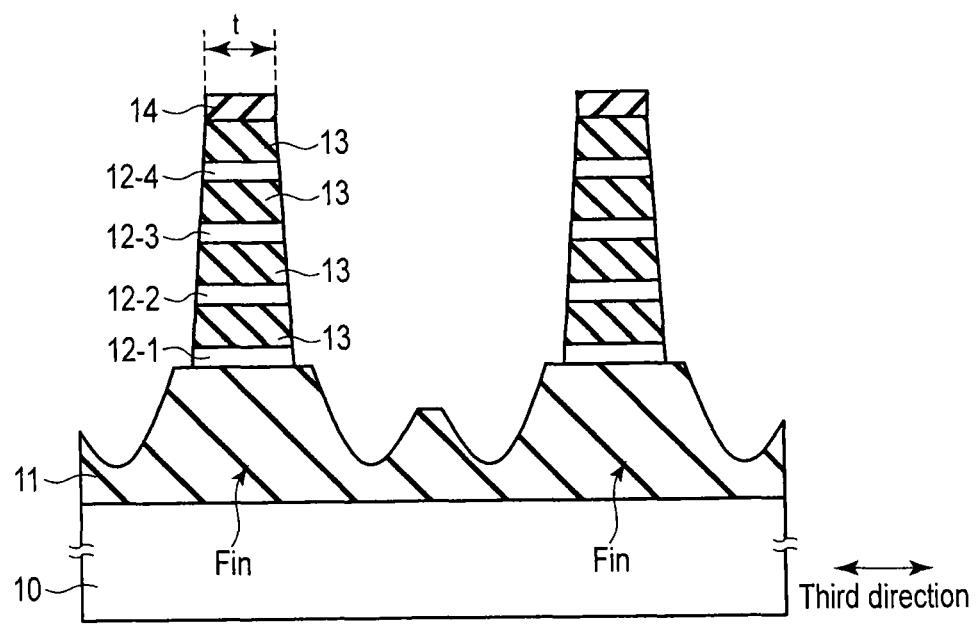
FIG. 46 is a cross-sectional view taken along line XLVI-XLVI in FIG. 43.

FIG. 42 illustrates a structure of a VG-FG type VLB. FIG. 43 is a side view of the structure of FIG. 42 taken along arrow A; FIG. 44 is a cross-sectional view taken along line XLIV-XLIV in FIG. 43; FIG. 45 is a cross-sectional view taken along line XLV-XLV in FIG. 43; and FIG. 46 is a cross-sectional view taken along line XLVI-XLVI in FIG. 43.

While the VG-FG type VLB is described, this embodiment can also be applied to a VG-SONOS type. When this embodiment is applied to a VG-SONOS type, an insulating layer disposed between a charge storage layer and a control gate electrode is generally referred to as a block insulating layer, not an inter-electrode insulating layer.

Also, in this embodiment, main portions of a memory cell array of the VLB will be described. The entire memory cell array of the VLB will be described in an application example. Also, in this embodiment, portions the same as in the first embodiment will be denoted by the same symbols, and redundant descriptions will be omitted.

Insulating layer 11 as a device isolation insulating layer is disposed on semiconductor substrate 10, and fin structure Fin is disposed on insulating layer 11.

Fin structure Fin includes first, second, third and fourth semiconductor layers 12-1, 12-2, 12-3 and 12-4 (active area) and insulating layers 13 and 14.

First, second, third and fourth memory strings S1, S2, S3 and S4 use first, second, third and fourth semiconductor layers 12-1, 12-2, 12-3 and 12-4 as channels respectively.

Each of first, second, third and fourth memory strings S1, S2, S3 and S4 includes memory cells MC connected in series in the second direction, and select transistor SGT connected in series to memory cells MC.

Memory cells MC constituting first, second, third and fourth memory strings S1, S2, S3 and S4 include gate insulating layer (tunnel oxide layer) 15, floating gate electrode 16-FG, inter-electrode insulating layer 17, and control gate electrode 18-CG on the surface of first, second, third and fourth semiconductor layers 12-1, 12-2, 12-3 and 12-4 in a third direction perpendicular to the first and second directions respectively.

Since the structure of memory cell MC is the same as in the first embodiment, a description thereof will be omitted herein.

Select transistor SGT includes gate insulating layer 15 and select gate electrodes 18-SG on the surface of first, second, third and fourth semiconductor layers 12-1, 12-2, 12-3 and 12-4 in the third direction perpendicular to the first and second directions.

The structure of select transistor SGT is substantially the same as in the first embodiment. However, in a region in which select transistor SGT is formed, the end of first, second, third and fourth semiconductor layers 12-1, 12-2, 12-3 and 12-4 in the third direction is convex. Also, select gate electrode 18-SG covers three convex surfaces of first, second, third and fourth semiconductor layers 12-1, 12-2, 12-3 and 12-4, that is, two surfaces in the first direction and one surface in the third direction.

In this example, four memory strings corresponding to four semiconductor layers are stacked; however, the invention is not limited thereto and two or more memory strings corresponding to two or more semiconductor layers may be stacked.

According to the above structure, since gate insulating layer 15 and select gate electrode 16-SG of select transistor SGT can be formed simultaneously with gate insulating layer (tunnel oxide layer) 15 and floating gate electrode 16-FG of memory cell MC, a process of forming a hole necessary in the conventional technology becomes unnecessary. Therefore, since the characteristic degradation and failure of select transistor SGT can be prevented, the high integration and high reliability of the three-dimensional nonvolatile semiconductor memory device can be realized simultaneously.

Also, as a unique merit of the third embodiment, since select transistor SGT has a tri-gate structure, the driving power of select transistor SGT is improved and the reliability (on/off control) of select transistor SGT as a switch can be improved.

Also, as will be apparent from a manufacturing method described later, this embodiment employs intactly employs the first half part of the manufacturing method of the second embodiment. Therefore, as in the second embodiment, it is easy to perform a process of separating a floating gate electrode in each memory cell in one memory string, in which fin structure Fin hardly collapses, (particularly, a process of separating a floating gate electrode and a select gate electrode.

Examples of Materials

As in the first embodiment, as materials constituting the above-described VG-FG type VLB, optimal materials may be appropriately selected according the respective generations of a semiconductor memory. Since the material examples have already been described in the first embodiment, a description thereof will be omitted herein.

However, this embodiment can be applied to a VG-SONOS type VLB.

When this embodiment is applied to a VG-SONOS type VLB, a charge storage layer constituting memory cell MC may be selected, for example, from the group consisting of silicon-rich SiN, $Si_xN_y$ (where the composition ratio x, y of silicon and nitrogen is random), silicon oxynitride (SiON), aluminum oxide ($Al_2O_3$), aluminum oxynitride (AlON), hafnia ($HfO_2$)), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), and lanthanum aluminate ($LaAlO_3$).

Also, the charge storage layer may include silicon nanoparticles, metal ions, or the like.

Manufacturing Method

FIGS. 47 to 52 illustrate a method of manufacturing the VG-FG type VLB illustrated in FIGS. 42 to 46.

In order to manufacture a tri-gate type select transistor, the manufacturing method intactly employs the first haft part of the manufacturing method of the second embodiment.

For example, as illustrated in FIGS. 26 to 31, by a manufacturing method equal to the manufacturing method described in the second embodiment, fin structure Fin is formed on semiconductor substrate 10, and steps for filling the space between fin structures Fin with first conductive layer 16 are performed.

Next, as illustrated in FIG. 47B, for example, by PEP, mask layer (resist layer) 23 is formed to cover a region in which a select transistor is formed.

Thereafter, by using mask layer 23 as a mask, first conductive layer 16 is etched by RIE. Accordingly, as illustrated in FIG. 47A, floating gate electrode 16-FG is formed inside the recess portion of fin structure Fin in the region in which a memory cell is formed.

That is, in the region in which a memory cell is formed, floating gate electrodes 16-FG are separated from each other in the vertical direction (first direction).

However, at this point, floating gate electrodes 16-FG inside the recess portion of fin structure Fin are in the state of extending in the second direction perpendicular to the plane of paper, and are in the state of being connected to each other in one semiconductor layer (memory string).

Thereafter, mask layer 23 is removed.

Next, as illustrated in FIG. 48A, in the region in which a memory cell is formed, insulating layer 14 as a hard mask layer is etched, for example, by isotropic etching to shrink the width of insulating layer 14 in the third direction.

This step is performed so that floating gate electrodes 16-FG inside one memory string (one layer extending in the second direction) are securely separated from each other in each memory cell in the patterning of a control gate that will be described later.

Shrink amount d of insulating layer 14 by this step is set to an amount (theoretical value) that is sufficient to separate floating gate electrodes 16-FG inside one memory string from each other in each memory cell in the patterning of a control gate electrode.

Specifically, shrink amount d is set such that the surface of insulating layer 14 in the third direction after the shrink is disposed inside the interface of gate insulating layer 15 and floating gate electrode 16-FG. More preferably, the surface of insulating layer 14 in the third direction after the shrink is disposed outside the interface of first, second, third and fourth semiconductor layers 12-1, 12-2, 12-3 and 12-4 of gate insulating layer 15 and inside the interface between gate oxide film 15 and floating gate electrode 16-FG.

At this time, as illustrated in FIG. 48B, the top surface of insulating layer 14 as a hard mask layer is etched in the region in which a select transistor is formed.

Next, as illustrated in FIG. 49A, for example, by PEP, mask layer (resist layer) 24 is formed to cover a region in which a memory cell is formed.

Thereafter, by using mask layer 24 as a mask, first conductive layer 16 illustrated in FIG. 48B is etched by RIE. Accordingly, as illustrated in FIG. 49B, first conductive layer 16 is not present in the region in which a select transistor is formed.

Thereafter, mask layer 24 is removed.

The above steps of forming the mask layer of FIGS. 47 and 49 may be omitted.

That is, when the step of forming mask layer 23 of FIG. 47 is not performed and the etching step of FIG. 47 and the shrink process of FIG. 48 are performed, the etching step and the step of forming mask layer 24 of FIG. 49 may also be omitted.

This is because in the third embodiment, the select transistor is formed by a second insulating layer (material like an inter-electrode insulating layer or a block insulating layer) and a second conductive layer (material like a control gate electrode) which will be described later.

Specifically, in the second embodiment, a MIS structure including gate insulating layer 15 and first conductive layer 16 as a select gate electrode is formed in the region in which a select transistor is formed.

However, in the third embodiment, since gate insulating layer 15 and first conductive layer 16 are not used as a gate insulating layer and a select gate electrode of a select transistor, they need not be formed in the region in which a select transistor is formed. Therefore, in this step, gate insulating layer 15 and first conductive layer 16 can be removed.

For this reason, the steps of FIGS. 47 and 49 can be omitted.

In this case, since the number of PEP steps used in the entire process of manufacturing the VG-FG type VLB of FIGS. 42 to 46 can be reduced by 2, the manufacturing cost can be reduced significantly.

Next, as illustrated in FIG. 50A, the surface of insulating layer 13 in the third direction is recess-etched, for example, by wet etching or isotropic dry etching using $HF/NH_3$ gas.

Preferably, etching amount y1 of insulating layer 13 may be set such that the surface of insulating layer 13 in the third direction after the etching is disposed between two side surfaces of floating gate electrode 16-FG in the third direction (the surface on the side of gate insulating layer 15 and the surface opposite to gate insulating layer 15).

This is to prevent the control gate electrode, which is formed later, from excessively approaching the edge portion of first, second, third and fourth semiconductor layers 12-1, 12-2, 12-3 and 12-4, in order to cover three surfaces of the floating gate electrode.

When the control gate electrode is set to cover three surfaces of the floating gate electrode, the coupling ratio of a memory cell can be improved since the facing area of the control gate electrode and the floating gate electrode increases.

At this time, as illustrated in FIG. 50B, in the region in which a select transistor is formed, by the recess etching of insulating layer 13, the end of first, second, third and fourth semiconductor layers 12-1, 12-2, 12-3 and 12-4 in the third direction is convexed, and two surfaces of first, second, third and fourth semiconductor layers 12-1, 12-2, 12-3 and 12-4 in the first direction and the surface in the third direction are exposed.

Next, as illustrated in FIG. 51A, for example, by CVD, interlayer insulating layer (for example, $SiO_2$) 17 covering the entire surface of fin structure Fin is formed in the region in which a memory cell is formed. Subsequently, second conductive layer (for example, polysilicon layer) 18 is formed to cover fin structures Fin and completely fill the space between fin structures Fin.

At this time, as illustrated in FIG. 51B, second insulating layer 17 as a gate insulating layer and second conductive layer 18 as select gate electrode 16-SG are formed in the region in which a select transistor is formed.

Also, as necessary, the top surface (surface in the first direction) of second conductive layer 18 may be planarized by CMP. In this case, the CMP may be performed after forming an insulating layer such as a silicon oxide layer on second conductive layer 18.

Next, as illustrated in FIG. 52, a resist pattern is formed on second conductive layer 18 by PEP, and control gate electrode 18-CG and select gate electrodes 16-SG and 18-SG are patterned by using the resist pattern as a mask.

The resist pattern used in the patterning has a line & space pattern extending in the third direction. Therefore, first and second conductive layers 16 and 18 and inter-electrode insulating layer 17, which are present in a portion not covered by the resist pattern, are completely removed.

At the same time, floating gate electrode 16-FG, which is present in the portion not covered by the resist pattern, is also removed. That is, in one memory string, floating gate electrodes 16-FG constituting one layer extending in the second direction are separated from each other in each memory cell by this step.

Finally, although not illustrated, for example, by CVD, interlayer insulating layer (for example, silicon oxide layer) is filled between select gate electrodes 18-SG and control gate electrodes 18-CG having a line & space pattern.

The VG-FG type VLB of FIGS. 42 to 46 is completed by the above processes.

[Others]

A combination of the second embodiment and the third embodiment is also possible.

While the VLB having a double-gate structure is described, the first to third embodiments can also be applied to a VLB having a single-gate structure.

[Effects]

According to the embodiments, the characteristic degradation and failure of the select transistor of the three-dimensional nonvolatile semiconductor memory device can be prevented.

FIG. 53 illustrates a select transistor manufacturing method as a comparative example.

For example, in a three-dimensional nonvolatile semiconductor memory device such as a VG-FG type VLB, when a select transistor is formed, it is necessary to form a hole that penetrates control gate electrode CG, an inter-electrode insulating layer (block insulating), and floating gate electrode FG and extends in the first direction (vertical direction), in a region in which a select transistor is formed, and fill the hole with a conductive layer, as illustrated in FIG. 53A.

However, in this process, the size of the hole significantly affects the gate resistance of the select transistor. That is, when the hole size is reduced and thus the hole is not sufficiently filled with a low-resistance film (metal film), the characteristic of the select transistor is degraded.

Also, as illustrated in FIG. 53B, when the height (width in the third direction) of floating gate electrode FG is reduced, it is difficult to short floating gate electrodes FG aligned in the first direction by the low-resistance film inside the hole. That is, while the inter-electrode insulating layer (block insulating layer) between floating gate electrode FG and control gate electrode CG should be removed in the forming of the hole, the gate insulating layer between active area AA and floating gate electrode FG should not be etched in the forming of the hole.

Therefore, since the margin of the misalignment of the hole is reduced, a very high alignment accuracy is required.

When this is not satisfied, the characteristic degradation and failure of the select transistor occur. Accordingly, the reliability of the three-dimensional nonvolatile semiconductor memory device is degraded, and a high price is caused by the degradation of the product yield.

In contrast to this, according to the three-dimensional nonvolatile semiconductor memory device illustrated in the above-described embodiment, since a hole forming process is not present, this problem does not occur.

Application Example

A VLB as an application example will be described.

Also, in the following application example, elements the same as in the VLB according to the first to third embodiments are denoted by the same symbols, and a detailed description thereof will be omitted.

FIG. 54 illustrates a VLB as an application example.

In this application example, the structure of a select transistor according to the first to third embodiments can be applied to block select transistor SGT used to select a block, assist gate transistor AGT used to select fin structure Fin, and layer select transistor LST used to select a semiconductor layer inside fin structure Fin.

First, second, third and fourth memory strings are formed respectively in the surface region of first, second, third and fourth semiconductor layers 12-1, 12-2, 12-3 and 12-4 inside fin structure Fin. One end of the first, second, third and fourth memory strings is connected to common source line SL, and the other end is connected to beam structure 31.

The First, second, third and fourth memory strings include memory cells MC connected in series, block select transistor SGT between common source line SL and memory cells MC, and assist gate transistor AGT between beam structure 31 and memory cells MC.

Block select transistor SGT includes one common select gate line that is shared by fin structures Fin inside one block BK and is common to fin structures Fin inside one block BK.

Assist gate transistor AGT includes one common select gate line that is shared by the first, second, third and fourth memory strings inside one fin structure Fin and is common to the first, second, third and fourth memory strings inside one fin structure Fin. That is, the select gate line of assist gate transistor AGT is independent in each fin structure Fin.

Beam structure 31 extends in the third direction to prevent the collapse of fin structure Fin. Like fin structure Fin, beam structure 31 includes first, second, third and fourth semiconductor layers 12-1, 12-2, 12-3 and 12-4 and insulating layers 11, 13 and 14. First, second, third and fourth layer select transistors LST are disposed at one end of beam structure 31 in the third direction.

First, second, third and fourth layer select transistors LST use first, second, third and fourth semiconductor layers 12-1, 12-2, 12-3 and 12-4 as channels to select one of first, second, third and fourth semiconductor layers 12-1, 12-2, 12-3 and 12-4.

First, second, third and fourth layer select transistors LST include first, second, third and fourth select gate electrodes 33-1, 33-2, 33-3 and 33-4 that are aligned in the third direction and are sequentially disposed at constant pitch P from contact plug (common electrode) 32.

First, second, third and fourth select gate electrodes 33-1, 33-2, 33-3 and 33-4 extend at least in the first direction along the surface of first, second, third and fourth semiconductor layers 12-1, 12-2, 12-3 and 12-4 in the second direction.

In this example, first, second, third and fourth select gate electrodes 33-1, 33-2, 33-3 and 33-4 cover the top surface of beam structure 31 in the first direction and two side surfaces of beam structure 31 in the second direction. That is, layer select transistor LST has a double-gate structure.

Also, first layer select transistor LST including first select gate electrode 33-1 has a normally-on channel inside first semiconductor layer 12-1. That is, first layer select transistor LST including first select gate electrode 33-1 can be normally on inside first semiconductor layer 12-1 and can be on/off controlled inside second, third and fourth semiconductor layers 12-2, 12-3 and 12-4.

Second layer select transistor LST including second select gate electrode 33-2 has a normally-on channel inside second semiconductor layer 12-2. That is, second layer select transistor LST including second select gate electrode 33-2 can be normally on inside second semiconductor layer 12-2 and can be on/off controlled inside first, third and fourth semiconductor layers 12-1, 12-3 and 12-4.

Third layer select transistor LST including third select gate electrode 33-3 has a normally-on channel inside third semiconductor layer 12-3. That is, third layer select transistor LST including third select gate electrode 33-3 can be normally on inside third semiconductor layer 12-3 and can be on/off controlled inside first, second and fourth semiconductor layers 12-1, 12-2 and 12-4.

Fourth layer select transistor LST including fourth select gate electrode 33-4 has a normally-on channel inside fourth semiconductor layer 12-4. That is, fourth layer select transistor LST including fourth select gate electrode 33-4 can be normally on inside fourth semiconductor layer 12-4 and can be on/off controlled inside first, second and third semiconductor layers 12-1, 12-2 and 12-3.

Also, the normally-on channel inside first inside first, second, third and fourth semiconductor layers 12-1, 12-2, 12-3 and 12-4 can be formed by a doped region that includes an n-type dopant (pentavalent element such as arsenic and phosphorus), a p-type dopant (trivalent element such as boron and indium), or both of them.

By first, second, third and fourth layer select transistors LST, contact plug 32 can be used as a common electrode that is common to first, second, third and fourth semiconductor layers 12-1, 12-2, 12-3 and 12-4. That is, since a separate contact plug need not be provided to each of first, second, third and fourth semiconductor layers 12-1, 12-2, 12-3 and 12-4, the size of a contact region can be reduced.

Also, the width of beam structure 31 in the second direction may be equal to or different from the width of fin structure Fin in the third direction. However, in order to reduce the interconnection resistance in beam structure 31 and prevent the collapse of fin structure Fin, the width of beam structure 31 in the second direction may be wider than the width of fin structure in the third direction.

Also, for example, contact plug (common electrode) 32 includes a metal material such as W and Al. Bit line BL is connected to contact plug 32.

CONCLUSION

According to the embodiments, the characteristic degradation and failure of the select transistor of the three-dimensional nonvolatile semiconductor memory device can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a semiconductor substrate;
    a first fin structure having first to n-th semiconductor layers (n is a natural number equal to or more than 2) stacked in a first direction perpendicular to a surface of the semiconductor substrate, and extending in a second direction parallel to the surface of the semiconductor substrate;
    first to n-th memory cells provided on surfaces of the first to n-th semiconductor layers in a third direction perpendicular to the first and second directions respectively; and
    first to n-th select transistors connected in series to the first to n-th memory cells respectively,
    wherein the first to n-th memory cells comprise a first gate structure including a first insulating layer, a floating gate electrode with a first conductive layer, a second insulating layer, and a control gate electrode with a second conductive layer, in order thereof from the surfaces of the first to n-th semiconductor layers in the third direction,
    the first to n-th select transistors comprise a second gate structure including the first insulating layer, and a select gate electrode with the first conductive layer, in order thereof from the surfaces of the first to n-th semiconductor layers in the third direction,
    the first conductive layers of the floating gate electrodes of the first to n-th memory cells are independent of one another,
    the second conductive layers of the control gate electrodes of the first to n-th memory cells are connected to one another in the first direction, and
    the first conductive layers of the select gate electrodes of the first to n-th select transistors are connected to one another in the first direction.

2. The device of claim 1, wherein the select gate electrode comprises the second conductive layer on a surface of the first conductive layer of the select gate electrode in the first direction.

3. The device of claim 1, wherein the second gate structure is provided on the surfaces of the first to n-th semiconductor layers in the first fin structure in the third direction.

4. The device of claim 1, further comprising:
    a beam structure connected to the first fin structure, the beam structure having the first to n-th semiconductor layers and extending to the third direction,
    wherein the second gate structure is provided on surfaces of the first to n-th semiconductor layers in the beam structure in the second direction.

5. The device of claim 1, wherein the control gate electrode covers surfaces of the floating gate electrodes of the first to n-th memory cells in the first and third directions.

6. The device of claim 1, wherein a width in the third direction of the first to n-th semiconductor layers in an area in which the first to n-th select transistors are provided is larger than a width in the third direction of the first to n-th semiconductor layers in an area in which the first to n-th memory cells are provided.

7. The device of claim 1, further comprising:
    a second fin structure having the first to n-th semiconductor layers stacked in the first direction and extending to the second direction,
    wherein the first and second fin structures are arranged in the third direction, the second conductive layer of the control gate electrode fill a space between the first and second fin structures, and the first conductive layer of the select gate electrode fill the space between the first and second fin structures.

\* \* \* \* \*